(12) United States Patent
Shimomura et al.

(10) Patent No.: US 8,324,086 B2
(45) Date of Patent: Dec. 4, 2012

(54) METHOD FOR MANUFACTURING A SEMICONDUCTOR SUBSTRATE BY LASER IRRADIATION

(75) Inventors: Akihisa Shimomura, Isehara (JP); Naoki Tsukamoto, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 145 days.

(21) Appl. No.: 12/353,384

(22) Filed: Jan. 14, 2009

(65) Prior Publication Data
US 2009/0181552 A1    Jul. 16, 2009

(30) Foreign Application Priority Data
Jan. 16, 2008   (JP) ................. 2008-007295

(51) Int. Cl.
   *H01L 21/20*   (2006.01)
(52) U.S. Cl. . 438/479; 438/486; 438/487; 257/E21.134; 257/E21.347; 257/E27.112
(58) Field of Classification Search ............. 438/166, 438/311, 486, 795, 479, 487; 257/347, E27.112, 257/E21.134, E21.347
See application file for complete search history.

(56) References Cited

U.S. PATENT DOCUMENTS

| | | |
|---|---|---|
| 5,374,564 A | 12/1994 | Bruel |
| 5,383,993 A | 1/1995 | Katada et al. |
| 6,110,845 A | 8/2000 | Seguchi et al. |
| 6,117,700 A | 9/2000 | Orita et al. |
| 6,127,702 A | 10/2000 | Yamazaki et al. |
| 6,271,101 B1 | 8/2001 | Fukunaga |
| 6,335,231 B1 | 1/2002 | Yamazaki et al. |
| 6,372,609 B1 | 4/2002 | Aga et al. |
| 6,380,046 B1 | 4/2002 | Yamazaki |

(Continued)

FOREIGN PATENT DOCUMENTS

JP   58-070536   4/1983

(Continued)

OTHER PUBLICATIONS

JP58070536 "Laser Annealing Method", English translation, Osada Toshihiko, Apr. 27, 1983.*

(Continued)

*Primary Examiner* — Khiem D Nguyen
(74) *Attorney, Agent, or Firm* — Eric J. Robinson; Robinson Intellectual Property Law Office, P.C.

(57) ABSTRACT

An SOI substrate having a single crystal semiconductor layer the surface of which has high planarity is manufactured. A semiconductor substrate is doped with hydrogen to form a damaged region containing a large amount of hydrogen. After a single crystal semiconductor substrate and a supporting substrate are bonded to each other, the semiconductor substrate is heated to separate the single crystal semiconductor substrate in the damaged region. While a heated high-purity nitrogen gas is sprayed on a separation surface of a single crystal semiconductor layer which is separated from the single crystal semiconductor substrate and irradiation with a microwave is performed from the back side of the supporting substrate, the separation surface is irradiated with a laser beam. The single crystal semiconductor layer is melted by irradiation with the laser beam, so that the surface of the single crystal semiconductor layer is planarized and re-single-crystallization thereof is performed. In addition, the length of the melting time is increased by irradiation with the nitrogen gas and the microwave; thus, the re-single-crystallization is performed more efficiently.

20 Claims, 25 Drawing Sheets

U.S. PATENT DOCUMENTS

| | | | |
|---|---|---|---|
| 6,388,652 B1 | 5/2002 | Yamazaki et al. | |
| 6,534,380 B1 | 3/2003 | Yamauchi et al. | |
| 6,583,440 B2 | 6/2003 | Yasukawa | |
| 6,602,761 B2 | 8/2003 | Fukunaga | |
| 6,611,005 B2 | 8/2003 | Tsujimura et al. | |
| 6,686,623 B2 | 2/2004 | Yamazaki | |
| 6,778,164 B2 | 8/2004 | Yamazaki et al. | |
| 6,803,264 B2 | 10/2004 | Yamazaki et al. | |
| 6,863,733 B1 * | 3/2005 | Tanabe | 118/722 |
| 6,875,633 B2 | 4/2005 | Fukunaga | |
| 6,927,148 B2 | 8/2005 | Ito | |
| 6,992,025 B2 | 1/2006 | Maa et al. | |
| 7,018,910 B2 | 3/2006 | Ghyselen et al. | |
| 7,052,943 B2 | 5/2006 | Yamazaki et al. | |
| 7,064,049 B2 | 6/2006 | Ito et al. | |
| 7,119,365 B2 | 10/2006 | Takafuji et al. | |
| 7,148,124 B1 | 12/2006 | Usenko | |
| RE39,484 E | 2/2007 | Bruel | |
| 7,176,525 B2 | 2/2007 | Fukunaga | |
| 7,193,294 B2 | 3/2007 | Yoshimura et al. | |
| 7,199,024 B2 | 4/2007 | Yamazaki | |
| 7,256,776 B2 | 8/2007 | Yamazaki et al. | |
| 7,390,725 B2 | 6/2008 | Maa et al. | |
| 7,410,882 B2 | 8/2008 | Wong et al. | |
| 7,473,592 B2 | 1/2009 | Yamazaki et al. | |
| 7,473,971 B2 | 1/2009 | Yamazaki et al. | |
| 7,476,576 B2 | 1/2009 | Yamazaki et al. | |
| 7,491,342 B2 | 2/2009 | Kamiyama et al. | |
| 7,504,663 B2 | 3/2009 | Yamazaki et al. | |
| 7,521,335 B2 | 4/2009 | Yamanaka | |
| 7,535,053 B2 | 5/2009 | Yamazaki | |
| 7,579,654 B2 | 8/2009 | Couillard et al. | |
| 7,608,521 B2 | 10/2009 | Cites et al. | |
| 7,619,250 B2 | 11/2009 | Takafuji et al. | |
| 7,638,408 B2 | 12/2009 | Yamazaki et al. | |
| 7,638,805 B2 | 12/2009 | Yamazaki et al. | |
| 7,642,598 B2 | 1/2010 | Yamazaki et al. | |
| 7,674,687 B2 | 3/2010 | Henley | |
| 7,781,306 B2 | 8/2010 | Kakehata | |
| 7,799,620 B2 | 9/2010 | Honda | |
| 7,799,658 B2 | 9/2010 | Yamazaki | |
| 7,816,736 B2 | 10/2010 | Yamazaki | |
| 7,820,524 B2 | 10/2010 | Miyairi et al. | |
| 7,834,398 B2 | 11/2010 | Yamazaki | |
| 7,875,506 B2 | 1/2011 | Sasagawa et al. | |
| 7,883,990 B2 | 2/2011 | Levy et al. | |
| 7,897,476 B2 | 3/2011 | Yamazaki et al. | |
| 7,978,190 B2 | 7/2011 | Yamazaki et al. | |
| 7,989,273 B2 | 8/2011 | Yamazaki et al. | |
| 8,053,837 B2 | 11/2011 | Yamazaki | |
| 8,153,513 B2 | 4/2012 | Henley | |
| 8,187,926 B2 | 5/2012 | Yamazaki | |
| 2002/0109144 A1 | 8/2002 | Yamazaki | |
| 2003/0232466 A1 | 12/2003 | Zistl et al. | |
| 2006/0267202 A1 * | 11/2006 | Matsuzaki | 257/758 |
| 2007/0108510 A1 | 5/2007 | Fukunaga | |
| 2007/0141803 A1 | 6/2007 | Boussagol et al. | |
| 2007/0281440 A1 | 12/2007 | Cites et al. | |
| 2008/0054269 A1 | 3/2008 | Yamazaki et al. | |
| 2008/0061301 A1 | 3/2008 | Yamazaki | |
| 2008/0070335 A1 | 3/2008 | Yamazaki et al. | |
| 2008/0099065 A1 * | 5/2008 | Ito et al. | 136/261 |
| 2008/0213953 A1 | 9/2008 | Yamazaki | |
| 2009/0111244 A1 | 4/2009 | Yamazaki et al. | |
| 2009/0115028 A1 | 5/2009 | Shimomura et al. | |
| 2011/0003461 A1 | 1/2011 | Yamazaki | |
| 2011/0076837 A1 | 3/2011 | Miyairi et al. | |

FOREIGN PATENT DOCUMENTS

| | | |
|---|---|---|
| JP | 05-211128 | 8/1993 |
| JP | 11-097379 | 4/1999 |
| JP | 11-163363 | 6/1999 |
| JP | 2000-012864 | 1/2000 |
| JP | 2000-150905 | 5/2000 |
| JP | 2001-223175 | 8/2001 |
| JP | 2005-203596 A | 7/2005 |
| JP | 2005-252244 A | 9/2005 |
| JP | 2006-264804 A | 10/2006 |

OTHER PUBLICATIONS

Kahlert.H et al., "UV-Optics for Excimer Laser Based Ctystallization Processes,", Mat. Res. Soc. Symp. Proc. (Materials Research Society Symposia Proceedings), 2001, vol. 685, pp. D6.2.1-D6.2.6., (2001).

* cited by examiner

METHOD FOR MANUFACTURING A SEMICONDUCTOR SUBSTRATE BY LASER IRRADIATION

BACKGROUND OF THE INVENTION

1. Field of the Invention

The present invention relates to a laser processing apparatus, in particular, a laser processing apparatus which modifies a semiconductor sample. In addition, the present invention relates to a method for manufacturing a semiconductor substrate which can achieve modification of a semiconductor sample by laser irradiation.

2. Description of the Related Art

In recent years, instead of a bulk silicon wafer, integrated circuits using an SOI (silicon on insulator) substrate have been developed. By utilizing characteristics of a thin single crystal silicon layer formed over an insulating layer, a semiconductor layer of a transistor formed in the integrated circuit can be electrically separated from each other completely. Further, since the fully depleted transistors can be formed, a semiconductor integrated circuit with high added value such as high integration, high speed driving, and low power consumption can be realized.

Known examples of SOI substrates are SIMOX substrates and bonded substrates. For example, for an SOI structure of SIMOX substrate, oxygen ions are implanted into a single crystal silicon substrate and a heat treatment at 1300° C. or higher is performed to form a buried oxide (BOX) layer, so that a single crystal silicon thin film is formed on the surface.

An SOI structure of bonded substrates is obtained by bonding of two single crystal silicon substrates (a base substrate and a bond substrate) to each other with an oxide film interposed therebetween and by thinning of one of the two single crystal silicon substrates (the bond substrate) on a back side (a side which is opposite to a bonding surface), whereby a single crystal silicon thin film is formed. Since it is difficult to form an even and thin single crystal silicon thin film through grinding or polishing, a technique employing hydrogen ion implantation which is called Smart-Cut® has been proposed (see, for example, Reference 1: Japanese Published Patent Application No. H 5-211128).

A summary of a method for manufacturing this SOI substrate is described. By implantation of hydrogen ions into a silicon wafer, an ion implantation layer is formed at a predetermined depth from the surface. Next, a silicon oxide film is formed by oxidizing another silicon wafer which serves as a base substrate. After that, the silicon wafer into which hydrogen ions are implanted is bonded to the silicon oxide film of another silicon wafer, so that the two silicon wafers are attached to each other. Then, through a heat treatment, cleavage is caused in the silicon wafer, using the ion implantation layer as a cleavage plane, whereby a substrate in which a thin single crystal silicon layer is bonded to the base substrate is formed.

In addition, a method for forming an SOI substrate in which a single crystal silicon layer is bonded to a glass substrate is known (see, for example, Reference 2: Japanese Published Patent Application No. H11-097379). In Reference 2, a separation surface is mechanically polished to remove a defective layer which is formed through hydrogen ion implantation or a step of several to several tens of nanometers on the separation surface.

Methods for manufacturing a semiconductor device in which a highly heat-resistant substrate is used as a supporting substrate, utilizing Smart Cut®, are disclosed in Patent Document 3: Japanese Published Patent Application No. H11-163363 and Patent Document 4: Japanese Published Patent Application No. 2000-012864, and a method for manufacturing a semiconductor device in which a light-transmitting substrate is used as a supporting substrate, utilizing Smart Cut®, is disclosed in Patent Document 5: Japanese Published Patent Application No. 2000-150905.

On the other hand, as a method for performing a heat treatment on a silicon thin film over a substrate, a laser annealing apparatus for processing a laser beam and a microwave by being combined has been known (see, for example, Patent Document 6: Japanese Published Patent Application No. 2001-223175). Patent Document 6 discloses a method in which, by irradiating silicon melted by a laser beam with a microwave, cooling time is prolonged more than the case where silicon is melted only by a laser beam and expansion of silicon crystallization depth can be achieved.

In addition, as a method for performing a heat treatment on a silicon thin film over another substrate, a laser annealing apparatus for processing a laser beam, a microwave, and heated nitrogen by being combined has been known (see, for example, Patent Document 7: Japanese Published Patent Application No. S58-70536). In Patent Document 7, the substrate is irradiated with heated nitrogen and the microwave from the back side thereof, and the substrate is irradiated with the laser beam in a heated state.

SUMMARY OF THE INVENTION

Since a glass substrate has a larger area and is inexpensive than a silicon wafer, a glass substrate is used as a supporting substrate, whereby an inexpensive large-area SOI substrate can be manufactured. However, the strain point of the glass substrate is less than or equal to 700° C., which has low heat resistance. Therefore, heating cannot be performed at temperatures over the allowable temperature limit of the glass substrate; thus, the process temperature is limited to less than or equal to 700° C. That is, there is also limitation on process temperatures for a step of removing a crystal defect at a separation surface and a step of planarizing a surface.

In a conventional method, a crystal defect of a semiconductor layer which is bonded to a silicon wafer has been removed by performing heating at a temperature of greater than or equal to 100° C. However, such a high-temperature process cannot be applied to remove a crystal defect of a semiconductor layer which is bonded to a glass substrate having a strain point of less than or equal to 700° C. That is, a re-single-crystallization method has not been established, by which a single crystal semiconductor layer which is bonded to a glass substrate having a strain point of less than or equal to 700° C. is recovered to a single crystal semiconductor layer having the same or substantially the same crystallinity as a single crystal semiconductor substrate before processing.

A glass substrate is more easily bent than a silicon wafer and has a warped surface. In particular, it is difficult to perform a treatment by mechanical polishing on a large-area glass substrate having a side that is longer than 30 cm. Thus, from the viewpoint of processing accuracy, yield, and the like, the treatment by mechanical polishing on a separation surface is not recommended to be used as a planarization treatment of a semiconductor layer which is bonded to a supporting substrate. Meanwhile, it is required to suppress unevenness on the surface of the separation surface in order to manufacture high-performance semiconductor elements. This is because, in the case of manufacturing a transistor from an SOI substrate, since a gate electrode is formed over a semiconductor layer with a gate insulating layer interposed therebetween, it is difficult to form the gate insulating layer having high withstand voltage, if the unevenness of the semiconductor layer is large. Therefore, a thick gate insulating layer is needed for higher withstand voltage. Thus, large unevenness on the surface of the semiconductor layer leads to increase of interface state density with the gate insulating layer or the like, which causes decrease in performance of the semiconductor elements, such as decrease in field effect mobility, increase in threshold voltage, and the like.

When a substrate which has low heat resistance and is easily bent, such as a glass substrate, is thus used as a supporting substrate, a problem emerges in that it is difficult to improve surface unevenness of a semiconductor layer which is separated from a silicon wafer and fixed to the supporting substrate.

The processing apparatus of Patent Document 6 can be preferably used for crystallization and recrystallization process. However, the time immediately after the laser irradiation at which silicon is melted has to be further prolonged in order to obtain enough modification effect by the laser process in a semiconductor sample in which crystallinity or surface planarity is emphasized as in a single crystal semiconductor layer of an SOI substrate. In the processing apparatus of Patent Document 6, even when an additional heating means is provided in a laser irradiation region in addition to the microwave, a space between a microwave antenna and the sample is about 2 mm in the apparatus structure, which is narrow; thus, it is difficult to provide the heating means in this space.

In addition, also in the case of using the heating method of Patent Document 7, it is difficult to ensure enough melting time of silicon because heat is released from the surface of a supporting substrate even when heated nitrogen is sprayed from the bottom in addition to the microwave.

Thus, an object of the present invention is to provide a technical means which is capable of improving crystallinity of a single crystal semiconductor layer or planarity of a surface thereof or crystallinity of a single crystal semiconductor layer and planarity of a surface thereof by laser processing. In addition, another object of the present invention is to provide a technical means which is capable of improving crystallinity of the single crystal semiconductor layer or planarity of the surface thereof or crystallinity of the single crystal semiconductor layer and planarity of the surface thereof, even when a substrate having low heat resistance is used as a supporting substrate of the single crystal semiconductor layer.

One example of the present invention is a laser processing apparatus including a means which irradiates a single crystal semiconductor layer fixed to a first surface of a supporting substrate with a buffer layer interposed therebetween with a laser beam, a means which sprays a heated gas on a region of the single crystal semiconductor layer, which is irradiated with the laser beam, and a means which irradiates a region of the single crystal semiconductor layer, which is irradiated with the laser beam, with a microwave from a second surface which is the opposite side of the first surface of the supporting substrate. In the structure of this laser processing apparatus, a means which floats the supporting substrate can be added by further spraying a nitrogen gas for floating the supporting substrate from the second surface of the supporting substrate. In this case, it is preferable that the nitrogen gas for floating the supporting substrate be heated.

In the laser processing apparatus according to one example of the present invention, a temperature of a portion of the single crystal semiconductor layer, which is irradiated with the laser beam, can be controlled accurately by combining the means which performs laser irradiation with the means which sprays a heated gas and the means which performs irradiation with a microwave. The means which sprays a heated nitrogen gas and the means which performs irradiation with a microwave operate so that the portion of the single crystal semiconductor layer, which is irradiated with the laser beam, is not cooled suddenly.

One example of the present invention is a method for manufacturing a semiconductor substrate including the steps, which are performed simultaneously, of spraying a heated gas from a side of a supporting substrate having a single crystal semiconductor layer fixed to a first surface with a buffer layer interposed therebetween, on which the single crystal semiconductor layer is provided; irradiating the single crystal semiconductor layer with a laser beam; and irradiating the single crystal semiconductor layer with a microwave from the first surface and a second surface on the opposite side. In this case, a time until the single crystal semiconductor layer is melted and re-single-crystallization thereof is performed by the irradiation with the laser beam, the irradiation with the heated nitrogen gas, and the irradiation with the microwave is preferably controlled to be greater than or equal to 200 nanoseconds and less than or equal to 1000 nanoseconds.

The method for manufacturing a semiconductor substrate according to one example of the present invention operates so that, by irradiating a portion irradiated with the laser beam with the heated gas and the microwave, the single crystal semiconductor layer is not cooled suddenly in a cooling process after the single crystal semiconductor layer is irradiated with the laser beam.

By increase in melting time, a single crystal semiconductor layer can be irradiated with a laser beam before the single crystal semiconductor layer is solidified after it is melted by being irradiated with the previous laser beam. Accordingly, the number of shots can be reduced. In other words, enough surface planarity can be obtained even when the number of shots is reduced. In addition, reduction in the number of shots contributes to improvement in productivity. In scanning with a laser beam, the percentage of partial overlap of one shot with the subsequent shot is referred to as overlap percentage. By increase in melting time, the overlap percentage can be reduced to about one-tenth, and can also be reduced to 0%.

A heated nitrogen gas is sprayed, whereby a single crystal semiconductor layer in the region where the heated nitrogen gas is sprayed is heated to a temperature of greater than or equal to 400° C. and less than or equal to a strain point of the supporting substrate, preferably a temperature of greater than or equal to 450° C. and less than or equal to 650° C.

Depending on an opening which a nitrogen gas is ejected from, for example, a direction of a nozzle opening, when a heated nitrogen gas is sprayed, not only a region irradiated with a laser beam but also the single crystal semiconductor layer on the periphery of the region can be heated. As a nozzle which is one of blow units, a nozzle, called an air knife, which blows a nitrogen gas toward a substrate from a slit of a nozzle tip, can be used.

Before scanning with a laser beam, a heated nitrogen gas is sprayed on a region to be irradiated with the laser beam, whereby the region to be irradiated with the laser beam can be heated in advance. Accordingly, the energy of a laser beam required to melt the single crystal semiconductor layer can be reduced.

If the required energy of a laser beam can be reduced, the lifetime of a laser can be extended in addition to reduction in power consumption. By extension of the lifetime of the laser, the interval of time between component replacements can be lengthened; therefore, productivity can be improved.

After scanning with a laser beam, a heated nitrogen gas is sprayed on the region that has been irradiated, and then the region is irradiated with a microwave, whereby the melting time can be extended, and the cooling rate of the melted single crystal semiconductor layer can be reduced as compared to natural cooling.

If the cooling rate of the melted single crystal semiconductor layer can be reduced as compared to natural cooling, re-single-crystallization thereof is undergone smoothly by increase in melting time, and a single crystal semiconductor layer without a grain boundary can be obtained.

In a method for manufacturing a semiconductor substrate utilizing one example of the present invention, a cross-sectional shape of a laser beam with which a single crystal semiconductor layer is irradiated can be linear, square, or rectangular. By scanning with a laser beam having a linearly irradiated area, a position where melting and re-single-crystallization are caused can be moved and the refinement of a single crystal is partially performed. Accordingly, a single crystal semiconductor layer which contains a smaller amount of impurities can be obtained.

The area irradiated with a laser beam having a linearly irradiated area can be adjusted by an optical system, as appropriate. For example, if one side of a rectangular shape is lengthened, a plurality of single crystal semiconductor layers is fixed so as to lie next to each other over a glass substrate having a large area by using a plurality of semiconductor substrates, and the plurality of single crystal semiconductor layers can be irradiated with a laser beam. In addition, by spraying a heated nitrogen gas, energy of the laser beam which is needed for melting of the single crystal semiconductor layer can be reduced; therefore, an area irradiated with one shot can be expanded by adjusting the optical system or the like. If the area irradiated with one shot can be expanded, the length of time needed for a laser process per one piece can be shortened.

When an insulating film in contact with the single crystal semiconductor layer contains a halogen, the halogen can be diffused from the insulating film and segregated at the interface between the single crystal semiconductor layer and the insulating film because the insulating film is also heated at the time of irradiation with a laser beam. By segregation of the halogen at the interface between the single crystal semiconductor layer and the insulating film, the halogen can capture ions such as sodium which are present at the interface. Thus, in the case of using a glass substrate as the supporting substrate, formation of an insulating film containing a halogen and an irradiation process with a laser beam while heating the single crystal semiconductor layer are extremely effective for preventing contamination caused by an impurity such as sodium.

In the case where a large-area substrate is used, in some cases, a substrate is transferred by being floated by use of a means which is provided below the substrate to spray a nitrogen gas. A current of air by a heated nitrogen gas spraying on a region irradiated with a laser beam can assist transfer of the substrate. In addition, since cooling might occur by a current of air for transfer, it is preferable that a nitrogen gas sprayed from the bottom be also heated at the time of scanning with a laser beam.

The surface of the single crystal silicon layer, which is melted and in which re-single-crystallization thereof is performed by the laser irradiation, is planarized. As a planarization treatment, chemical mechanical polishing (abbreviation: CMP) has been known. However, since a glass substrate is easily bent and has a warp, it is difficult to perform a planarization treatment on the single crystal semiconductor layer by CMP in the case where a glass substrate is used as the supporting substrate. When this planarization treatment is performed by irradiation process with the laser beam, the single crystal semiconductor layer can be planarized without applying force that damages the supporting substrate and heating the supporting substrate at a temperature exceeding a strain point. Therefore, a glass substrate can be used as the supporting substrate.

A laser processing apparatus according to one example of the present invention operates on a melting time of the single crystal silicon layer at the time of the laser irradiation by irradiating a substrate over which a single crystal silicon layer is formed, on which a nitrogen gas is sprayed, with a microwave and then a laser beam; thus, preferable re-single-crystallization of the single crystal silicon layer can be performed. In addition, it is possible to preferably planarize the single crystal semiconductor layer by the same operation. Further, it is possible to form a high-performance semiconductor element with the use of the obtained semiconductor element by the same operation.

DETAILED DESCRIPTION OF THE INVENTION

Figure 1A:
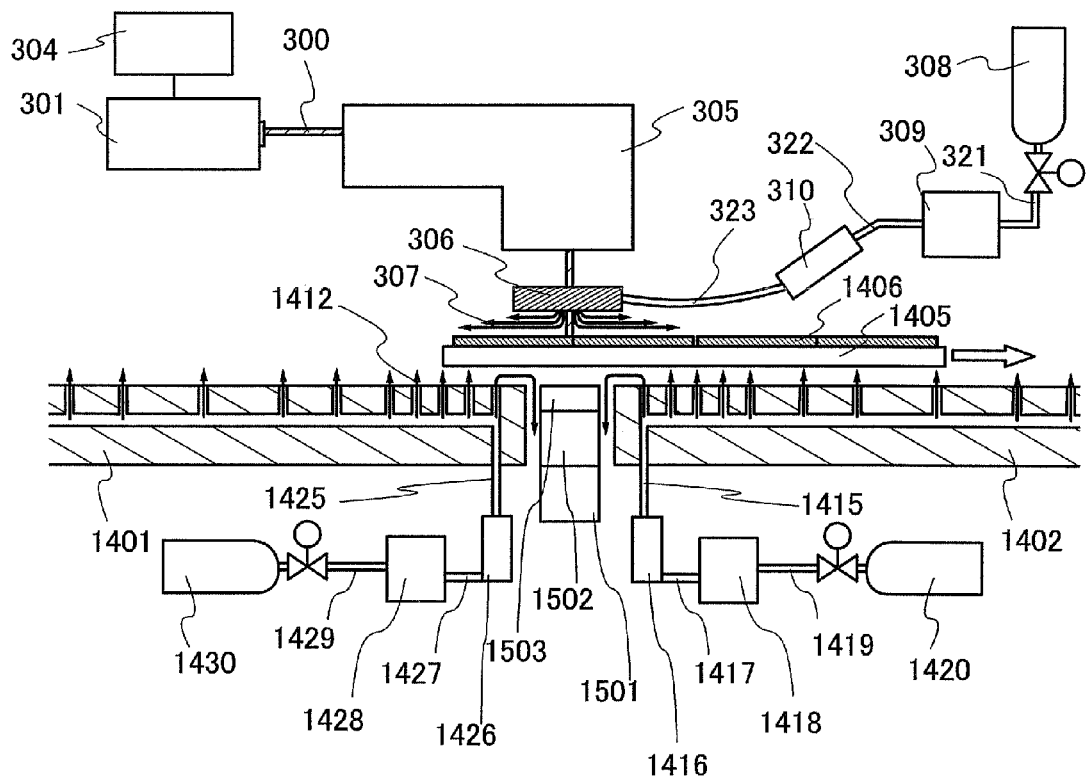
FIG. 1A is a cross-sectional view of a manufacturing apparatus.

A specific example of the present invention will be described below. It is easily understood by those skilled in the art that the present invention can be implemented in many different modes, and modes and details disclosed herein can be modified in various ways without departing from the spirit and scope of the present invention. Thus, the present invention should not be taken as being limited to the following description of the embodiment modes. Further, the same portions are denoted by the same reference symbols through the drawings, and repetition description of materials, shapes, manufacturing methods, and the like is omitted.

Embodiment Mode 1

In this embodiment mode, an example of a manufacturing apparatus in which laser irradiation can be performed and a large-area substrate can be processed while a heated nitrogen gas is sprayed on both a front side and a back side of a substrate is shown. Note that, here, an example is shown in which a single crystal silicon layer which is divided into a plurality of regions is formed over a large-area substrate and laser irradiation is performed so that melting and re-single-crystallization of silicon are performed to planarize the surface of the single crystal silicon layer. In addition, in order to shorten processing time of laser irradiation, the manufacturing apparatus is set such that the length L of a region that can be irradiated once with a laser beam is set long and laser irradiation is completed by moving a large-area substrate in one direction.

As one feature of a laser processing apparatus of the present invention, a laser processing apparatus includes a means which irradiates a single crystal semiconductor layer fixed to a first surface of a supporting substrate with a buffer layer interposed therebetween with a laser beam; a means which sprays a heated nitrogen gas on a region of the single crystal semiconductor layer, which is irradiated with the laser beam; and a means which irradiates the single crystal semiconductor layer with a microwave from a second surface which is the opposite side of the first surface of the supporting substrate. In addition, as one feature of a method for manufacturing a semiconductor substrate of the present invention, a method for manufacturing a semiconductor substrate includes the steps, which are performed simultaneously, of irradiating a single crystal semiconductor layer fixed to a first surface of a supporting substrate with a buffer layer interposed therebetween with a laser beam; spraying a heated nitrogen gas on a region of the single crystal semiconductor layer, which is irradiated with the laser beam; and irradiating the single crystal semiconductor layer with a microwave from a second surface which is the opposite side of the first surface of the supporting substrate.

In addition, as another feature of the laser processing apparatus of the present invention, the supporting substrate is transported in a floated state by spraying a nitrogen gas as a gas for floating the supporting substrate on the second surface of the supporting substrate, whereas the first surface of the supporting substrate is used as a front side.

In one feature of the laser processing apparatus of the present invention, a defect in a single crystal portion of an SOI substrate can be repaired. In other words, in one feature of the laser processing apparatus of the present invention, the single crystal semiconductor layer which is formed over the supporting substrate with the buffer layer interposed therebetween can be melted and re-single-crystallization thereof can be performed. A defect in the melted single crystal portion is repaired as well as the re-single-crystallization. A semiconductor layer is irradiated with a laser beam while the heated nitrogen gas is sprayed on the region irradiated with the laser beam on the front side of the single crystal semiconductor layer. As a method for partially irradiating the single crystal semiconductor layer with the microwave, the supporting substrate is irradiated with the microwave by a waveguide or an antenna provided on the back side of the side on which the single crystal semiconductor layer is formed in the supporting substrate.

By the laser irradiation, the single crystal semiconductor layer is melted from the surface of the region thereof irradiated with the laser beam to an arbitrary depth. Alternatively, the region of the single crystal semiconductor layer, which is irradiated with the laser beam, is melted entirely.

Here, the single crystal means a crystal in which, when a certain crystal axis is focused, the direction of the crystal axis is oriented in the same direction in any portion of a sample and which has no crystal grain boundary between crystals. Note that in this specification, the single crystal includes a crystal in which the direction of crystal axes is uniform as described above and which has no grain boundaries even when it includes a crystal defect or a dangling bond. In addition, re-single-crystallization of a single crystal semiconductor layer means that a semiconductor layer having a single crystal structure returns to a single crystal structure after being in a different state from the single crystal structure (e.g., a liquid-phase state). In addition, it can also be said that re-single-crystallization of a single crystal semiconductor layer means that a single crystal semiconductor layer is recrystallized to form a single crystal semiconductor layer.

It is preferable to use a substrate having a strain point of greater than or equal to 650° C. and less than or equal to 690° C. as the supporting substrate. A glass substrate can be used as the supporting substrate. For example, a non-alkali glass substrate can be used.

It is preferable that the thickness of the single crystal semiconductor layer separated from the single crystal semiconductor substrate be greater than or equal to 20 nm and less than or equal to 200 nm.

The buffer layer can be formed of a film including one layer or two or more layers. It is preferable that the buffer layer include a barrier layer which can prevent sodium from diffusing from the supporting substrate side. The supporting substrate as well as the single crystal semiconductor layer is heated when irradiated with a laser beam, and the supporting substrate is also heated by heat conduction from the single crystal semiconductor layer which is melted. In the case where impurities (typically, sodium) such as an alkali metal or an alkaline-earth metal are contained in the supporting substrate, such impurities might be diffused from the supporting substrate into the single crystal semiconductor layer because of increase in temperature of the supporting substrate. The barrier layer is provided, whereby impurities can be prevented from being diffused into the single crystal semiconductor layer.

It is preferable that the buffer layer be bonded to the single crystal semiconductor layer and include an insulating film which contains a halogen such as chlorine or fluorine.

As one feature of a method for manufacturing a semiconductor device of the present invention, a semiconductor layer is irradiated with a laser beam in a nitrogen gas atmosphere while a nitrogen gas is sprayed on a region irradiated with the laser beam. At this time, it is preferable that the concentration of oxygen contained in the nitrogen gas atmosphere be less than or equal to 30 ppm, preferably less than or equal to 30 ppb. Further, it is preferable that the concentration of moisture ($H_2O$) contained in the nitrogen gas atmosphere be less than or equal to 30 ppm. Still further, it is preferable that the concentration of oxygen contained in the nitrogen gas atmosphere be less than or equal to 30 ppb and moisture concentration be less than or equal to 30 ppb.

It is preferable that high-purity nitrogen gas also be used as a nitrogen gas to be sprayed and the concentration of oxygen contained in the nitrogen gas be less than or equal to 30 ppm, preferably less than or equal to 30 ppb. In addition, it is preferable that moisture ($H_2O$) concentration of the nitrogen gas also be less than or equal to 30 ppm. It is preferable to use an ultrapure gas in which the concentration of oxygen contained in the nitrogen gas is less than or equal to 30 ppb and the concentration of moisture is less than or equal to 30 ppb. At the time of laser irradiation, an oxygen element which is included in a nitrogen atmosphere and a nitrogen gas to be sprayed is reduced as much as possible, whereby an oxide film is prevented from being formed on a surface of the single crystal semiconductor layer by laser irradiation.

In order to raise temperature of the single crystal semiconductor layer in a short period of time, it is preferable that a stage be provided with a heating means and a heated nitrogen gas be sprayed at the same time as heating the stage. In addition, in order to raise temperature of the single crystal semiconductor layer in a short period of time, it is preferable that the semiconductor layer be irradiated with a laser beam while a heated nitrogen gas is sprayed from both the front side and the back side of the substrate.

In addition, as one feature of the laser processing apparatus of the present invention, a means which irradiate the supporting substrate with a microwave having a frequency of greater than or equal to 300 MHz and less than or equal to 300 GHz is included. A transferable carrier is oscillated by a microwave, and the carrier distribution is widened. As a carrier in silicon, an injected electron, an unpaired electron, and the like by addition of impurities can be given. Since there is a few unpaired electrons in a solid silicon layer having a thickness of less than or equal to 1 µm, a microwave is not easily absorbed by the layer. On the other hand, in the case where silicon is melted by a laser beam or the like, a carrier is generated, and further in the case where this region is irradiated with a microwave, as for an unpaired electron of a silicon atom of silicon which is not melted under the melted silicon, the electron distribution is widened. In other words, in the case where a silicon thin film is irradiated with a laser beam, a microwave is absorbed only by the vicinity of the melted region. Therefore, a wide region of the substrate is not heated; thus, a warp of the substrate is not likely to be caused.

As one feature of a manufacturing apparatus of a semiconductor substrate of the present invention, a means which irradiates a single crystal semiconductor layer with a microwave from a second surface of a supporting substrate is included. This is because, since a means which sprays a heated nitrogen gas from a first surface of the supporting substrate and a means which irradiates the first surface with a laser beam are provided, it is difficult to provide a placement position, on which irradiation with a microwave is performed, on the first surface of the supporting substrate.

While a heated nitrogen gas is sprayed on the surface of a single crystal semiconductor layer and irradiation with a microwave is performed, the surface of the single crystal semiconductor layer is irradiated with a laser beam, whereby the length of time the single crystal semiconductor layer is being melted can be increased. When the single crystal semiconductor layer is irradiated with the laser beam at room temperature, the length of time the single crystal semiconductor layer is being melted is about less than or equal to 100 nanoseconds; however, the length of time the single crystal semiconductor layer is being melted can be increased by spraying the heated nitrogen gas and performing irradiation with the microwave. It is preferable that the length of time the single crystal semiconductor layer is being melted be greater than or equal to 200 nanoseconds and less than or equal to 1000 nanoseconds. When the length of melting time exceeds 1000 nanoseconds, heat conduction might occur and damage such as melting of a glass substrate which is the supporting substrate might be caused to the supporting substrate.

While the heated nitrogen gas is sprayed on the surface of the single crystal semiconductor layer and irradiation with the microwave is performed, the surface of the single crystal semiconductor layer is irradiated with a laser beam, whereby at least one of many effects described hereinafter can be obtained.

By increasing the length of the melting time, limitation on movement of silicon atoms is reduced. At the time of melting, although the surface tension operates on movement of the atoms, planarity of the surface to be irradiated is improved much more by increase in the melting time. In addition, dangling bonds in the single crystal semiconductor layer or microdefects such as defects at the interface between the single crystal semiconductor layer and a base film can be removed, whereby a higher quality single crystal semiconductor layer can be obtained. In this specification, a region of the single crystal semiconductor layer, which is irradiated with the laser beam at the same time as spraying of the heated nitrogen gas and irradiation with the microwave, is melted and re-single-crystallization thereof is performed. As a result, a single crystal semiconductor layer having excellent properties is obtained.

Hereinafter, details of a manufacturing apparatus having the structure described above are shown.

Before scanning with a laser beam, a heated gas is sprayed on a region that is to be irradiated, whereby a region irradiated with a laser beam can be heated in advance. Therefore, energy of a laser beam that is needed for melting of a single crystal semiconductor layer can be reduced. By adjustment of an optical system or the like, it is also possible to irradiate a larger area with one shot. If a larger area can be irradiated with one shot, the time it takes to perform a laser irradiation process of each substrate can be shortened. Here, the energy of the laser that can be outputted is made best use of so that the length L of the region irradiated with a laser beam is set long.

Figure 1B:
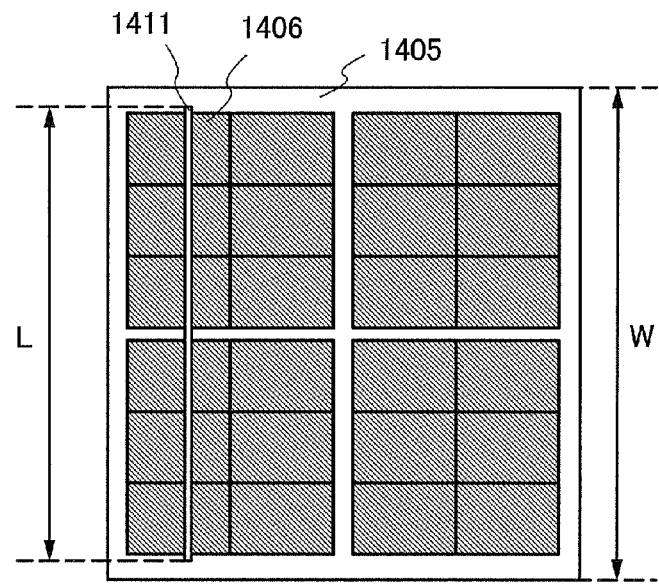
FIG. 1B is a top view of a supporting substrate.

FIG. 1B illustrates a top view that illustrates the positional relationship during laser irradiation among a large-area substrate 1405, a region 1411 irradiated with a laser beam, and a single crystal semiconductor layer 1406. As illustrated in FIG. 1B, the length L of the region irradiated with a laser beam is longer than the total length of six single crystal semiconductor layers 1406 that are arranged in a row. The width of the large-area substrate 1405 is denoted by W. In addition, the length of the region irradiated with a laser beam along a direction perpendicular to the width W of the large-area substrate is referred to as the width of the laser beam. Here, an example is given in which the large-area substrate 1405 has a size of 600 mm×720 mm and 24 single crystal semiconductor layers 1406 are arranged over one substrate. Each of the single crystal semiconductor layers 1406 is obtained by being separated from a silicon wafer.

FIG. 1A is a cross-sectional view that illustrates part of a manufacturing apparatus, and this manufacturing apparatus includes a plurality of stages in a chamber and a means which floats and transfers a substrate by spraying a heated nitrogen gas from gas blowing holes provided in the stages. Note that the chamber is not illustrated in FIG. 1A.

The concentration of oxygen and the concentration of moisture in the chamber are each less than or equal to 30 ppm, preferably less than or equal to 30 ppb. Thus, in order to minimize residual gases such as oxygen and $H_2O$ in a chamber (reaction container) as much as possible, after the ultimate pressure is lowered to an ultra-high vacuum (UHV) region of $1\times10^{-7}$ Torr to $1\times10^{-10}$ Torr (about greater than or equal to $1\times10^{-5}$ Pa and less than or equal to $1\times10^{-8}$ Pa), a high-purity nitrogen gas is supplied with an extremely low oxygen partial pressure $N_2$ gas generating apparatus, whereby a nitrogen atmosphere in the chamber is obtained. In addition, the manufacturing apparatus may have a unit with which the high-purity nitrogen gas is evacuated from the chamber and then circulated again into the chamber. It is also possible to reduce the concentration of the contained oxygen and the concentration of the contained moisture by circulation. If circulation is possible while the heated gas temperature is being kept, energy for heating can be suppressed in the case where the gas is sprayed again. In addition, consumption of expensive high-purity gas can be suppressed because the gas is to be reused.

In addition, the manufacturing apparatus is provided with a oscillator 1501, a waveguide 1502, and a dielectric 1503. The oscillator 1501 can emit a microwave, which is emitted to the large-area substrate 1405 through the dielectric 1503. It is sufficient that the frequency of the microwave be greater than or equal to 300 MHz and less than or equal to 300 GHz, and 2.45 GHz can be typically given. Further, it is sufficient that a place in which silicon is melted by a laser beam be irradiated with the microwave, and that the irradiation region at least include the region 1411 irradiated with a laser beam in FIG. 1B. The surface of the dielectric 1503, which is in a direction in which the surface of a stage 1401 extends, is also the stage. In addition, as a material of the dielectric 1503, which is placed in the region irradiated with a laser beam, quartz glass, silicon oxide, a sapphire, or the like is used, and a material which is not heated by a laser beam or a material having high heat resistance is used.

In the case where ultra-high vacuum evacuation is performed to obtain a vacuum lower than $10^{-5}$ Pa in the chamber, it is preferable to use a turbo-molecular pump and a cryopump. Evacuation is performed with the turbo-molecular pump, and further vacuum evacuation is performed with the cryopump.

The inner wall of the chamber may have a mirror-like finish, and a heater for baking may be provided to reduce discharge of gas from the inner wall. It is preferable that the chamber be baked (at 200° C. to 300° C.) to remove a residual gas mainly containing moisture, which exists inside the chamber.

A nitrogen gas stored in a gas storage device 1430 is supplied to an extremely low oxygen partial pressure $N_2$ gas generating apparatus 1428 through a valve provided in a tube 1429. Then, the nitrogen gas is supplied from the extremely low oxygen partial pressure $N_2$ gas generating apparatus 1428 to a plurality of gas blowing holes 1412 in the stage 1401 through a tube 1427, a gas heating device 1426, and a tube 1425. The extremely low oxygen partial pressure $N_2$ gas generating apparatus 1428 controls the flow rate and pressure of the nitrogen gas and supplies the nitrogen gas so as to float the large-area substrate 1405.

Two stages of the stage 1401 and a stage 1402 are placed apart from each other so as not to overlap with the region irradiated with a laser beam and arranged so as not to be heated by being irradiated with a laser beam. The stage 1402 is similarly provided with a plurality of gas blowing holes 1412. A nitrogen gas stored in a gas storage device 1420 is supplied to an extremely low oxygen partial pressure $N_2$ gas generating apparatus 1418 through a valve provided in a tube 1419. Then, the nitrogen gas is supplied from the extremely low oxygen partial pressure $N_2$ gas generating apparatus 1418 to the plurality of gas blowing holes 1412 in the stage 1402 through a tube 1417, a gas heating device 1416, and a tube 1415.

In order to make each of the concentration of oxygen and the concentration of moisture in the chamber less than or equal to 30 ppm, preferably less than or equal to 30 ppb, a high-purity gas is preferably used also as a nitrogen gas for floating the supporting substrate which is made to flow from the plurality of gas blowing holes 1412. Note that although the gas heating devices, the gas storage devices, and the like are illustrated under the stages in FIG. 1A, the structure is merely an example for description and there is no particular limitation on the present invention. Needless to say, these devices and the like can be placed in other places by extending the length of each tube.

With the plurality of gas blowing holes 1412 provided in the stages 1401 and 1402, the large-area substrate 1405 can be floated, and force is added to the transfer direction by a transfer roller (not shown) arranged in both sides, whereby the large-sized substrate 1405 can be transferred to a direction indicated by a hollow arrow.

Figure 2:
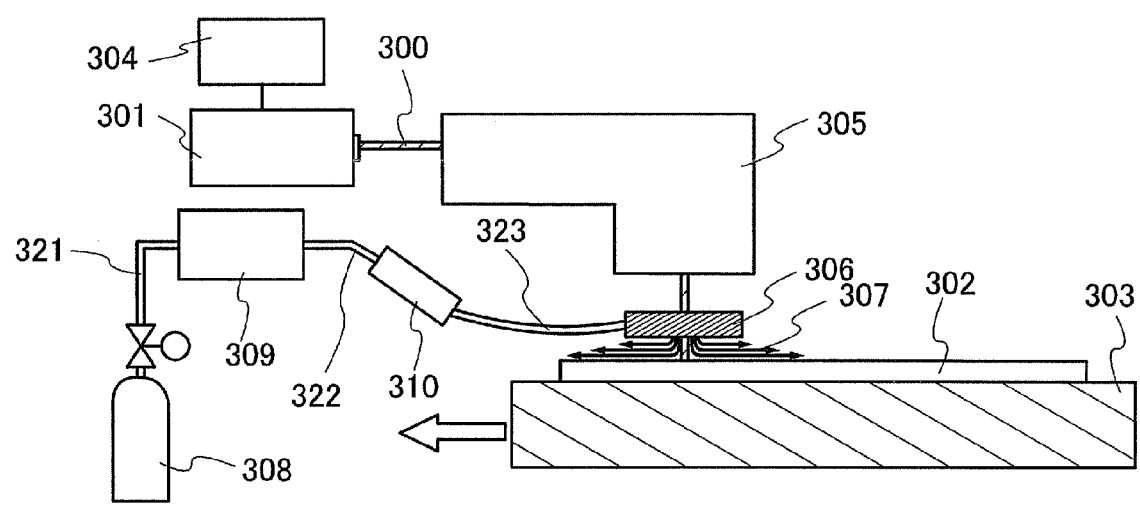
FIG. 2 is a view that illustrates a structural example of a laser irradiation apparatus.

The laser irradiation apparatus of this embodiment mode will be described below with reference to the drawings. FIG. 2 is a drawing that illustrates a structural example of a laser irradiation apparatus.

The laser irradiation apparatus includes a laser 301 that emits a laser beam 300 and a stage 303 where a supporting substrate 302 which is an object is disposed. A controller 304 is connected to the laser 301. By the control of the controller 304, energy of the laser beam 300 emitted from the laser 301, a repetition rate, or the like can be changed. The stage 303 is provided with a heating device such as a resistive heating device or the like, and the supporting substrate 302 can be heated.

An optical system 305 including a lens, a mirror, or the like is arranged between the laser 301 and the stage 303. By the optical system 305, the energy distribution of the laser beam 300 emitted from the laser 301 is homogenized and the cross section of the laser beam 300 is formed into a linear shape. The laser beam 300 which is passed through the optical system 305 passes through a gas ejection portion 306 and is delivered to the supporting substrate 302 fixed to the stage 303.

The gas ejection portion 306 is a box-like member for spraying a nitrogen gas 307 to the supporting substrate 302. In other words, the gas ejection portion 306 is a plate-like member having a cavity inside thereof.

The laser irradiation apparatus includes a gas storage device 308 for storing the nitrogen gas 307, such as a cylinder, a gas supply device 309 for supplying the nitrogen gas 307 to the gas ejection portion 306 from the gas storage device 308, and a gas heating device 310 for heating the nitrogen gas 307. The gas storage device 308 is coupled with the gas supply device 309 using a tube 321. The gas heating device 310 is coupled with the gas supply device 309 on an upstream side using a tube 322 and with the gas ejection portion 306 on a downstream side using a tube 323.

In particular, a high-purity gas is preferably used as the nitrogen gas 307 ejected from the gas ejection portion 306 and the nitrogen gas ejected from the gas blowing holes 1412 (see FIG. 1A), and the concentration of oxygen contained in the nitrogen gas is less than or equal to 30 ppm, preferably less than or equal to 30 ppb. In addition, it is preferable that moisture ($H_2O$) concentration of the nitrogen gas also be less than or equal to 30 ppm. It is preferable to use an ultrapure gas in which the concentration of oxygen contained in the nitrogen gas is less than or equal to 30 ppb and the concentration of moisture is less than or equal to 30 ppb. For example, in the case where a nitrogen gas whose oxygen concentration is more than 30 ppm is used, since the atmosphere near a region irradiated with a laser beam is heated, reactivity with oxygen might be increased and a thin oxide film might be formed on a surface at the time of laser irradiation. Since it is preferable to remove this thin oxide film, removal steps are added. An ultrapure gas in which the concentration of oxygen contained in the nitrogen gas is less than or equal to 30 ppb and the concentration of moisture is less than or equal to 30 ppb is used, whereby formation of the oxide film at the time of laser irradiation is prevented.

The nitrogen gas 307 stored in the gas storage device 308 is supplied to the gas heating device 310 by the gas supply device 309. The nitrogen gas 307 is heated when passing through the gas heating device 310, and the heated nitrogen gas 307 is supplied to the gas ejection portion 306 and sprayed on the supporting substrate 302.

Figure 3:
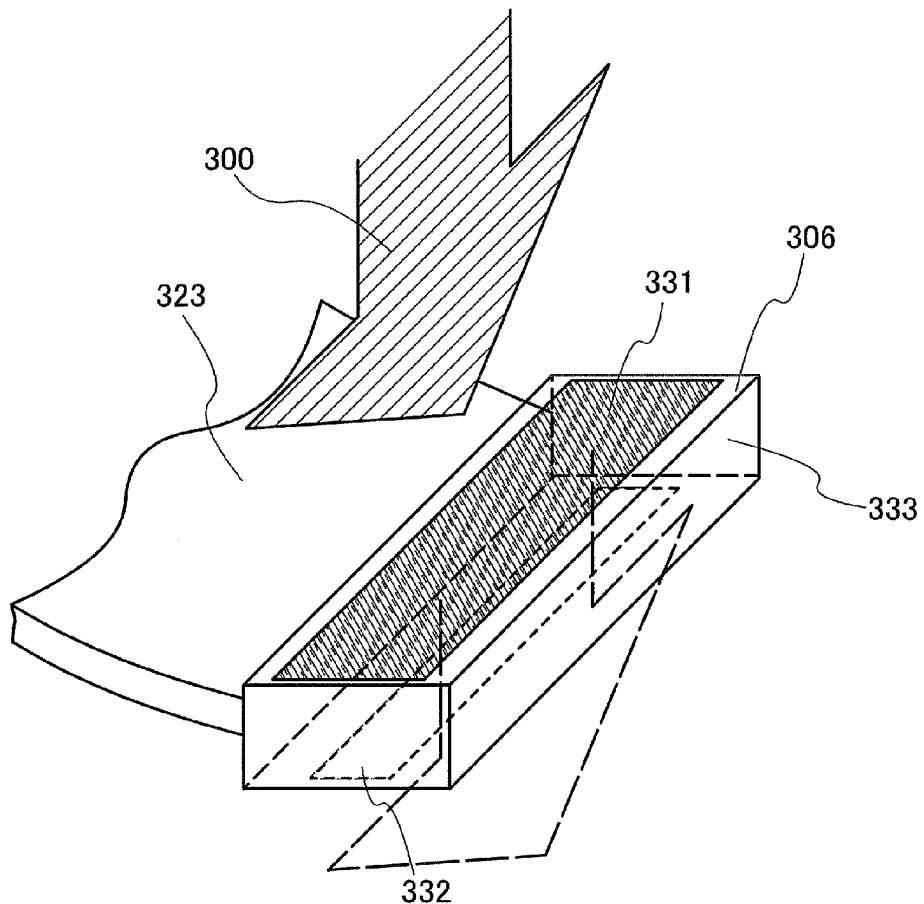
FIG. 3 is an external view that illustrates a structural example of a gas ejection portion.
Figure 4:
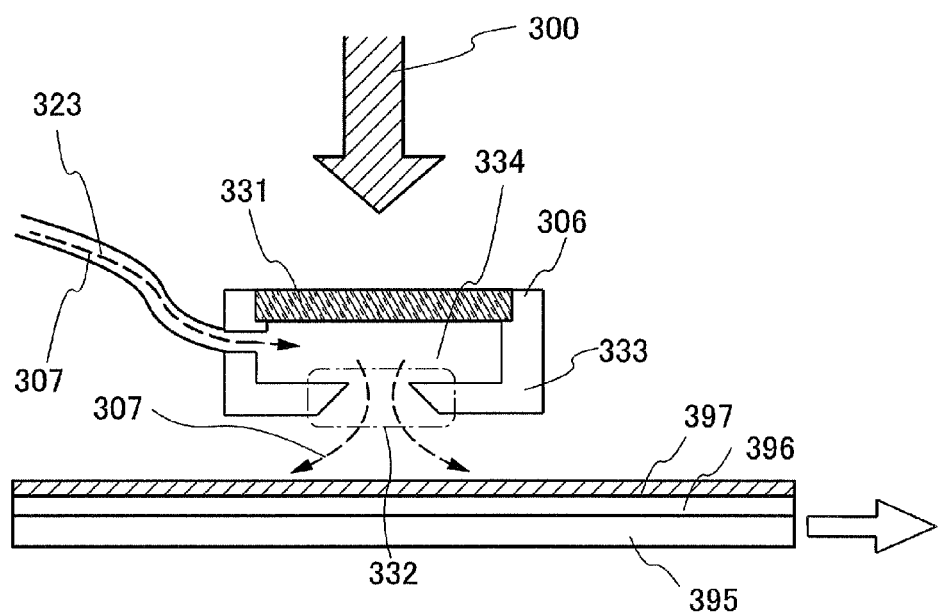
FIG. 4 is a cross-sectional view that illustrates a structural example of the gas ejection portion.

FIG. 3 is a drawing that illustrates a structural example of the gas ejection portion 306, and the appearance is illustrated. FIG. 4 is a cross-sectional view that illustrates an internal structure of the gas ejection portion 306 of FIG. 3.

The gas ejection portion 306 is a plate-like member and formed of a frame 333 in which a window 331 through which the laser beam 300 passes is provided on an upper surface and an opening 332 is formed on a surface facing the window 331. The tube 323 through which the nitrogen gas 307 passes is coupled with the frame 333. The nitrogen gas 307 which has passed through the gas heating device 310 is supplied to a cavity 334 surrounded by the frame 333 and the window 331. This nitrogen gas 307 is ejected from the opening 332 and sprayed on the object. The nitrogen gas 307 is ejected, whereby the gas ejection portion 306 is floated from the upper surface of the object (see FIG. 2). In FIG. 4, as the object, a buffer layer 396 and a single crystal semiconductor layer 397 are illustrated over a non-alkali glass substrate 395.

The opening 332 of the gas ejection portion 306 has not only a function of an outlet of the nitrogen gas 307 but also a function of a slit through which the laser beam 300 passes. With such a structure, a region of the supporting substrate 302, which is irradiated with the laser beam 300, is a region on which the nitrogen gas 307 is sprayed.

The window 331 may transmit the laser beam 300 and can be formed of a material having high heat resistance that can withstand the intensity of a laser beam to be used, for example, a quartz plate. The frame 333 can be formed of ceramic or the like, for example.

Next, a structure of the gas heating device 310 is described. For example, the structure includes a heater which heats the tube 323 through which the nitrogen gas 307 passes and a controller which controls the heater, and the heater generates heat by the control of the controller to heat the tube 323. The nitrogen gas 307 passes through the heated tube 323, whereby the nitrogen gas 307 is heated. Alternatively, the nitrogen gas 307 and a heating element are in contact with each other, whereby the nitrogen gas 307 can be heated. A nitrogen gas is sprayed on the heating element and a gas heated at a sufficiently high temperature is used so that the single crystal semiconductor layer is heated at a temperature of greater than or equal to 400° C. and less than or equal to a strain point (760° C.) of a non-alkali glass substrate, preferably a temperature of greater than or equal to 450° C. and less than or equal to 650° C.; therefore, a material which can withstand even being in contact with the gas, for example, ceramic or the like can be used for the heating element.

Figure 5:
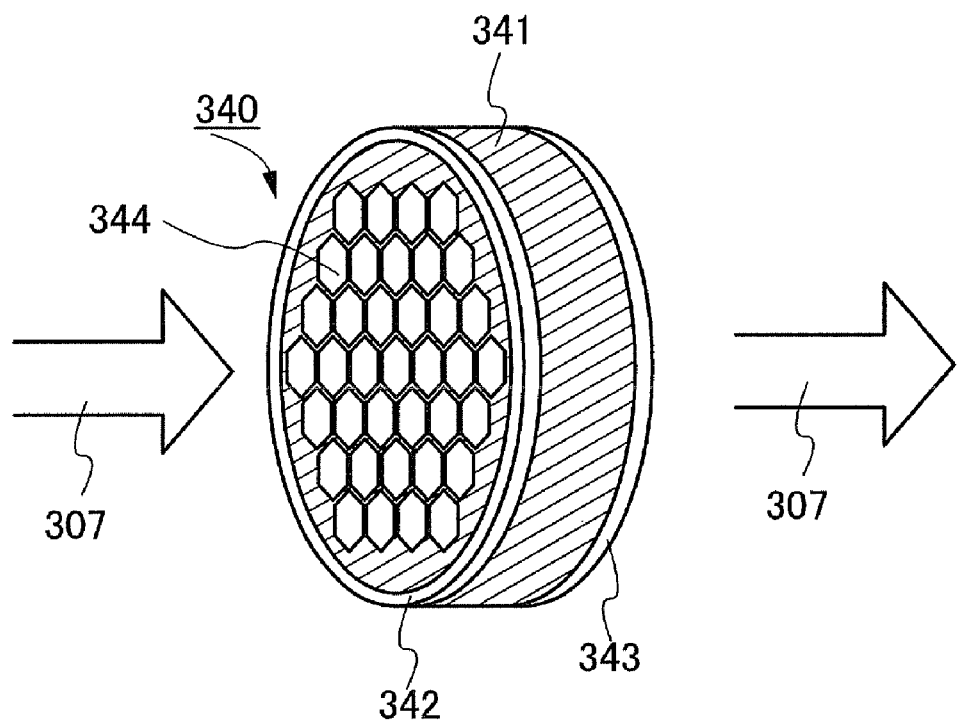
FIG. 5 is an external view that illustrates a structural example of a ceramic thermistor.

It is preferable that the gas heating device 310 be provided with a thermistor including ceramic having a positive temperature coefficient (PTC) to prevent excessive heating of the nitrogen gas 307. This is because there is an advantage that excessive heating can be prevented because ceramic generates heat to a temperature of greater than or equal to a Curie-point by having a PTC so that resistance of ceramic is rapidly increased. In FIG. 5, a structural example of a ceramic thermistor is shown. A ceramic thermistor 340 of FIG. 5 includes a heating element 341 formed of ceramic having a PTC property and a pair of an electrode 342 and an electrode 343 provided at an end of the heating element 341. The heating element 341 has a honeycomb structure including a plurality of pores 344. Note that in FIG. 5, although the shape of the pore 344 of the heating element 341 is hexagon, the shape of the pore 344 is not limited to hexagon and can be an arbitrary shape such as circular, quadrangular, or indeterminate.

The ceramic thermistor is arranged so that the heated nitrogen gas 307 flows through the pore 344 of the ceramic thermistor. The heater element 341 is heated by the heated nitrogen gas 307. Voltage between the electrodes 342 and 343 is monitored. Variation of a resistance value of the heater element is detected from the voltage value between the electrodes 342 and 343, and the temperature of the heater element 341 is found from the resistance value. Therefore, the temperature of the nitrogen gas 307 can be monitored by the ceramic thermistor. For example, when the temperature of the heater element 341 is detected to be greater than or equal to a predetermined temperature by the ceramic thermistor, the heater for heating the nitrogen gas 307 is controlled and the operation is stopped. In addition, the output is suppressed, whereby the nitrogen gas 307 is prevented from being overheated.

Figure 6A:
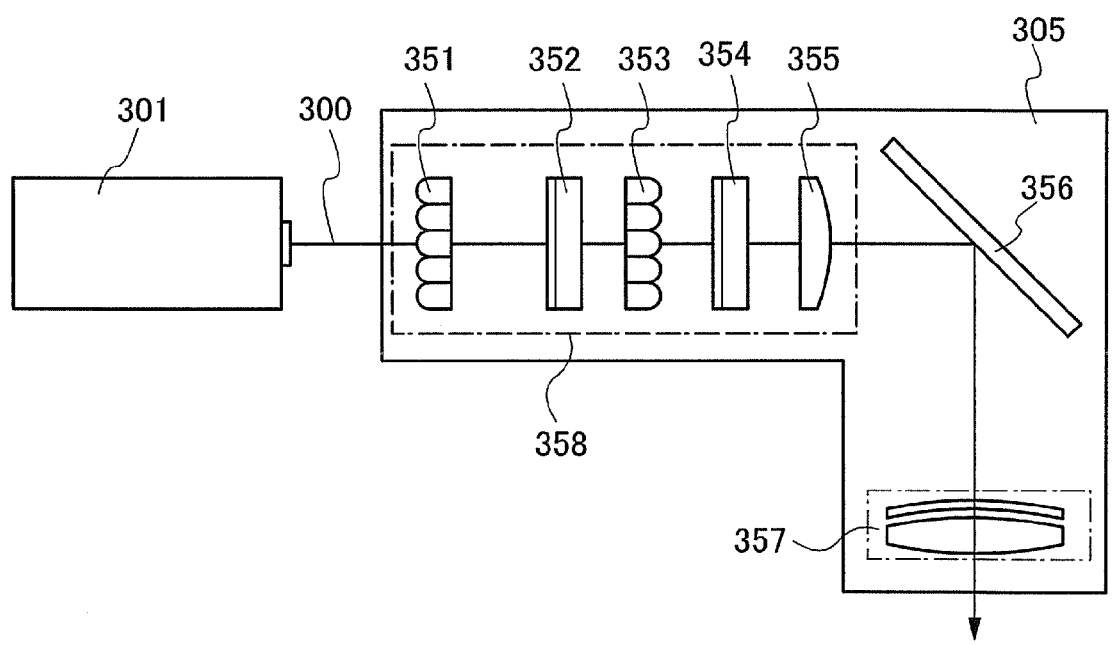
FIGS. 6A and 6B are views that each illustrate a structural example of an optical system of a laser irradiation apparatus.
Figure 6B:
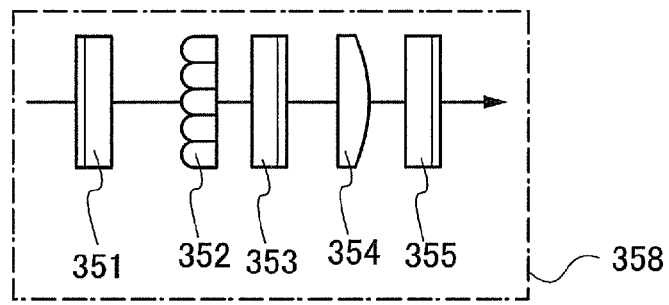

A structural example of the optical system 305 is illustrated in FIGS. 6A and 6B. The optical system 305 illustrated in FIG. 6A is an optical system for processing a cross-sectional shape of the laser beam 300 into a linear form and for making the energy distribution uniform.

In the optical system 305, a cylindrical lens array 351, a cylindrical lens array 352, a cylindrical lens array 353, a cylindrical lens 354, a cylindrical lens 355, a mirror 356, and a doublet cylindrical lens 357 are arranged from the laser 301 side. Note that a region 358 surrounded by a dashed line is a partial region of the optical system 305. In FIG. 6B, a plan view is illustrated in which each optical element of the cylindrical lens array 351 to the cylindrical lens 355 is rotated by 90 degrees around an optical path.

The laser beam 300 which enters the optical system 305 passes through the cylindrical lens arrays 351, 352, and 353, whereby an energy profile in a width direction of the laser beam 300 varies from a Gaussian distribution to a rectangle shape. By passing through the cylindrical lenses 354 and 355, a beam length in a length direction of a linear beam is lengthened and converged in a width direction. The laser beam 300 is reflected by the mirror 356. The laser beam 300 is converged in a width direction of the laser beam by the doublet cylindrical lens 357. As a result, a linear laser beam enters the gas ejection portion 306.

As the laser 301, a continuous wave laser, a quasi continuous wave laser, or a pulsed laser can be used. A pulsed laser is preferable for partial melting. In the case of a pulsed laser, a repetition rate of less than or equal to 1 MHz and a pulse width of greater than or equal to 10 nanoseconds and less than or equal to 500 nanoseconds can be employed. A typical pulsed laser is an excimer laser that emits a beam having a wavelength of less than or equal to 400 nm. As a laser, for example, a XeCl excimer laser having a repetition rate of 10 Hz to 300 Hz, a pulse width of 25 nanoseconds, and a wavelength of 308 nm can be used.

The energy of the laser beam 300 can be determined in consideration of the wavelength of the laser beam 300, the skin depth of the laser beam 300, the thickness of the single crystal semiconductor layer, and the like. The energy of the laser beam 300 can be, for example, in the range of greater than or equal to 300 mJ/cm$^2$ and less than or equal to 800 mJ/cm$^2$. For example, the energy density of the laser beam 300 can be greater than or equal to 600 mJ/cm$^2$ and less than or equal to 700 mJ/cm$^2$ in the case where the thickness of the single crystal semiconductor layer is about 120 nm, a pulsed laser is used as the laser, and a wavelength of the laser beam 300 is 308 nm.

Note that the atmosphere around the semiconductor layer that is to be irradiated with a laser beam may be separated from the atmosphere of the optical system 305 by surrounding the optical system 305 with a partition and providing a quartz window for transmitting the laser beam. For example, in this embodiment mode, by purging nitrogen from the optical system 305, the deterioration of the optical system can be suppressed.

Next, by the laser irradiation apparatus of FIG. 2, a method for irradiating the single crystal semiconductor layer with the laser beam is described. Here, a high-purity nitrogen gas is sprayed as the nitrogen gas.

First, the supporting substrate 302 to which the single crystal semiconductor layer is bonded is arranged over the stage 303. A nitrogen gas which is stored in the gas storage device 308 is supplied to the gas ejection portion 306 by the gas supply device 309. In the gas supply device 309, a flow rate of the nitrogen gas and pressure are adjusted, and the nitrogen gas is supplied so that the gas ejection portion 306 is floated. The nitrogen gas passes through the gas heating device 310, whereby the nitrogen gas is heated to be supplied to the gas ejection portion 306.

The laser beam 300 emitted from the laser 301 is made into a linear beam whose cross section is linear by the optical system 305. In FIG. 2, a direction that is perpendicular to paper is a length direction of the linear laser beam 300.

The laser beam 300 which is processed into a linear form passes through the gas ejection portion 306, and a sample, that is, a substrate is irradiated with the laser beam 300. The sample, that is, the supporting substrate 302 is irradiated with the laser beam 300 while the stage 303 is moved along the hollow arrow of FIG. 2 and the heated nitrogen gas is sprayed thereon. A direction of the hollow arrow is a width direction of the linear laser beam 300.

The laser irradiation apparatus described above is a laser irradiation apparatus which is capable of planarizing the surface of a semiconductor layer even when a substrate having low heat resistance is used as a supporting substrate of the semiconductor layer.

The laser irradiation apparatus described above can control a laser irradiation atmosphere without use of a chamber for isolating the stage 303 from the atmosphere. Thus, a laser irradiation apparatus can be downsized and manufactured at low cost, and maintenance and operation cost of the apparatus can be suppressed.

Figure 7:
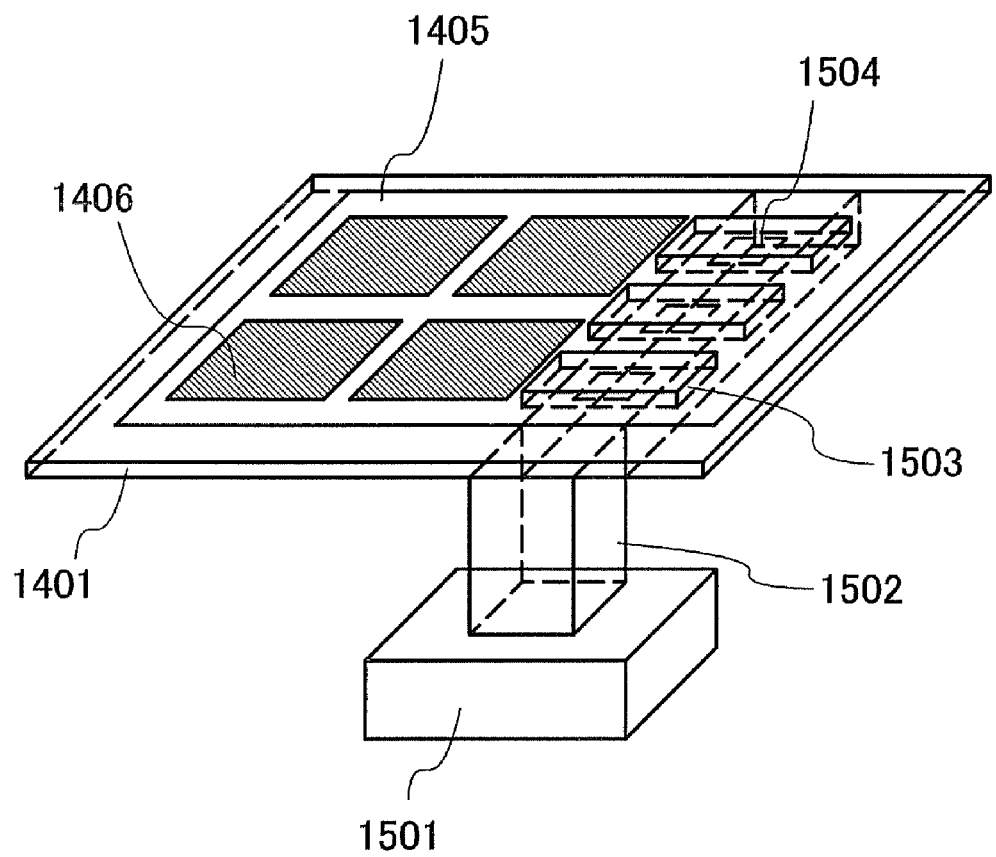
FIG. 7 is a view that illustrates a structural example of a microwave irradiation apparatus.

Next, a means which performs irradiation with a microwave and a structure thereof is described with reference to FIG. 7. In FIG. 7, the oscillator 1501, the waveguide 1502, and the dielectric 1503 are provided so as to be incorporated, as illustrated in FIG. 1A. The dielectric 1503 is provided so as to be incorporated into the stage 1401 and also serves as a stage.

A microwave generated from the oscillator 1501 may be in any of bands of UHF (Ultra High Frequency), SHF (Super High Frequency), and EHF (Extremely High Frequency). The details are as follows.

UHF: greater than or equal to 300 MHz and less than or equal to 3 GHz

SHF: greater than or equal to 3 GHz and less than or equal to 30 GHz

EHF: greater than or equal to 30 GHz and less than or equal to 300 GHz

Typically, 2.45 GHz is used.

In the case of the region irradiated with a laser beam as in FIG. 1B, the length of the waveguide 1502 is increased along the direction L. The waveguide 1502 is provided with a slot 1504, and a microwave is transmitted to the dielectric 1503 through the slot 1504. Although the slot 1504 and the dielectric 1503 are disposed with a plurality of distances therebetween in a region irradiated with a microwave in FIG. 7, the slot 1504 and the dielectric 1503 may be disposed successively.

The laser irradiation means and the means which sprays a nitrogen gas as in FIG. 2 are provided on the side of the single crystal semiconductor layer 1406, and it is effective to operate on each of them to perform irradiation. At this time, it gets difficult to ensure a region for providing the dielectric 1503 for effectively irradiating the large-area substrate 1405 with a microwave, from the surface of the substrate. Therefore, as one feature of the laser processing apparatus of the present invention and one feature of the manufacturing method thereof, as illustrated in FIGS. 1A and 1B and FIG. 7, a portion in which the optical system 305 and the gas ejection portion 306 are incorporated is provided on the front side of the substrate and the dielectric 1503 is provided on the back side of the substrate to perform irradiation with a microwave from the back side.

Figure 8:
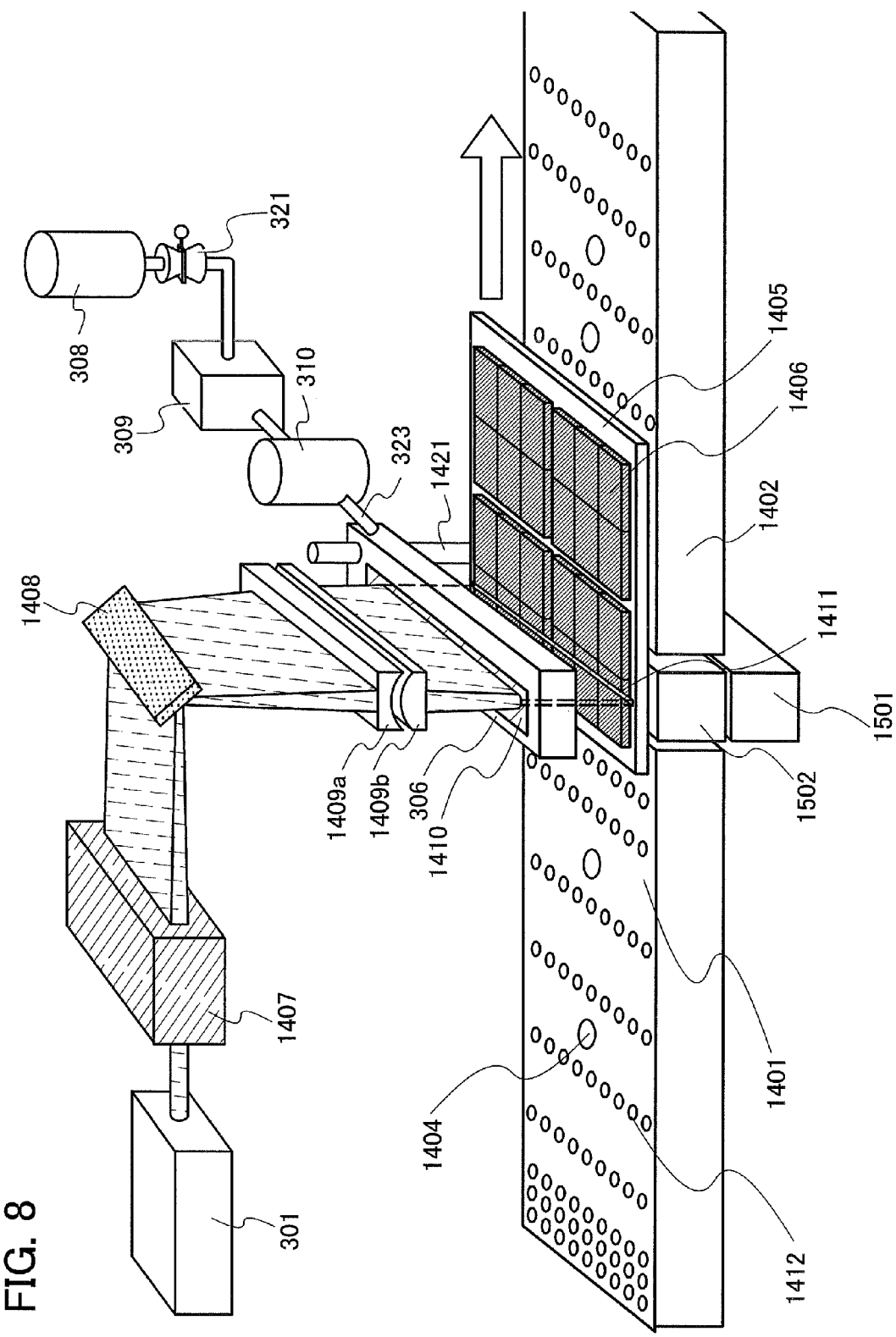
FIG. 8 is a view that illustrates an example of a perspective view of a manufacturing apparatus.

An example of a perspective view is illustrated in FIG. 8. As illustrated in FIG. 8, the stage 1402 is provided with gas evacuating holes 1404, and a flow rate controller (not shown) is provided to control the flow rate of a gas evacuated through the gas evacuating holes 1404. A lager number of gas blowing holes are provided in an end portion of the stage than in a central portion, whereby the substrate is prevented from bending.

With the use of a blow means which sprays a heated nitrogen gas on the large-area substrate 1405, fine adjustment can be further made, and bending of the substrate can be prevented. Although a heated nitrogen gas cannot be blown from the dielectric 1503, bending of the substrate can be prevented because the width of a transmission direction of the substrate is narrow.

The blow means having the gas ejection portion 306 fixed to a bottom portion of a chamber by a fixed axis 1421 is provided with a quartz window 1410 so as to transmit a laser beam. The gas ejection portion 306 is provided with the tube 323, and a heated nitrogen gas is supplied from the gas heating device 310.

A laser irradiation means illustrated in FIG. 8 has the laser 301, an optical device 1407 incorporating a homogenizer, a reflecting mirror 1408, a doublet lens 1409*a*, and a doublet lens 1409*b*. In general, to uniform energy distribution of a laser beam is referred to as "homogenize" and an optical system for homogenization is referred to as a "homogenizer". A laser beam emitted from the laser 301 is expanded by a spherical lens. Note that the spherical lens is not required when the beam spot of a beam emitted from the laser 301 is sufficiently large. Then, the spot is split in a long-side (long-axis) direction of a linear shape by the cylindrical lens arrays. After that, the laser beams are synthesized on the large-area substrate 1405 by a cylindrical lens which is located posterior to the cylindrical lens array. Thus, the large-area substrate 1405 is irradiated with a linear laser beam that is synthesized. In addition, the energy distribution along the long-side direction of the spot of the linear beam is homogenized (long-axis homogenization) on the surface of the large-area substrate 1405, and the length along the long-side direction is determined.

In addition, the blow means may be used as a mask provided with a slit.

The semiconductor layer is irradiated with the laser beam while the heated nitrogen gas is being sprayed from both the front side and the back side of the substrate, whereby temperature of the single crystal semiconductor layer can be increased in a short time. In addition, with the use of the laser processing apparatus illustrated in FIGS. 1A and 1B, FIG. 2, FIG. 3, FIG. 4, FIG. 5, FIGS. 6A and 6B, FIG. 7, and FIG. 8, laser irradiation process can be performed in a short time.

Embodiment Mode 2

Figure 9:
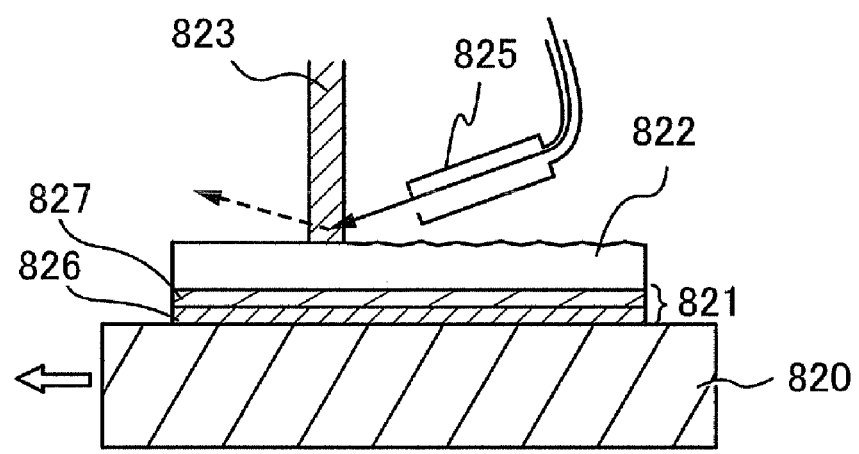
FIG. 9 is a cross-sectional view that illustrates an example of a method for spraying a heated gas.

In this embodiment mode, FIG. 9 illustrates an example of a structure of a laser irradiation apparatus that is different from that illustrated in FIG. 2.

FIG. 9 is an expanded sectional view of part of a device which sprays a gas in one direction.

A single crystal silicon layer 822 is fixed to a large-sized light-transmitting substrate 820 with a buffer layer 821 interposed therebetween. The buffer layer 821 has a multilayer structure, in which a barrier layer 826 is provided and a bonding layer 827 is provided thereover.

A heated gas is sprayed on the substrate from a blow means 825, and a current of air is formed in a direction of an arrow shown by a solid line. Although the heated gas is not shown here, the blow means 825 includes a gas supply device for supplying a nitrogen gas and a gas heating device for heating the nitrogen gas supplied from the gas supply device.

The single crystal silicon layer 822 is irradiated with a laser beam 823. A stage is moved, whereby the substrate is moved in a direction of a hollow arrow.

At the time of irradiation with a linear laser beam, a heated nitrogen gas is sprayed, and the single crystal silicon layer is heated up to about 500° C. that is a temperature of less than or equal to a strain point of a non-alkali glass substrate.

It is preferable that an opening of the blow means 825 be wider than a region irradiated with the laser beam 823.

The blow means 825 is provided and the gas is sprayed on the substrate, whereby a current of air is formed in the direction of an arrow shown by a dotted line. It is preferable that the air current direction be the same direction as the movement direction of the stage. Further, the movement direction of the stage is a direction perpendicular to a longitudinal direction of the region irradiated with the linear laser beam 823.

Note that for simplification, an optical system, a laser, and the like are omitted. For the optical system and the laser, the structures illustrated in FIGS. 6A and 6B can be employed. The laser is connected to a computer and is controlled by the computer. The blow means 825 is also connected to the computer and controlled by the computer.

In the case where a heated gas is sprayed in one direction, since the blow means 825 can take a distance from the laser beam 823, direct irradiation can be prevented. Thus, a material that is weak in a laser beam can also be used for the blow means 825 as long as the material can withstand the heated gas.

With the use of the apparatus illustrated in FIG. 9, a heated nitrogen gas is sprayed, part of the single crystal silicon layer 822 fixed to the supporting substrate with the buffer layer interposed therebetween is irradiated with the laser beam 823, and the single crystal silicon layer 822 is melted to perform re-single-crystallization. By re-single-crystallization, a flat surface can be obtained. A region of the single crystal silicon layer 822 irradiated with the laser beam 823 is partially melted or completely melted by irradiation with the laser beam 823.

In the case where partial melting is performed by irradiation with the laser beam 823, a crystal grows from the single crystal semiconductor that is the solid phase portion which is not melted in the lower layer, and a so-called longitudinal growth occurs in the single crystal silicon layer 822 when a portion which is melted is solidified. Since the solid phase portion in the lower layer is a single crystal and has uniform crystal orientation, a crystal grain boundary is not formed and the single crystal silicon layer 822 after laser irradiation process can be a single crystal semiconductor layer without a crystal grain boundary. Although re-single-crystallization of near the surface which is melted or the upper layer which is melted is performed by solidification, a single crystal semiconductor which has the same crystal orientation as the single crystal semiconductor in the solid phase portion in the lower layer is formed. Thus, in the case where a single crystal silicon wafer the plane orientation of a main surface of which is (100) is used as the single crystal semiconductor substrate, the plane orientation of a main surface of the single crystal silicon layer 822 is (100), and thus the plane orientation of a main surface of the single crystal silicon layer 822 which is partially melted by the laser irradiation process and in which re-single-crystallization thereof is performed is (100).

In the case where complete melting is performed by irradiation with the laser beam 823, crystals in the melted region can grow from the single crystal semiconductor which is adjacent to the melted region, and lateral growth occurs. Since a portion which is not melted is a single crystal and has uniform crystal orientation, a crystal grain boundary is not formed and the single crystal silicon layer 822 after laser irradiation process can be a single crystal semiconductor layer without a crystal grain boundary. Re-single-crystallization of the completely melted region is performed by solidification, and a single crystal semiconductor which has the same crystal orientation as the single crystal semiconductor in the adjacent portion which is not melted is formed. Thus, in the case where a single crystal silicon wafer the plane orientation of a main surface of which is (100) is used as the single crystal semiconductor substrate, the plane orientation of a main surface of the single crystal silicon layer 822 is (100), and the plane orientation of a main surface of the single crystal silicon layer 822 which is completely melted by the laser irradiation process and in which re-single-crystallization thereof is performed is (100).

Thus, even in the case of partial melting or complete melting, the crystal orientation in one single crystal silicon layer 822 is uniform. Therefore, when a display device having substantially the same size as the single crystal silicon layer 822 is manufactured later, a display device with excellent display characteristics can be obtained.

Embodiment Mode 3

In this embodiment mode, a semiconductor substrate in which a single crystal semiconductor layer is fixed to a supporting substrate with a buffer layer interposed therebetween will be described.

Figure 10:
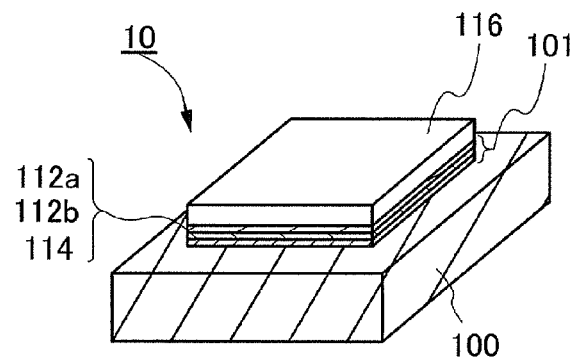
FIG. 10 is an external view that illustrates a structural example of a semiconductor substrate.

FIG. 10 illustrates a perspective view of a structural example of a semiconductor substrate. In a semiconductor substrate 10, a single crystal semiconductor layer 116 is bonded to a supporting substrate 100. The single crystal semiconductor layer 116 is provided over the supporting substrate 100 with a buffer layer 101 interposed therebetween. The semiconductor substrate 10 is a substrate having a so-called SOI structure, in which a single crystal semiconductor layer is formed over an insulating layer.

The buffer layer 101 may have a single layer structure or a multilayer structure in which two or more layers are stacked. In this embodiment mode, the buffer layer 101 has a three-layer structure, in which a bonding layer 114, an insulating film 112*a*, and an insulating film 112*b* are stacked from the supporting substrate 100 side. The bonding layer 114 is formed of an insulating film. The insulating film 112*a* is an insulating film which functions as a barrier layer. The barrier layer is a film that prevents the entry of impurities (typically, sodium) which decrease reliability of a semiconductor device, such as an alkali metal or an alkaline-earth metal, into the single crystal semiconductor layer 116 from the supporting substrate 100 side at the time of manufacturing the semiconductor substrate and at the time of manufacturing the semiconductor device using this semiconductor substrate. By formation of the barrier layer, a semiconductor device can be prevented from being contaminated by impurities; therefore, reliability thereof can be improved.

The single crystal semiconductor layer 116 is formed by thinning a single crystal semiconductor substrate. As a single crystal semiconductor substrate, a commercially-available semiconductor substrate can be used. For example, a single crystal semiconductor substrate formed of a group 4 element, such as a single crystal silicon substrate, a single crystal germanium substrate, or a single crystal silicon germanium substrate, can be used. Alternatively, a single crystal compound semiconductor substrate including gallium arsenide, indium phosphide, or the like can be used. Needless to say, the single crystal semiconductor substrate is not limited to a circular wafer, and various shapes of single crystal semiconductor substrates can be used. For example, a polygonal substrate such as a circular substrate, a rectangular substrate, a pentagonal substrate, or a hexagonal substrate can be used. Needless to say, a commercial circular single crystal semiconductor wafer can be used as the single crystal semiconductor substrate. As a circular single crystal semiconductor wafer, a semiconductor wafer of silicon, germanium, or the like; or a compound semiconductor wafer of gallium arsenide, indium phosphide, or the like can be used. A typical example of the single crystal semiconductor wafer is a single crystal silicon wafer, and a circular wafer having a diameter of 5 inches (125 mm), a circular wafer having a diameter of 6 inches (150 mm), a circular wafer having a diameter of 8 inches (200 mm), a circular wafer having a diameter of 12 inches (300 mm), a circular wafer having a diameter of 400 mm, or a circular wafer having a diameter of 450 mm can be used. In addition, a rectangular single crystal semiconductor substrate can be formed by cutting a commercial circular single crystal semiconductor wafer. The substrate can be cut with a cutter such as a dicer or a wire saw; laser cutting; plasma cutting; electron beam cutting; or any other cutting means. In addition, a rectangular single crystal semiconductor substrate can be formed in such a way that an ingot for manufacturing a semiconductor substrate before being sliced into a substrate is processed into a rectangular solid so as to have a rectangular cross section and this rectangular solid ingot is sliced. In addition, although there is no particular limitation on the thickness of the single crystal semiconductor substrate, a thicker single crystal semiconductor substrate is preferable because many single crystal semiconductor layers can be formed from one piece of thick source material wafer, in consideration of reuse of the single crystal semiconductor substrate. The thickness of commercially available single crystal silicon wafers conforms to SEMI Standards, which specify that, for example, a wafer of 6 inches in diameter is 625 μm thick, a wafer of 8 inches in diameter is 725 μm thick, and a wafer of 12 inches in diameter is 775 μm thick. Note that the thickness of a wafer conforming to SEMI standards has a tolerance of ±25 μm. Needless to say, the thickness of the single crystal semiconductor substrate to be a source material is not limited to SEMI standards, and the thickness can be adjusted as appropriate when an ingot is sliced. Needless to say, when a reprocessed single crystal semiconductor substrate 110 is used, the thickness thereof is thinner than that of SEMI standards.

As the supporting substrate 100, a substrate having an insulating surface is used. Specifically, a variety of glass substrates that are used in the electronics industry, such as aluminosilicate glass substrates, aluminoborosilicate glass substrates, and barium borosilicate glass substrates; quartz substrates; ceramic substrates; and sapphire substrates can be given. It is preferable that a glass substrate be used as the supporting substrate 100. It is preferable that a glass substrate have a coefficient of thermal expansion which is greater than or equal to $25\times10^{-7}/°$ C. and less than or equal to $50\times10^{-7}/°$ C. (more preferably, greater than or equal to $30\times10^{-7}/°$ C. and less than or equal to $40\times10^{-7}/°$ C.) and a strain point which is greater than or equal to 580° C. and less than or equal to 700° C. (more preferably, greater than or equal to 650° C. and less than or equal to 690° C.). In order to suppress contamination of the semiconductor device, moreover, the glass substrates are preferably non-alkali glass substrates. As a material of the non-alkali glass substrate, a glass material such as aluminosilicate glass, aluminoborosilicate glass, or barium borosilicate glass is used, for example. For example, it is preferable that a non-alkali glass substrate (product name: AN100), a non-alkali glass substrate (product name: EAGLE 2000®), or a non-alkali glass substrate (product name: EAGLE XG®) be used as the supporting substrate 100.

Examples of substrates that can be used as the supporting substrate 100 other than glass substrates are as follows: insulating substrates such as a ceramic substrate, a quartz substrate, and a sapphire substrate; conductive substrates such as a stainless steel substrate; semiconductor substrates such as a silicon substrate and a gallium arsenide substrate; and the like. In addition, it is preferable that the supporting substrate be a light transmitting substrate such as a glass substrate or a quartz substrate. With the use of the light transmitting substrate, the semiconductor substrate 10 which is suitable for manufacture of a transmissive display device or a transflective (semi-transparent) display device can be formed.

A method for manufacturing the semiconductor substrate 10 illustrated in FIG. 10 will be hereinafter described with reference to FIG. 12, FIGS. 13A to 13E, and FIGS. 14A and 14B.

Figure 12:
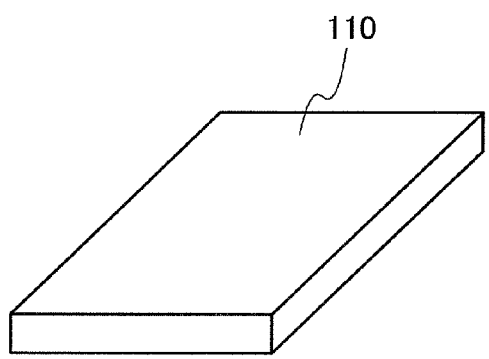
FIG. 12 is a cross-sectional view that illustrates a method for manufacturing a semiconductor substrate.

First, a single crystal semiconductor substrate 110 is prepared. The single crystal semiconductor substrate 110 is processed to have a desired size and a desired shape. FIG. 12 is an external view that illustrates a structural example of the single crystal semiconductor substrate 110. In consideration of the facts that the single crystal semiconductor substrate 110 is attached to the supporting substrate 100 and that a light exposure region of a light exposure apparatus such as a reduced-projection light exposure apparatus is rectangular, and the like, it is preferable that the shape of the single crystal semiconductor substrate 110 be rectangular as illustrated in FIG. 12. Needless to say, the shape of the single crystal semiconductor substrate 110 is not limited to that of FIG. 12, and various shapes of single crystal semiconductor substrates can be used. For example, a polygonal substrate such as a triangular substrate, a pentagonal substrate, a hexagonal substrate, or the like can be used as well as a rectangular substrate. A commercial circular semiconductor wafer can also be used as the single crystal semiconductor substrate 110.

The single crystal semiconductor substrate 110 having a rectangular shape can be formed by cutting a commercial circular bulk single crystal semiconductor substrate. The substrate can be cut with a cutter such as a dicer or a wire saw; laser cutting; plasma cutting; electron beam cutting; or any other cutting means. In addition, the single crystal semiconductor substrate 110 having a rectangular shape can be formed in such a way that an ingot for manufacturing a semiconductor substrate before being sliced into a substrate is processed into a rectangular solid so as to have a rectangular cross section and this rectangular solid ingot is sliced.

Note that in the case where a substrate formed of a group 14 element having a diamond structure as a crystal structure, such as a single crystal silicon substrate, is used as the single crystal semiconductor substrate 110, the plane orientation of the main surface may be (100), (110), or (111). With the use of the single crystal semiconductor substrate 110 the plane orientation of the main surface of which is (100), the interface state density between the single crystal semiconductor layer 116 and an insulating layer formed on a surface thereof can be lowered, which is suitable for manufacture of a field effect transistor.

With the use of the single crystal semiconductor substrate 110 having a (110) main surface, a close bond between an element that forms the bonding layer 114 and a group 14 element (e.g., a silicon element) that forms the single crystal semiconductor layer 116 is formed at a bonding surface between the bonding layer 114 and the single crystal semiconductor layer 116, whereby bonding force between the bonding layer 114 and the single crystal semiconductor layer 116 is improved.

With the use of the single crystal semiconductor substrate 110 having a (110) main surface, atoms are more closely arranged on the main surface than on a surface with different plane orientation; therefore, planarity of the single crystal semiconductor layer 116 is improved. Therefore, a transistor manufactured using the single crystal semiconductor layer 116 having a main surface of (110) has excellent electric characteristics such as a small S value and a high electron field-effect mobility. Note that a single crystal semiconductor substrate having a (110) main surface has advantages over a single crystal semiconductor substrate having a (100) main surface in that it has a high Young's modulus and is likely to be cleaved.

Figure 13A:
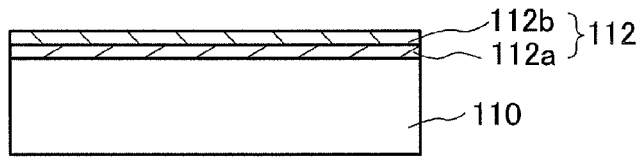
FIGS. 13A to 13E are cross-sectional views that illustrate a method for manufacturing a semiconductor substrate.

Then, as illustrated in FIG. 13A, the insulating layer 112 is formed over the single crystal semiconductor substrate 110. The insulating layer 112 can have a single layer structure or a multilayer structure including two or more layers. The thickness of the insulating layer 112 can be set in the range of greater than or equal to 5 nm and less than or equal to 400 nm. As the insulating layer 112, an insulating film including silicon or germanium in its composition, such as a silicon oxide film, a silicon nitride film, a silicon oxynitride film, a silicon nitride oxide film, a germanium oxide film, a germanium nitride film, a germanium oxynitride film, or a germanium nitride oxide film can be used. Further, an insulating film including a metal oxide such as aluminum oxide, tantalum oxide, or hafnium oxide; an insulating film including a metal nitride such as aluminum nitride; an insulating film including a metal oxynitride such as an aluminum oxynitride film; or an insulating film including a metal nitride oxide such as an aluminum nitride oxide film can also be used.

Note that in this specification, a silicon oxynitride film means a film containing more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 atomic % to 70 atomic %, 0.5 atomic % to 15 atomic %, 25 atomic % to 35 atomic %, and 0.1 atomic % to 10 atomic %, respectively. Further, a silicon nitride oxide film means a film containing more nitrogen than oxygen and, in the case where measurements are performed using RBS and HFS, includes oxygen, nitrogen, silicon, and hydrogen at concentrations ranging from 5 atomic % to 30 atomic %, 20 atomic % to 50 atomic %, 25 atomic % to 35 atomic %, and 15 atomic % to 25 atomic %, respectively. Note that percentages of nitrogen, oxygen, silicon, and hydrogen fall within the ranges given above, where the total number of atoms contained in the silicon oxynitride film or the silicon nitride oxide film is defined as 100 atomic %.

The insulating film for forming the insulating layer 112 can be formed by a CVD method, a sputtering method, a method of oxidizing or nitriding the single crystal semiconductor substrate 110, or the like.

In the case where a substrate containing impurities which decrease reliability of the semiconductor device, such as an alkali metal or an alkaline-earth metal, is used as the supporting substrate 100, the insulating layer 112 preferably includes at least one layer of a film capable of preventing diffusion of such an impurity from the supporting substrate 100 into the semiconductor layer of the SOI substrate. As the film for preventing impurity diffusion, a silicon nitride film, a silicon nitride oxide film, an aluminum nitride film, an aluminum nitride oxide film, and the like are given. With the provision of such a film, the insulating layer 112 can function as a barrier layer.

For example, in the case where the insulating layer 112 is formed as a barrier layer having a single layer structure, it can be formed with a silicon nitride film, a silicon nitride oxide film, an aluminum nitride film, or an aluminum nitride oxide film with a thickness of greater than or equal to 5 nm and less than or equal to 200 nm.

The insulating layer 112 preferably includes a barrier layer for preventing sodium from entering the single crystal semiconductor layer 116. The barrier layer may include one layer or two or more layers. For example, in the case where a substrate containing impurities which decrease reliability of the semiconductor device, such as an alkali metal or an alkaline-earth metal, is used as the supporting substrate 100, such impurities might diffuse into the single crystal semiconductor layer 116 from the supporting substrate 100 when the supporting substrate 100 is heated. Therefore, by forming the barrier layer, such impurities which reduce reliability of the semiconductor device, such as an alkali metal or an alkaline-earth metal, can be prevented from being moved to the single crystal semiconductor layer 116. As the film which functions as a barrier layer, a silicon nitride film, a silicon nitride oxide film, an aluminum nitride film, an aluminum nitride oxide film, and the like are given. By including such a film, the insulating layer 112 can function as a barrier layer.

For example, in the case where the insulating layer 112 has a single layer structure, the insulating layer 112 is preferably formed of a film which functions as a barrier layer. In this case, the insulating layer 112 having a single layer structure can be formed of a silicon nitride film, a silicon nitride oxide film, an aluminum nitride film, or an aluminum nitride oxide film having a thickness of greater than or equal to 5 nm and less than or equal to 200 nm.

When the insulating layer 112 is a film having a two-layer structure including one barrier layer, the upper layer can be formed of a silicon nitride film, a silicon nitride oxide film, an aluminum nitride film, or an aluminum nitride oxide film having a thickness of 5 nm to 200 nm, which functions as a barrier layer for blocking impurities such as sodium. These films which function as barrier layers have a high blocking effect for preventing impurity diffusion, but their internal stress is also high. Therefore, as the lower insulating film which is in contact with the single crystal semiconductor substrate 110, a film with an effect of relieving the stress of the upper insulating film is preferably selected. As the insulating film having such an effect, a silicon oxide film, a silicon oxynitride film, a thermal oxide film formed by thermal oxidation of the single crystal semiconductor substrate 110, and the like are given. The lower insulating film can be formed in a thickness of greater than or equal to 5 nm and less than or equal to 300 nm.

In this embodiment mode, the insulating layer 112 has a two-layer structure including the insulating film 112a and the insulating film 112b. As for a combination of the insulating film 112a and the insulating film 112b in order to function as a blocking film for the insulating layer 112, for example, a silicon oxide film and a silicon nitride film, a silicon oxynitride film and a silicon nitride film, a silicon oxide film and a silicon nitride oxide film, a silicon oxynitride film and a silicon nitride oxide film, and the like can be given.

For example, the insulating film 112a in the lower layer can be formed using a silicon oxynitride film which is formed using $SiH_4$ and $N_2O$ as a process gas by a plasma-enhanced CVD method (hereinafter referred to as a "PECVD method"). Alternatively, as the insulating film 112a, a silicon oxide film can be formed using an organosilane gas and oxygen as a process gas by a PECVD method. Further alternatively, as the insulating film 112a, an oxide film can be formed by oxidation of the single crystal semiconductor substrate 110.

As examples of the organosilane, the following compounds can be given: tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), trisdimethylaminosilane (chemical formula: $SiH(N(CH_3)_2)_3$), and the like.

As the insulating film 112b in the upper layer, a silicon nitride oxide film can be formed using $SiH_4$, $N_2O$, $NH_3$, and $H_2$ as a process gas by a PECVD method, or a silicon nitride film can be formed using $SiH_4$, $N_2$, $NH_3$, and $H_2$ as a process gas by a PECVD method.

For example, in the case where the insulating film 112a using silicon oxynitride and the insulating film 112b using silicon nitride oxide are formed by a PECVD method, the single crystal semiconductor substrate 110 is carried into a treatment chamber of a PECVD apparatus. Then, $SiH_4$ and $N_2O$ are supplied to the treatment chamber as a process gas for forming the insulating film 112a, and plasma of this process gas is generated, whereby a silicon nitride oxide film is formed over the single crystal semiconductor substrate 110. Next, the gas introduced into the treatment chamber is changed to a process gas for forming the insulating film 112b. Here, $SiH_4$, $NH_3$, $H_2$, and $N_2O$ are used. Plasma of a mixed gas of these is generated, and a silicon nitride oxide film is formed over a silicon oxynitride film in succession. In the case where a PECVD apparatus having a plurality of treatment chambers is used, a silicon oxynitride film and a silicon nitride oxide film can be formed in different treatment chambers. Needless to say, by changing a gas introduced into the treatment chamber, a silicon oxide film can be formed in the lower layer and a silicon nitride film can be formed in the upper layer.

When the insulating films 112a and 112b are formed as described above, the insulating layer 112 can be formed over a plurality of single crystal semiconductor substrates 110 with high throughput. In addition, because the insulating films 112a and 112b can be formed without exposure to the atmosphere, the interface between the insulating films 112a and 112b can be prevented from being contaminated by the atmosphere.

Alternatively, as the insulating film 112a, an oxide film can be formed by an oxidation treatment of the single crystal semiconductor substrate 110. Although the thermal oxidation treatment to form this oxide film may be dry oxidation, it is preferable to add a gas containing a halogen to an oxidizing atmosphere. An oxide film containing a halogen can be formed as the insulating film 112a. As a gas containing a halogen, one kind or plural kinds of gases selected from HCl, HF, $NF_3$, HBr, $Cl_2$, $ClF$, $BCl_3$, $F_2$, $Br_2$, or the like can be used.

For example, a heat treatment is performed at a temperature of greater than or equal to 700° C. in an atmosphere containing HCl at 0.5 volume % to 10 volume % (preferably 3 volume %) with respect to oxygen. Thermal oxidation is preferably performed at a heating temperature of greater than or equal to 950° C. and less than or equal to 1100° C. Processing time is 0.1 hour to 6 hours, preferably 0.5 hour to 1 hour. The thickness of the oxide film thus formed can be made to be 10 nm to 1000 nm (preferably 50 nm to 200 nm), for example, 100 nm.

Through an oxidation treatment within such a temperature range, a gettering effect with a halogen element can be obtained. Gettering particularly has the effect of removing a metal impurity. In other words, by the action of halogen, an impurity such as a metal becomes volatile metal chloride and is evaporated into the air, thereby being removed from the single crystal semiconductor substrate 110. In addition, because a dangling bond on the surface of the single crystal semiconductor substrate 110 is terminated with a halogen element used in the oxidation treatment, the localized level density at the interface between the oxide film and the single crystal semiconductor substrate 110 can be reduced.

By this thermal oxidation treatment in the atmosphere containing a halogen, the oxide film can be made to contain a halogen. When a halogen element is contained at concentration of $1 \times 10^{17}$ atoms/cm$^3$ to $5 \times 10^{20}$ atoms/cm$^3$, the oxide film can function as a protective film which prevents contamination of the single crystal semiconductor layer 116 by capturing impurities such as a metal in the semiconductor substrate 10.

The insulating film 112a can also be made to contain a halogen by being formed in a chamber of a PECVD apparatus containing a fluoride gas or a fluorine gas. A process gas for forming the insulating film 112a is introduced into such a chamber; this process gas is excited to generate plasma; and the insulating film 112a is formed over the single crystal semiconductor substrate 110 by chemical reaction of active species contained in the plasma.

A chamber of a PECVD apparatus can be made to contain a fluorine compound gas by cleaning the chamber through plasma gas etching using a fluoride gas. When a film is formed with a PECVD apparatus, a reaction product of a source material is deposited not only on a surface of a substrate but also on a chamber inner wall, an electrode, a substrate holder, and the like. This deposit causes a particle or dust. Accordingly, cleaning steps are regularly performed to remove such a deposit. One of typical chamber cleaning methods is a plasma gas etching method. In this method, a fluoride gas such as $NF_3$ is introduced into a chamber and excited to generate plasma, so that fluorine radicals are generated and deposit is etched to be removed. A fluoride which is generated by reacting with the fluorine radicals is removed from a reaction vessel by an exhaust system because of its high vapor pressure.

Through cleaning by plasma gas etching, a fluoride gas used as a cleaning gas is adsorbed to an inner wall of the chamber and an electrode and various jigs provided in the chamber. That is, the chamber can be made to contain a fluoride gas. Note that a method for making the chamber contain a fluoride gas includes a method in which a fluoride gas is introduced into the chamber after the single crystal semiconductor substrate is placed in the chamber, as well as a method in which the chamber is cleaned with a fluoride gas so that the fluoride gas remains in the chamber.

In the case where a silicon oxynitride film is formed as the insulating film 112a from, for example, $SiH_4$ and $N_2O$ by a PECVD method, $SiH_4$ and $N_2O$ are supplied to the chamber and excited to generate plasma, whereby the fluoride gas which remains in the chamber is also excited so that fluorine radicals are generated. Accordingly, the silicon oxynitride film can be made to contain fluorine. In addition, because the amount of the fluoride which remains in the chamber is very small and the fluoride gas is not supplied during formation of the silicon oxynitride film, fluorine is taken into the silicon oxynitride film at an early stage of the formation thereof. Thus, the insulating film 112a can be made to have high fluorine concentration at the interface between the single crystal semiconductor substrate 110 and the insulating film 112a (the insulating layer 112) or at the periphery thereof. That is, the insulating layer 112 of the semiconductor substrate 10 in FIG. 10 can be made to have high fluorine concentration at the interface between the insulating layer 112 and the single crystal semiconductor layer 116 or at the periphery thereof.

When fluorine is contained in such a region, a dangling bond of a semiconductor at the interface with the single crystal semiconductor layer 116 can be terminated with fluorine. Therefore, the interface state density between the single crystal semiconductor layer 116 and the insulating layer 112 can be reduced. In addition, even when impurities such as sodium are diffused into the insulating layer 112 from the supporting substrate 100, by the presence of fluorine, a metal can be captured by fluorine. Thus, metal contamination of the single crystal semiconductor layer 116 can be prevented.

Instead of the fluoride gas, a fluorine ($F_2$) gas can be contained in the chamber. Fluoride is a compound containing fluorine (F) in its composition. As the fluoride gas, a gas selected from $OF_2$, $ClF_3$, $NF_3$, $FNO$, $F_3NO$, $SF_6$, $SF_5NO$, $SOF_2$, or the like can be used.

Figure 13B:
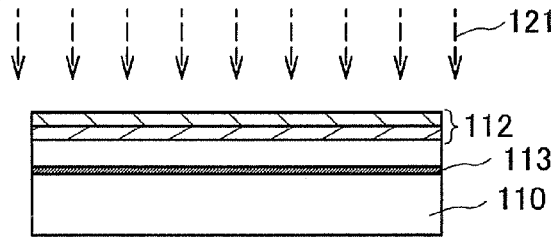

Next, as illustrated in FIG. 13B, the single crystal semiconductor substrate 110 is irradiated with an ion beam 121 including ions accelerated by an electric field through the insulating layer 112, whereby a damaged region 113 is formed in a region at a predetermined depth of the single crystal semiconductor substrate 110 from the surface thereof. The ion beam 121 is generated in such a way that a source gas is excited, plasma of the source gas is generated, and ions contained in the plasma are extracted from the plasma by the action of an electric field.

The depth at which the damaged region 113 is formed can be adjusted by the acceleration energy of the ion beam 121 and the incident angle of the ion beam 121. The acceleration energy can be adjusted by acceleration voltage, dose, or the like. The damaged region 113 is formed at the same or substantially the same depth as the average penetration depth of the ions. The thickness of the single crystal semiconductor layer separated from the single crystal semiconductor substrate 110 is determined by the depth to which ions are added. The depth at which the damaged region 113 is formed is adjusted so that the thickness of this single crystal semiconductor layer is greater than or equal to 20 nm and less than or equal to 500 nm, preferably greater than or equal to 20 nm and less than or equal to 200 nm.

For a method for adding ions to the single crystal semiconductor substrate 110, an ion doping method without mass separation is employed for the sake of addition of $H_3^+$ ions. An ion doping method without mass separation is preferable in that the cycle time when the damaged region 113 is formed in the single crystal semiconductor substrate 110 can be shortened, as compared to an ion implantation method with mass separation.

The single crystal semiconductor substrate 110 is carried in a treatment chamber of an ion doping apparatus. Main components of the ion doping apparatus are as follows: a chamber in which an object is disposed; an ion source for generating desired ions; and an acceleration mechanism for acceleration of ions and for irradiation therewith. The ion source includes a gas supply device for supplying a source gas to generate a desired ion species, an electrode for exciting the source gas to generate plasma, and the like. As the electrode for generating plasma, a filament electrode, a capacitive coupling high-frequency discharging electrode, or the like is used. The acceleration mechanism includes electrodes such as an extraction electrode, an acceleration electrode, a deceleration electrode, and a ground electrode; a power supply for supplying power to these electrodes; and the like. These electrodes that are included in the acceleration mechanism are provided with a large number of openings or slits, through which ions that are generated from the ion source are accelerated. Note that the components of the ion doping apparatus are not limited to the above components, and a mechanism is provided as needed.

A source gas is excited in the treatment chamber of the ion doping apparatus to generate plasma. Ion species are extracted from this plasma and accelerated to generate the ion beam 121. The plurality of single crystal semiconductor substrates 110 is irradiated with the ion beam 121, whereby ions are added at high concentration to the predetermined depth and the damaged region 113 is formed.

When hydrogen ($H_2$) is used for a source gas, plasma containing $H^+$, $H_2^+$, and $H_3^+$ can be generated by exciting a hydrogen gas. Proportions of ion species generated from a source gas can be changed by controlling an excitation method of plasma, a pressure of an atmosphere for generating plasma, a supply of the source gas, or the like. It is preferable that $H_3^+$ ions be included in plasma so that $H_3^+$ ions account for greater than or equal to 50% of the total amount of $H^+$ ions, $H_2^+$ ions, and $H_3^+$ ions which are ion species. It is preferable that $H_3^+$ ions be included in plasma so that $H_3^+$ ions account for greater than or equal to 80% of the total amount of $H^+$ ions, $H_2^+$ ions, and $H_3^+$ ions which are ion species. Therefore, an ion doping apparatus that is an apparatus of non-mass separation type, in which an object arranged in a chamber is irradiated with all of the ion species that are generated such that a process gas is plasma excited, is used. For example, an $H_2$ gas is supplied. In the ion doping apparatus to which an $H_2$ gas is supplied as a plasma source gas, $H_2$ is excited, whereby $H^+$ ions and $H_2^+$ ions which are hydrogen ions are generated. In addition, in the ion doping apparatus, there is a large amount of molecular hydrogen ($H_2$) in a region where plasma is generated, whereby $H_3^+$ can be easily generated in plasma. It is important that reaction of $H_2+H^+\to H_3^+$ is generated in the generation of $H_3^+$. Accordingly, a probability in which reaction of $H_2+H^+\to H_3^+$ is generated in plasma is increased, whereby the proportion of $H_3^+$ which exists in plasma can be increased. Since it is easy to include a large amount of molecular hydrogen ($H_2$) in plasma in the ion doping apparatus, the probability in which reaction of $H_2+H^+\to H_3^+$ occurs in plasma is increased, and plasma with a high proportion of $H_3^+$ can be generated. Meanwhile, in an ion implantation method with mass separation, it is difficult that $H_3^+$ accounts for greater than or equal to 50%, preferably greater than or equal to 80%. An ion implantation apparatus using an ion implantation method is an apparatus for mass separating ion species in plasma and irradiating an object with an ion species having specific mass, and varies greatly from an ion doping apparatus, which is an apparatus of non-mass separation type. In the ion implantation apparatus, when pressure in a region in which plasma is generated is small and a hydrogen gas is excited to generate $H^+$ ions and $H_2^+$ ions, these ion species are extracted promptly from the region in which plasma is generated. Accordingly, reaction of $H_2+H^+\to H_3^+$ is difficult to occur in plasma and the proportion of $H_3^+$ ions generated from the hydrogen gas is extremely low.

Since $H_3^+$ has larger number of hydrogen atoms than that of another hydrogen ion species ($H^+$ or $H_2^+$) and $H_3^+$ has large mass, in the case of acceleration with the same energy, $H_3^+$ is added to a shallower region in the single crystal semiconductor substrate 110, as compared to the case of $H^+$ and $H_2^+$. Thus, the increase in proportion of the $H_3^+$ ions included in the ion beam 121 leads to lower variation in the average depth at which the hydrogen ions enter; accordingly, in the single crystal semiconductor substrate 110, the hydrogen concentration profile in the depth direction becomes steeper and the peak position of the profile can shift to a shallow region. In addition, when one hydrogen atom is added to the same depth, it can be thought that acceleration voltage of $H_3^+$ ions can be three times as large as acceleration voltage of $H^+$ ions. When the acceleration voltage of ions can be increased, the cycle time of an ion irradiation step can be shortened, and improvement in productivity and throughput can be achieved.

In the case where the ions are added by an ion doping method using a hydrogen gas, the acceleration voltage can be set at greater than or equal to 10 kV and less than or equal to 200 kV and the dose can be set at greater than or equal to $1\times10^{16}$ ions/cm$^2$ and less than or equal to $6\times10^{16}$ ions/cm$^2$. By adding hydrogen ions under the conditions, the damaged region 113 can be formed in a portion of the single crystal semiconductor substrate 110 at a depth of greater than or equal to 50 nm and less than or equal to 500 nm, though it depends on ion species included in the ion beam 121 and percentages thereof.

For example, in the case where the single crystal semiconductor substrate 110 is a single crystal silicon substrate, the insulating film 112a is a 50 nm thick silicon oxynitride film, and the insulating film 112b is a 50 nm thick silicon nitride oxide film, a single crystal semiconductor layer with a thickness of about 120 nm can be separated from the single crystal semiconductor substrate 110 under the following conditions: a source gas is hydrogen; the acceleration voltage is 40 kV; and the dose is $2.2\times10^{16}$ ions/cm$^2$. When doping with hydrogen ions is performed under the above conditions except that the insulating film 112a is a 100 nm thick silicon oxynitride film, a semiconductor layer with a thickness of about 70 nm can be separated from the single crystal semiconductor substrate 110.

Helium (He) can alternatively be used for a source gas of the ion beam 121. Most of ion species generated by excitation of helium is $He^+$; therefore, $He^+$ can be added to the single crystal semiconductor substrate 110 as main ions even by an ion doping method without mass separation. Accordingly, microvoids can be efficiently formed in the damaged region 113 by an ion doping method. In the case where the ions are added by an ion doping method using helium, the acceleration voltage can be set at greater than or equal to 10 kV and less than or equal to 200 kV and the dose can be set at greater than or equal to $1\times10^{16}$ ions/cm$^2$ and less than or equal to $6\times10^{16}$ ions/cm$^2$.

A halogen gas such as a chlorine gas ($Cl_2$ gas) or a fluorine gas ($F_2$ gas) can also be used as the source gas.

Figure 13C:
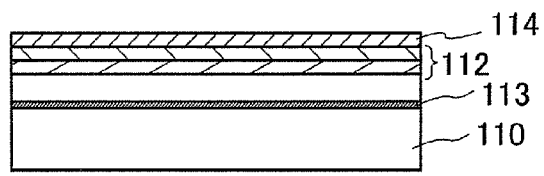

After the damaged region 113 is formed, the bonding layer 114 is formed over the upper surface of the insulating layer 112, as illustrated in FIG. 13C. In the step of forming the bonding layer 114, the single crystal semiconductor substrate 110 is heated at a temperature at which an element or a molecule that is added to the damaged region 113 does not precipitate, which is preferably less than or equal to 350° C. In other words, the damaged region 113 does not release gas within this heat temperature range. Note that the bonding layer 114 can also be formed before the ion addition step. In this case, the process temperature at the time of forming the bonding layer 114 can be set at greater than or equal to 350° C.

The bonding layer 114 is a layer for forming a smooth hydrophilic bonding surface on the surface of the single crystal semiconductor substrate 110. Therefore, the bonding layer 114 preferably has an average surface roughness Ra of less than or equal to 0.7 nm, more preferably less than or equal to 0.4 nm. The bonding layer 114 can have a thickness of greater than or equal to 10 nm and less than or equal to 200 nm. The bonding layer 114 preferably has a thickness of greater than or equal to 5 nm and less than or equal to 500 nm, and more preferably greater than or equal to 10 nm and less than or equal to 200 nm.

The bonding layer 114 is preferably an insulating film which is formed by chemical vapor reaction. For example, a silicon oxide film, a silicon oxynitride film, a silicon nitride oxide film, a silicon nitride film, or the like can be formed as the bonding layer 114. In the case where a silicon oxide film is formed as the bonding layer 114 by a PECVD method, it is preferable to use an organosilane gas and an oxygen ($O_2$) gas as a source gas. By using organosilane as the source gas, it is possible to form a silicon oxide film having a smooth surface at a process temperature of less than or equal to 350° C. Alternatively, low temperature oxide (LTO) formed at a temperature of greater than or equal to 200° C. and less than or equal to 500° C. by a thermal CVD method can be used. LTO can be formed by using monosilane ($SiH_4$), disilane ($Si_2H_6$), or the like as a silicon source gas and using dinitrogen monoxide ($N_2O$) or the like as an oxygen source gas.

Examples of conditions for forming the bonding layer 114 of a silicon oxide film by using TEOS and $O_2$ as a source gas are that TEOS is introduced into the treatment chamber at a flow rate of 15 sccm and $O_2$ is introduced into the treatment chamber at a flow rate of 750 sccm and that the film formation pressure is 100 Pa, the film formation temperature is 300° C., the RF output is 300 W, and the power frequency is 13.56 MHz.

The order of the step of FIG. 13B and the step of FIG. 13C can be reversed. In other words, after the insulating layer 112 and the bonding layer 114 are formed over the single crystal semiconductor substrate 110, the damaged region 113 can also be formed. In this case, it is preferable that the insulating layer 112 and the bonding layer 114 be formed in succession when the insulating layer 112 and the bonding layer 114 can be formed with the same film formation apparatus.

Alternatively, after the step of FIG. 13C is performed, the step of FIG. 13A and the step of FIG. 13B can be performed. In other words, after the single crystal semiconductor substrate 110 is doped with ions and then the damaged region 113 is formed, the insulating layer 112 and the bonding layer 114 can also be formed. In this case, when the insulating layer 112 and the bonding layer 114 can be formed with the same film formation apparatus, it is preferable that the insulating layer 112 and the bonding layer 114 be formed in succession. In addition, in order to protect the surface of the single crystal semiconductor substrate 110 before the damaged region 113 is formed, the single crystal semiconductor substrate 110 can be subjected to an oxidation treatment to form an oxide film on the surface, and then the single crystal semiconductor substrate 110 can also be doped with ion species through the oxide film. This oxide film is removed after the damaged region 113 is formed. Alternatively, the insulating layer 112 can be formed in a state where the oxide film remains.

Next, the supporting substrate 100 and the single crystal semiconductor substrate 110 which is provided with the insulating layer 112, the damaged region 113, and the bonding layer 114 are cleaned. This cleaning process can be performed by ultrasonic cleaning with pure water. As the ultrasonic cleaning, megahertz ultrasonic cleaning (megasonic cleaning) is preferable. After the ultrasonic cleaning, it is preferable that one of or both the single crystal semiconductor substrate 110 and the supporting substrate 100 be cleaned with ozone water. By cleaning with ozone water, an organic substance can be removed, and a surface activation treatment to improve hydrophilicity of the surface of the bonding layer 114 and the supporting substrate 100 can be performed.

The activation treatment of the surface of the bonding layer 114 and the supporting substrate 100 can be performed by irradiation process with an atomic beam or an ion beam, a plasma treatment, or a radical treatment as well as cleaning with ozone water. When an atomic beam or an ion beam is utilized, a rare gas neutral atom beam or a rare gas ion beam of argon or the like can be used.

Figure 13D:
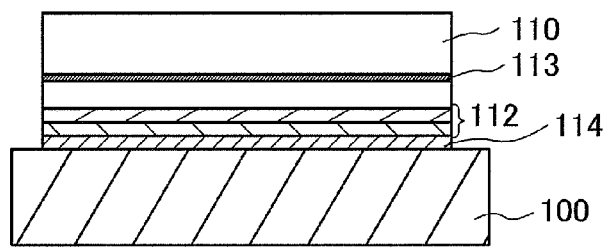

FIG. 13D is a cross-sectional view that illustrates a bonding step. The supporting substrate 100 and the single crystal semiconductor substrate 110 are disposed in contact with each other with the bonding layer 114 interposed therebetween. A pressure of about 300 N/cm² to 15000 N/cm² is applied to one part of the edge of the single crystal semiconductor substrate 110. A pressure applied thereto is preferably 1000 N/cm² to 5000 N/cm². The bonding layer 114 and the supporting substrate 100 start bonding to each other from a pressurized part and the bonding part extends to the entire surface. As a result, the single crystal semiconductor substrate 110 can be bonded to the supporting substrate 100. This bonding step can be performed at normal temperature without a heat treatment; therefore, a substrate having low heat resistance and having an allowable temperature limit of less than or equal to 700° C. like a glass substrate can be used as the supporting substrate 100.

After the single crystal semiconductor substrate 110 is attached to the supporting substrate 100, a heat treatment to increase bonding force at the bonding interface between the supporting substrate 100 and the bonding layer 114 is preferably performed. This treatment is performed at temperature where a crack is not generated in the damaged region 113 and can be performed at a temperature in the range of greater than or equal to 200° C. and less than or equal to 450° C. In addition, by attaching the single crystal semiconductor substrate 110 to the supporting substrate 100 while heating is performed within this temperature range, bonding force at the bonding interface between the supporting substrate 100 and the bonding layer 114 can be increased.

Figure 13E:
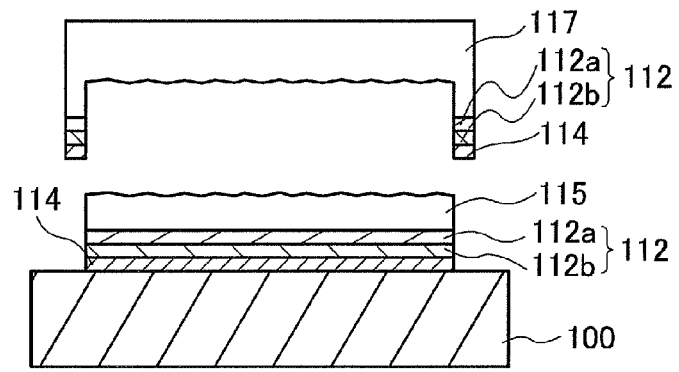

Next, a heat treatment is performed to cause separation in the damaged region 113, whereby a single crystal semiconductor layer 115 is separated from the single crystal semiconductor substrate 110. FIG. 13E is a view that illustrates a separation step where the single crystal semiconductor layer 115 is separated from the single crystal semiconductor substrate 110. Reference numeral 117 denotes the single crystal semiconductor substrate 110 from which the single crystal semiconductor layer 115 has been separated.

When a heat treatment is performed, the element added by ion doping is precipitated in the microvoids formed in the damaged region 113 due to an increase in temperature, whereby internal pressure increases. Due to the increase in pressure, a change occurs in the volume of the microvoids in the damaged region 113 to generate a crack in the damaged region 113. As a result, the single crystal semiconductor substrate 110 is cleaved along the damaged region 113. Since the bonding layer 114 is bonded to the supporting substrate 100, the single crystal semiconductor layer 115 which is separated from the single crystal semiconductor substrate 110 is fixed over the supporting substrate 100. The heat treatment for separating the single crystal semiconductor layer 115 from the single crystal semiconductor substrate 110 is performed at temperature which does not exceed a strain point of the supporting substrate 100.

For this heat treatment, a rapid thermal annealing (RTA) apparatus, a resistive heating furnace, or a microwave heating apparatus can be used. For the RTA apparatus, a gas rapid thermal annealing (GRTA) apparatus or a lamp rapid thermal annealing (LRTA) apparatus can be used. It is preferable that the temperature of the supporting substrate 100 to which the single crystal semiconductor layer 115 is bonded be increased to greater than or equal to 550° C. and less than or equal to 650° C. by this heat treatment.

When a GRTA apparatus is used, a heating temperature can be set at a temperature of greater than or equal to 550° C. and less than or equal to 650° C., and processing time can be set at greater than or equal to 0.5 minute and less than or equal to 60 minutes. When a resistive heating furnace is used, a heating temperature can be set at a temperature of greater than or equal to 200° C. and less than or equal to 650° C., and processing time can be set at greater than or equal to two hours and less than or equal to four hours. In the case where a microwave heating apparatus is used, irradiation can be performed with, for example, microwaves having a frequency of 2.45 GHz for processing time in the range of greater than or equal to 10 minutes and less than or equal to 20 minutes.

A specific treatment method of a heat treatment using a vertical furnace having resistive heating is described. The supporting substrate 100 to which the single crystal semiconductor substrate 110 is bonded is loaded into a boat for the vertical furnace. The boat is carried into a chamber of the vertical furnace. In order to suppress oxidation of the single crystal semiconductor substrate 110, the chamber is first exhausted to a vacuum state. The degree of vacuum is about $5 \times 10^{-3}$ Pa. After a vacuum state is obtained, nitrogen is supplied to the chamber so that the chamber has a nitrogen atmosphere under atmospheric pressure. In this period, the temperature is raised to 200° C.

After the chamber is made to have a nitrogen atmosphere under atmospheric pressure, heating is performed at 200° C. for two hours. Then, the temperature is raised to 400° C. for one hour. After a state in which the heating temperature is 400° C. becomes stable, the temperature is raised to 600° C. in one hour. After a state in which the heating temperature is 600° C. becomes stable, a heat treatment is performed at 600° C. for two hours. Then, a heating temperature is lowered to 400° C. in one hour, and after 10 minutes to 30 minutes, the boat is carried out from the chamber. Under the atmosphere, the single crystal semiconductor substrate 117 and the supporting substrate 100 to which the single crystal semiconductor layer 115 is bonded are cooled on the boat.

In the above heat treatment using a resistive heating furnace, a heat treatment to increase bonding force between the bonding layer 114 and the supporting substrate 100 and a heat treatment to cause separation in the damaged region 113 are performed in succession. In the case of performing these two heat treatments in different apparatuses, for example, after a treatment in which a treatment temperature is 200° C. and holding time is two hours is performed in a resistive heating furnace, the supporting substrate 100 and the single crystal semiconductor substrate 110 which are bonded together are carried out from the furnace. Next, a heat treatment is performed at a treatment temperature of greater than or equal to 600° C. and less than or equal to 700° C. for greater than or equal to 1 minute and less than or equal to 30 minutes with an RTA apparatus, so that the single crystal semiconductor substrate 110 is divided in the damaged region 113.

In order to strongly bond the bonding layer 114 and the supporting substrate 100 to each other by a low temperature treatment at less than or equal to 700° C., it is preferable that OH groups or water molecules ($H_2O$) exist on the surface of the bonding layer 114 and the surface of the supporting substrate 100. This is because the bonding between the bonding layer 114 and the supporting substrate 100 starts from the formation of covalent bonds (covalent bonds of oxygen molecules and hydrogen molecules) or hydrogen bonds of the OH groups or the water molecules.

Therefore, it is preferable that the surface of the bonding layer 114 and the surface of the supporting substrate 100 be activated to be hydrophilic. It is also preferable that the bonding layer 114 be formed by a method such that oxygen or hydrogen is contained. For example, a silicon oxide film, a silicon oxynitride film, a silicon nitride oxide film, a silicon nitride film, or the like is formed by a PECVD method at a process temperature of less than or equal to 400° C., whereby hydrogen can be contained in the film. In order to form a silicon oxide film or a silicon oxynitride film, for example, $SiH_4$ and $N_2O$ are used for a process gas. In order to form a silicon nitride oxide film, for example, $SiH_4$, $NH_3$, and $N_2O$ are used. In order to form a silicon nitride film, for example, $SiH_4$ and $NH_3$ are used. In addition, it is preferable that a compound having an OH group such as TEOS (chemical formula: $Si(OC_2H_5)_4$) be used for a source material in formation by a PECVD method.

Note that a low temperature treatment refers to a treatment at a process temperature of less than or equal to 700° C. This is because of the following two reasons. One is that the process temperature is less than or equal to a strain point of a glass substrate. In contrast, the other is that, for an SOI substrate that is formed by Smart-Cut®, a heat treatment at a temperature of greater than or equal to 800° C. is performed to attach a single crystal silicon layer and a single crystal silicon wafer to each other, and a heat treatment at a temperature exceeding a strain point of a glass substrate is needed.

Note that as illustrated in FIG. 13E, it is often the case that the peripheral portion of the single crystal semiconductor substrate 110 is not bonded to the supporting substrate 100. It can be thought that this is because the damaged region 113 is not easily separated in the peripheral portion of the single crystal semiconductor substrate 110 where the supporting substrate 100 and the bonding layer 114 are not bonded to each other because the peripheral portion of the single crystal semiconductor substrate 110 is chamfered or the peripheral portion of the bonding layer 114 is damaged or contaminated when the single crystal semiconductor substrate 110 is moved. Therefore, the single crystal semiconductor layer 115 that has smaller size than the single crystal semiconductor substrate 110 is attached to the supporting substrate 100, a projecting portion is formed around the single crystal semiconductor substrate 117, and portions of the insulating film 112b, the insulating film 112a, and the bonding layer 114 which are not bonded to the supporting substrate 100 remain on the projecting portion.

The single crystal semiconductor substrate 117 from which the single crystal semiconductor layer 115 has been separated can be reprocessed and reused as the single crystal semiconductor substrate 110. Hereinafter, a reprocessing method is described.

As illustrated in FIG. 13E, a portion which is not bonded to the supporting substrate 100 remains at the periphery of the single crystal semiconductor substrate 117. Portions of the insulating film 112b, the insulating film 112a, and the bonding layer 114 which are not bonded to the supporting substrate 100 remain in this portion.

First, an etching treatment is performed to remove the insulating film 112b, the insulating film 112a, and the bonding layer 114. For example, when these films are formed of silicon oxide, silicon oxynitride, silicon nitride oxide, or the like, the insulating film 112b, the insulating film 112a, and the bonding layer 114 can be removed by a wet etching treatment using hydrofluoric acid.

Next, the single crystal semiconductor substrate 117 is etched, whereby the peripheral projecting portion and the surface from which the single crystal semiconductor layer 115 has been separated is removed. The etching treatment for the single crystal semiconductor substrate 117 is preferably a wet etching treatment, and a tetramethylammonium hydroxide (abbreviation: TMAH) solution can be used as an etchant.

After the single crystal semiconductor substrate 117 is subjected to an etching treatment, the surface thereof is polished and planarized. For the polishing treatment, chemical mechanical polishing (abbreviation: CMP) or mechanical polishing can be used. In order to smooth the surface of the single crystal semiconductor substrate, the surface is polished about 1 μm to 10 μm. After the polishing, hydrofluoric acid cleaning or RCA cleaning is performed because abrasive particles and the like are left on the surface of the single crystal semiconductor substrate.

Through the above process, the single crystal semiconductor substrate 117 can be reused as the single crystal semiconductor substrate 110 which is illustrated in FIG. 12. By reuse of the single crystal semiconductor substrate 117, material cost of the semiconductor substrate 10 can be reduced.

Figure 14A:
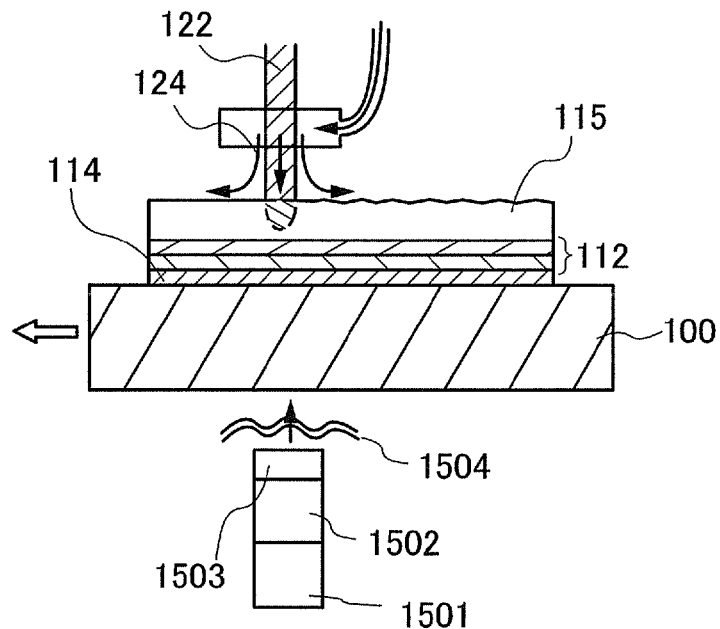
FIGS. 14A and 14B are cross-sectional views that illustrate a method for manufacturing a semiconductor substrate.

The single crystal semiconductor layer 115 bonded to the supporting substrate 100 is provided with a crystal defect by formation and separation of the damaged region 113. In addition, planarity of the surface is damaged. In order to perform re-single-crystallization of the single crystal semiconductor layer 115 and to improve the planarity of the surface, the single crystal semiconductor layer 115 is irradiated with a laser beam 122 and the irradiation region is heated by spraying a heated nitrogen gas, as illustrated in FIG. 14A. The supporting substrate 100 is irradiated with a microwave which is generated at this time from the oscillator 1501 through the waveguide 1502 and the dielectric 1503.

A stage is moved, the supporting substrate 100 is moved in the direction of a hollow arrow illustrated in FIG. 14A, and the separation plane of the single crystal semiconductor layer 115 is irradiated with the laser beam 122 by scanning the single crystal semiconductor layer 115 with the laser beam 122. Part of the single crystal semiconductor layer 115 or an entire layer in a depth direction thereof is melted by the heated nitrogen gas 124 and irradiation with the laser beam 122. By melting, planarity is improved by the operation of surface tension. In FIG. 14A, a state is schematically shown in which part of the single crystal semiconductor layer 115 is melted, and at least part of a portion surrounded by a dashed line shows that the part exceeds a melting point of 1410° C. to be in a liquid phase.

Further, the heated nitrogen gas is sprayed and irradiation with a microwave is preformed, whereby melting time and the length of time to be completely solidified are extended. In this embodiment mode, a current of air is formed so that the heated gas is spread from the region irradiated with the laser beam as a center and a region irradiated with the microwave is similarly spread from the region irradiated with the laser beam as a center. Therefore, the single crystal semiconductor layer 115 can be heated at a temperature of greater than or equal to 400° C. and less than or equal to a strain point of the supporting substrate 100, preferably at a temperature of greater than or equal to 450° C. and less than or equal to 650° C. before and after the laser irradiation.

Figure 14B:
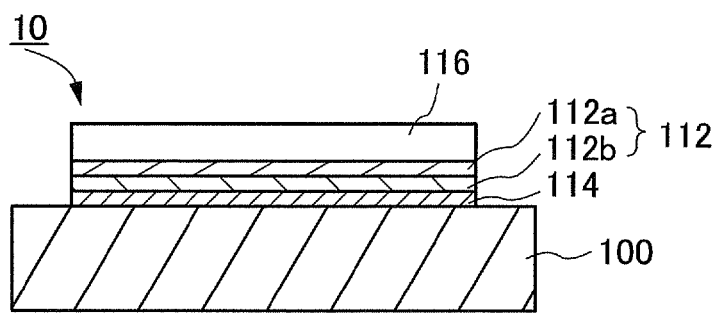

After melting, the single crystal semiconductor layer 115 is cooled and solidified more slowly than natural cooling, and the single crystal semiconductor layer 116 in which planarity is further improved on the upper surface of the single crystal semiconductor layer 115 and re-single-crystallization thereof is performed is formed, as illustrated in FIG. 14B. In addition, distortion of the single crystal semiconductor layer 116 can be decreased by irradiation with the laser beam. An external view of FIG. 14B corresponds to FIG. 10. Note that improvement in crystallinity of the single crystal semiconductor layer 116 due to the laser beam 122 can be examined by a Raman shift obtained from a Raman spectroscopy spectrum, a full width at half maximum, or the like. In addition, improvement in planarity of the single crystal semiconductor layer 116 can be examined by observation using an atomic force microscope or the like.

By irradiation with the laser beam 122, a region of the single crystal semiconductor layer 115, which is irradiated with the laser beam 122, is partially or completely melted. Note that a completely melted state of the single crystal semiconductor layer 115 means that the entire layer from the upper surface to the lower surface is melted. In a stacked structure of FIG. 14A, a completely melted state means that the single crystal semiconductor layer 115 is melted into a liquid state from the upper surface to the interface with the insulating layer 112. Meanwhile, a partially melted state of the single crystal semiconductor layer 115 means that the depth of a melted portion of the single crystal semiconductor layer 115 is shallower than that of the interface with the insulating layer 112 (the thickness of the single crystal semiconductor layer 115). That is, a partially melted state of the single crystal semiconductor layer 115 means a state in which the upper layer of the single crystal semiconductor layer 115 is melted into a liquid phase and the lower layer thereof is not melted and remains as a solid-phase single crystal semiconductor.

Partial melting is performed by irradiation with the laser beam 122, whereby crystal grows from the single crystal semiconductor that is the solid phase portion which is not melted in the lower layer, and a so-called longitudinal growth occurs in the single crystal semiconductor layer 115 when a portion which is melted is solidified. The lower solid phase portion is a single crystal and has uniform crystal orientation; thus, no crystal grain boundary is formed therein and the single crystal semiconductor layer 116 after the laser irradiation process can be a single crystal semiconductor layer without any crystal grain boundary. Re-single-crystallization of the upper melted portion is performed by solidification, and a single crystal semiconductor which has the same crystal orientation as the single crystal semiconductor in the lower solid phase portion is formed. Therefore, in the case where a single crystal silicon wafer the plane orientation of a main surface of which is (100) is used as the single crystal semiconductor substrate 110, the plane orientation of a main surface of the single crystal semiconductor layer 115 is (100), and the plan orientation of a main surface of the single crystal semiconductor layer 116 which is partially melted by the laser irradiation process and in which re-single-crystallization thereof is performed is (100).

On the other hand, in the region that is melted by scanning with the laser beam 122 while being completely melted by irradiation with the laser beam 122, crystals in the melted region can grow from the single crystal semiconductor which is adjacent to the melted region, and lateral growth occurs. A portion which is not melted is a single crystal and has uniform crystal orientation; thus, no crystal grain boundary is formed therein and the single crystal semiconductor layer 116 after the laser irradiation process can be a single crystal semiconductor layer without any crystal grain boundary. Re-single-crystallization of the completely melted region is performed by solidification, and a single crystal semiconductor which has the same crystal orientation as the single crystal semiconductor in the adjacent portion which is not melted is formed. Therefore, in the case where a single crystal silicon wafer the plane orientation of a main surface of which is (100) is used as the single crystal semiconductor substrate 110, the plane orientation of a main surface of the single crystal semiconductor layer 115 is (100), and the plane orientation of a main surface of the single crystal semiconductor layer 116 which is completely melted by the laser irradiation process and in which re-single-crystallization thereof is performed is (100).

By partial melting or complete melting of the single crystal semiconductor layer 115 through irradiation with the laser beam 122, the single crystal semiconductor layer 116 having a flat surface can be formed. The reason is as follows. A melted portion of the single crystal semiconductor layer 115 is liquid and is thus transformed by the action of surface tension so as to minimize the surface area. That is, a liquid portion is transformed so as to have no depressed and projecting portions, and this liquid portion is then solidified to perform re-single-crystallization. Accordingly, the single crystal semiconductor layer 116 having a planarized surface can be formed.

By planarizing the surface of the single crystal semiconductor layer 116, the thickness of a gate insulating film which is formed over the single crystal semiconductor layer 116 can be made small, about 5 nm to 50 nm. Accordingly, a transistor having high on current can be formed while gate voltage is kept low.

In this manner, this embodiment mode discloses an innovative technique, which is more novel than ever, for a method for obtaining a better single crystal by irradiating a single crystal semiconductor layer with a laser beam and melting part or whole of the single crystal semiconductor layer to perform re-single-crystallization. Such a method of using a laser beam is not anticipated by conventional techniques and is a completely novel concept.

Re-single-crystallization of the single crystal semiconductor layer 115 is performed, whereby a transistor which has high on current and high electron field-effect mobility can be formed from the semiconductor substrate 10. A process of re-single-crystallization of the single crystal semiconductor layer is performed by irradiation process with the laser beam 122; therefore, re-single-crystallization of the single crystal semiconductor layer 115 can be performed and formation of a single crystal is enabled without applying force that damages the supporting substrate 100 and without heating the supporting substrate 100 at temperature exceeding an allowable temperature limit.

The surface of the single crystal semiconductor layer 116 irradiated with the laser beam 122 is planarized, and the arithmetical mean roughness of unevenness on the surface can be greater than or equal to 1 nm and less than or equal to 7 nm. The root-mean-square roughness of the unevenness can be greater than or equal to 1 nm and less than or equal to 10 nm. The maximum difference in height of the unevenness can be greater than or equal to 5 nm and less than or equal to 250 nm. That is, irradiation process with the laser beam 122 can be regarded as a planarization treatment of the single crystal semiconductor layer 115.

The surface of the single crystal semiconductor layer 116 is planarized in this manner, whereby the thickness of a gate insulating film which is formed over the single crystal semiconductor layer 116 can be thinned to about 5 nm to 50 nm. Accordingly, a transistor having high reliability and high gate withstand voltage can be formed.

Chemical mechanical polishing (abbreviation: CMP) is known as a planarization treatment; however, a mother glass substrate has a large area and a warp. Therefore, in the case where a mother glass substrate is used as the supporting substrate 100, it is difficult to perform a planarization treatment of the single crystal semiconductor layer 115 by CMP. In this embodiment mode, this planarization treatment is performed by irradiation process with the laser beam 122; therefore, the single crystal semiconductor layer 115 can be planarized without applying force that damages the supporting substrate 100 and without heating the supporting substrate 100 at temperature exceeding an allowable temperature limit.

When irradiation with the laser beam 122 is performed, a heated gas is sprayed and the single crystal semiconductor layer 115 which is fixed to the supporting substrate 100 is heated, whereby the temperature of the single crystal semiconductor layer 115 is raised. The heating temperature of the supporting substrate 100 can be greater than or equal to 250° C. and less than or equal to a strain point of the supporting substrate 100. The heating temperature is preferably greater than or equal to 400° C., more preferably greater than or equal to 450° C. Specifically, the heating temperature is preferably greater than or equal to 400° C. and less than or equal to 670° C., more preferably greater than or equal to 450° C. and less than or equal to 650° C.

By heating the single crystal semiconductor layer, dangling bonds in the single crystal semiconductor layer or microdefects such as defects at the interface between the single crystal semiconductor layer and a base film can be removed, and a better single crystal semiconductor layer can be obtained. With the use of the semiconductor substrate 10 to which the single crystal semiconductor layer 116 having a small number of crystal defects, such as dislocation, or crystal microdefects, such as dangling bonds, is fixed, a transistor with high on current and high field-effect mobility can be formed.

In the case where a glass substrate is used as the supporting substrate 100, the supporting substrate to which the single crystal semiconductor layer is fixed is heated at a temperature of greater than or equal to 400° C., preferably greater than or equal to 450° C., whereby the supporting substrate can be shrunk. Accordingly, in the case where a transistor is formed using a glass substrate to which the single crystal semiconductor layer is fixed, if shrinkage is made in advance in the manufacturing process of the single crystal semiconductor substrate, the amount of shrinkage in the process of manufacturing a transistor can be suppressed. Therefore, mask misalignment in a light-exposure step can be suppressed.

When the insulating film 112a which is in contact with the single crystal semiconductor layer 115 is made to contain a halogen, the insulating film is also heated by irradiation with a laser beam. Therefore, a halogen is diffused from the insulating film and can be segregated at the interface between the single crystal semiconductor layer 116 which is obtained by re-single-crystallization and the insulating film 112a. By segregation of a halogen at the interface between the single crystal semiconductor layer 116 and the insulating film 112a, the halogen can capture ions of sodium or the like which are present at the interface. Thus, in the case where a glass substrate is used as the supporting substrate 100, formation of the insulating film 112a containing a halogen, spraying of a heated gas, and irradiation process with a laser beam while heating is being performed are extremely effective because contamination of the single crystal semiconductor layer 116 caused by impurities such as sodium is prevented.

To form the insulating film 112a in contact with the single crystal semiconductor layer 115 and contains a halogen and to form the insulating film 112b in contact with the insulating film 112a and serves as a barrier layer with a high impurity blocking effect are effective in increasing the concentration of the halogen that is segregated at the interface between the single crystal semiconductor layer 116 and the insulating film 112a. This is because a large amount of halogen is diffused to the single crystal semiconductor layer 116 side because a halogen is not easily diffused into the insulating film 112b that serves as a barrier layer. As such an insulating film 112b, a silicon nitride film or a silicon nitride oxide film can be used.

The above insulating films 112a and 112b can be formed by a method where the insulating films 112a and 112b are successively formed of either silicon oxynitride or silicon oxide and either silicon nitride oxide or silicon nitride, respectively, in a chamber of a PECVD apparatus after plasma cleaning with, for example, $NF_3$. The insulating films 112a and 112b can be successively formed by changing a process gas for film formation to be supplied to the chamber.

The single crystal semiconductor layer 115 is melted by irradiation with the laser beam 122, so that re-single-crystallization of the single crystal semiconductor layer 116 is performed, whereby a better single crystal semiconductor layer can be formed and its surface can be planarized. It is preferable that the single crystal semiconductor layer be partially melted by irradiation with the laser beam 122. When complete melting is performed, crystal growth nuclei are generated at random in the single crystal semiconductor layer 115 which is in a liquid phase, and re-single-crystallization of the single crystal semiconductor layer 115 is performed from these nuclei. Thus, crystallinity of the single crystal semiconductor layer 116 is decreased. When partial melting is performed, generation of nuclei at random is suppressed. Note that the state where the single crystal semiconductor layer 115 is completely melted indicates, in the case of the stacked structure of FIG. 14A, that the portion from the top surface of the single crystal semiconductor layer 115 to the interface with the bonding layer 114 is melted and is in a liquid phase. On the other hand, the state where the single crystal semiconductor layer 115 is partially melted indicates that part of the single crystal semiconductor layer 115 on a side where the laser beam 122 is incident on is melted to be in a liquid phase but another part is not melted and keeps a solid-phase state.

Although chemical mechanical polishing (abbreviation: CMP) is known as a planarization treatment, a glass substrate is easily bent and has a warp. Accordingly, in the case where a glass substrate is used as the supporting substrate 100, it is difficult to perform a planarization treatment on the single crystal semiconductor layer 115 by CMP. In this embodiment mode, this planarization treatment is performed by irradiation process with the laser beam 122; therefore, without applying force that damages the supporting substrate 100 and without heating the supporting substrate 100 at temperature exceeding a strain point, planarization of the single crystal semiconductor layer 115 is enabled. Accordingly, a glass substrate can be used as the supporting substrate 100. In other words, this embodiment mode discloses an innovative usage method of irradiation process with a laser beam in a method for manufacturing a semiconductor substrate.

As a laser that emits the laser beam 122, a laser whose emission wavelength is in the range of the ultraviolet region to the visible light region is selected. The wavelength of the laser beam 122 is a wavelength that is absorbed by the single crystal semiconductor layer 115. The wavelength can be determined in consideration of the skin depth of the laser beam, or the like. For example, the wavelength can be in the range of greater than or equal to 250 nm and less than or equal to 700 nm.

It is found that the atmosphere of irradiation with the laser beam 122 is effective for planarization of the single crystal semiconductor layer 115 either in the atmosphere without any control or in a nitrogen gas atmosphere containing a small amount of oxygen. It is also found that a nitrogen gas atmosphere is preferable to the atmosphere. A nitrogen atmosphere and a vacuum state are more effective than the atmosphere in improving planarity of the single crystal semiconductor layer 116. In addition, these atmospheres are more effective than the atmosphere in suppressing generation of a crack; therefore, the available energy of the laser beam 122 can be selected from a wider range.

To irradiate the separation plane of the single crystal semiconductor layer 115 with the laser beam 122 in a nitrogen gas atmosphere, as illustrated in FIG. 14A, the single crystal semiconductor layer 115 may be irradiated with the laser beam 122 while the nitrogen gas 124 is sprayed on a surface to be irradiated with the laser beam 122. That is, since a region where the nitrogen gas 124 is sprayed in the single crystal semiconductor layer 115 is irradiated with the laser beam 122, irradiation with the laser beam 122 in a nitrogen gas atmosphere can be realized.

It is preferable that the nitrogen gas 124 be heated. The nitrogen gas 124 is heated and the heated nitrogen gas is sprayed, whereby lowering in a surface temperature of the single crystal semiconductor layer 115 can be suppressed. The nitrogen gas 124 is heated at a temperature of greater than or equal to 250° C., whereby lowering in a surface temperature of the single crystal semiconductor layer 115 can be suppressed. It is preferable that a heating temperature of the nitrogen gas 124 be greater than or equal to 250° C. and less than or equal to 670° C. The heating temperature of the nitrogen gas 124 is set at greater than or equal to 250° C., whereby the single crystal semiconductor layer 115 can be heated. As a result, energy shortage in the laser beam 122 can be compensated, and the available energy range of the laser beam 122 can be expanded. The heating temperature is preferably greater than or equal to 450° C. and less than or equal to 625° C.

It is preferable that the laser beam 122 pass through an optical system and energy distribution of the laser beam 122 be uniform. Further, it is preferable that a cross section of the laser beam 122 be linear. Accordingly, irradiation with the laser beam 122 can be performed uniformly with high throughput.

Before the single crystal semiconductor layer 115 is irradiated with the laser beam 122, it is preferable that an oxide film, such as a film of native oxide, which is formed on the surface of the single crystal semiconductor layer 115, be removed. This is because a sufficient planarization effect is not obtained even when the single crystal semiconductor layer 115 is irradiated with the laser beam 122 in a state that an oxide film remains on the surface of the single crystal semiconductor layer 115. The oxide film can be removed by a treatment of the single crystal semiconductor layer 115 with hydrofluoric acid. A treatment with hydrofluoric acid is performed until the surface of the single crystal semiconductor layer 115 becomes water repellent. When the single crystal semiconductor layer 115 has water repellency, it can be found that the oxide film is removed from the single crystal semiconductor layer 115.

The irradiation step with the laser beam 122 of FIG. 14A can be performed as follows. First, the single crystal semiconductor layer 115 is treated with 100-fold diluted hydrofluoric acid for 110 seconds to remove the oxide film on the surface. As a laser which emits the laser beam 122, a XeCl excimer laser (with a wavelength of 308 nm, a pulse width of 25 nanoseconds, and a repetition rate of 60 Hz) is used. Through an optical system, a cross section of the laser beam 122 is formed into a linear shape of 300 mm×0.34 mm. The single crystal semiconductor layer 115 is irradiated with the laser beam 122 where the scanning speed of the laser beam 122 is 2.0 mm/second, the scanning pitch is 33 μm, and the number of beam shots is about 10 shots. In addition, scanning with the laser beam 122 is performed while the nitrogen gas which is heated at 300° C. is sprayed on an irradiation surface of the single crystal semiconductor layer 115.

Before the single crystal semiconductor layer 115 is irradiated with the laser beam 122, the single crystal semiconductor layer 115 can be etched. It is preferable that the damaged region 113 which remains on the separation plane of the single crystal semiconductor layer 115 be removed by this etching. By removing the damaged region 113, a surface planarization effect and a re-single-crystallization effect which are caused by irradiation with the laser beam 122 can be enhanced.

This etching can be performed by using a dry etching method or a wet etching method. Examples of etching gases that can be used in a dry etching method include: chloride gases such as boron chloride, silicon chloride, and carbon tetrachloride; a chlorine gas; fluoride gases such as sulfur fluoride and nitrogen fluoride; an oxygen gas; and the like. An example of an etchant that can be used in a wet etching method is a tetramethylammonium hydroxide (abbreviation: TMAH) solution.

After the single crystal semiconductor layer 115 is irradiated with the laser beam 122, the single crystal semiconductor layer 116 may be thinned by etching. The thickness of the single crystal semiconductor layer 116 can be determined in accordance with characteristics of an element to be formed with the single crystal semiconductor layer 116. In order to form a thin gate insulating layer with excellent step coverage on the surface of the single crystal semiconductor layer 116 which is bonded to the supporting substrate 100, the thickness of the single crystal semiconductor layer 116 is preferably less than or equal to 50 nm and may be greater than or equal to 5 nm and less than or equal to 50 nm.

The etching for thinning the single crystal semiconductor layer 116 can be performed by using a dry etching method or a wet etching method. Examples of etching gases that can be used in a dry etching method include: chloride gases such as boron chloride, silicon chloride, and carbon tetrachloride; a chlorine gas; fluoride gases such as sulfur fluoride and nitrogen fluoride; an oxygen gas; and the like. An example of an etchant that can be used in a wet etching method is a tetramethylammonium hydroxide (abbreviation: TMAH) solution.

Because the steps from FIGS. 13A to 13E and FIGS. 14A and 14B can be performed at a temperature of less than or equal to 700° C., a glass substrate having an allowable temperature limit of less than or equal to 700° C. can be used as the supporting substrate 100. Thus, an inexpensive glass substrate can be used, whereby a material cost of the semiconductor substrate 10 can be reduced.

Figure 15:
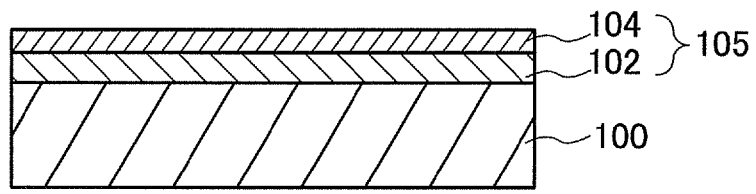
FIG. 15 is a cross-sectional view that illustrates a method for manufacturing a semiconductor substrate.

Note that the supporting substrate 100 can also be provided with a bonding layer. In addition, an insulating layer can be formed to be disposed in contact with the surface of the supporting substrate 100. FIG. 15 is a cross-sectional view of the supporting substrate 100, and an insulating layer 102 is formed in contact with the surface of the supporting substrate 100, and a bonding layer 104 is formed over the insulating layer 102. Needless to say, one of the insulating layer 102 and the bonding layer 114 can be formed over the supporting substrate 100. For example, the insulating layer 102 is formed of an insulating film of a single layer or two or more layers which is/are formed by a PECVD method, in a manner similar to that of the insulating layer 112. The bonding layer 104 can be formed in a manner similar to that of the bonding layer 114. In FIG. 15, a buffer layer 105 has a stacked structure of the insulating layer 102 and the bonding layer 104.

Figure 11:
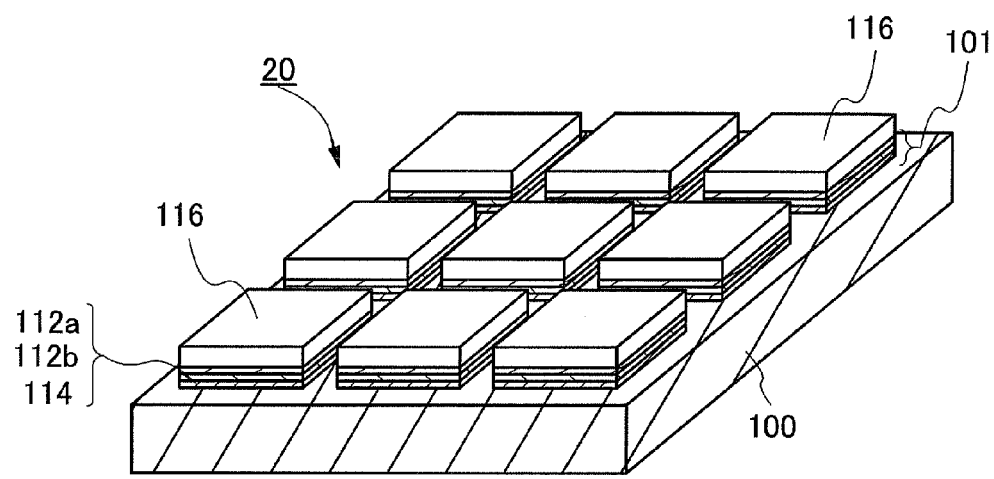
FIG. 11 is an external view that illustrates a structural example of a single crystal semiconductor substrate.

Note that with the use of the method of this embodiment mode, a plurality of single crystal semiconductor layers 116 can also be attached to one piece of the supporting substrate 100. A plurality of single crystal semiconductor substrates 110 each having the structure of FIG. 13C are attached to the supporting substrate 100. Then, through the steps of FIG. 13E to FIGS. 14A and 14B, it is possible to manufacture a semiconductor substrate 20 including the supporting substrate 100 to which the plurality of single crystal semiconductor layers 116 are bonded, as illustrated in FIG. 11.

In order to manufacture the semiconductor substrate 20, it is preferable that a glass substrate of greater than or equal to 300 mm×300 mm be used as the supporting substrate 100. As a large-area glass substrate, a mother glass substrate which is developed for production of liquid crystal panels is preferable. Examples of the size of known mother glass substrates are as follows: the third generation (550 mm×650 mm); the 3.5th generation (600 mm×720 mm); the fourth generation (680 mm×880 mm or 730 mm×920 mm); the fifth generation (1100 mm×1300 mm); the sixth generation (1500 mm×1850 mm); the seventh generation (1870 mm×2200 mm); the eighth generation (2200 mm×2400 mm); and the like. With the use of a large-area substrate like a mother glass substrate as the supporting substrate 100, an SOI substrate having a larger area can be obtained. If an SOI substrate having a larger area can be obtained, a number of chips such as ICs or LSIs can be manufactured with one piece of SOI substrate and a larger number of chips can be manufactured with one piece of substrate. Accordingly, productivity can be drastically improved.

Embodiment Mode 4

As an example of a method for manufacturing a semiconductor device using the semiconductor substrate 10, a method for manufacturing thin film transistors (TFTs) will be described in this embodiment mode with reference to FIGS. 16A to 16D, FIGS. 17A to 17C, and FIG. 18. By combining a plurality of thin film transistors, a variety of semiconductor devices are manufactured. In this embodiment mode, a method for forming an n-channel TFT and a p-channel TFT over the same substrate will be described.

Figure 16A:
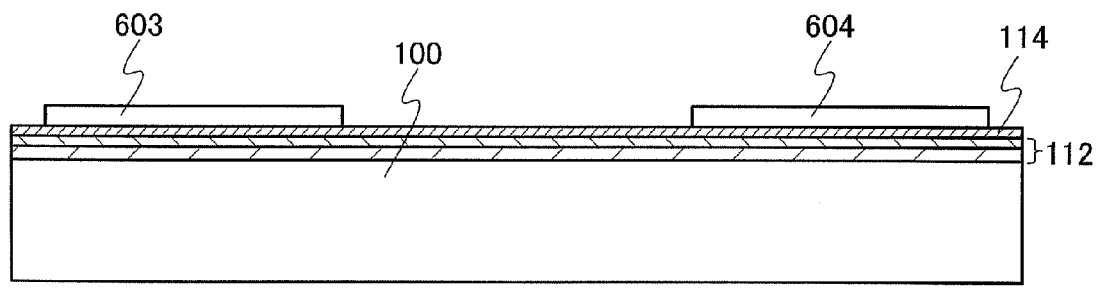
FIGS. 16A to 16D are cross-sectional views describing a method for manufacturing a semiconductor device.

As illustrated in FIG. 16A, the single crystal semiconductor layer 116 over the supporting substrate 100 is processed (patterned) into a desired shape by etching, so that a semiconductor layer 603 and a semiconductor layer 604 are formed. A p-channel transistor is formed using the semiconductor layer 603, and an n-channel transistor is formed using the semiconductor layer 604.

To control threshold voltages, a p-type impurity element such as boron, aluminum, or gallium or an n-type impurity element such as phosphorus or arsenic may be added to the semiconductor layers 603 and 604. For example, in the case of adding boron as an impurity element imparting p-type conductivity, boron may be added at a concentration of greater than or equal to $5\times10^{16}$ atoms/cm$^3$ and less than or equal to $1\times10^{17}$ atoms/cm$^3$. The addition of the impurity element for controlling the threshold voltages may be performed on the single crystal semiconductor layer 116 or on the semiconductor layers 603 and 604. Alternatively, the addition of the impurity element for controlling the threshold voltages may be performed on the single crystal semiconductor substrate 110. Further alternatively, the addition of the impurity element may be performed on the single crystal semiconductor substrate 110 for roughly adjusting the threshold voltages, and then the addition of the impurity element may be further performed on the single crystal semiconductor layer 116 or on the semiconductor layers 603 and 604 for finely adjusting the threshold voltages.

For example, taking as an example the case of using a weak p-type single crystal silicon substrate as the single crystal semiconductor substrate 110, an example of a method for adding such an impurity element is described. First, before the single crystal semiconductor layer 116 is etched, boron is added to the entire single crystal semiconductor layer 116. This addition of boron aims at adjustment of the threshold voltage of a p-channel transistor. Using $B_2H_6$ as a dopant gas, boron is added at a concentration of $1\times10^{16}$ atoms/cm$^3$ to $1\times10^{17}$ atoms/cm$^3$. The concentration of boron is determined in consideration of the activation rate or the like. For example, the concentration of boron can be $6\times10^{16}$ atoms/cm$^3$. Next, the single crystal semiconductor layer 116 is etched and the semiconductor layers 603 and 604 are formed. Then, boron is added to only the semiconductor layer 604. The second addition of boron aims at adjustment of the threshold voltage of an n-channel transistor. Using $B_2H_6$ as a dopant gas, boron is added at a concentration of $1\times10^{16}$ atoms/cm$^3$ to $1\times10^{17}$ atoms/cm$^3$. For example, the concentration of boron can be $6\times10^{16}$ atoms/cm$^3$.

Note that in the case where a substrate having a conductivity type or resistance suitable for the threshold voltage of either of the p-channel transistor or the n-channel transistor can be used as the single crystal semiconductor substrate 110, the required number of steps for adding an impurity element for controlling the threshold voltage can be one, and at that time, an impurity element for controlling the threshold voltage may be added to one of the semiconductor layer 603 or 604.

Figure 16B:
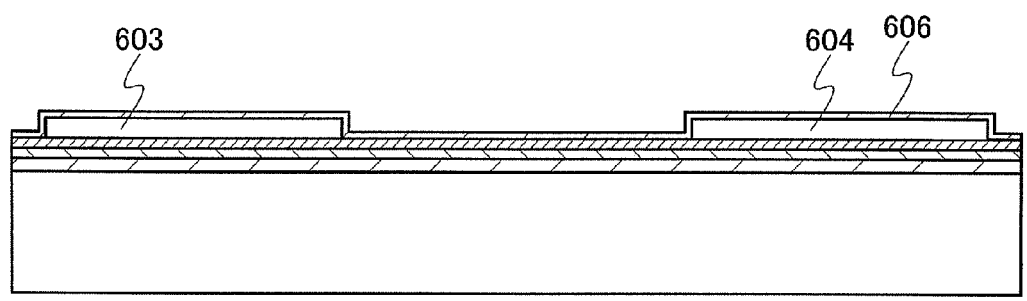

As illustrated in FIG. 16B, a gate insulating film 606 is formed to cover the semiconductor layers 603 and 604. The gate insulating film 606 may be formed with a single layer or a stack of a film including silicon oxide, silicon nitride oxide, silicon nitride, hafnium oxide, aluminum oxide, or tantalum oxide by a PECVD method, a sputtering method, or the like. In this embodiment mode, the gate insulating film 606 can be formed in such a way that a thin film having a thickness of, for example, 20 nm is formed to cover the surfaces of the semiconductor layers 603 and 604 by a PECVD method. In addition, the gate insulating film 606 may be formed by oxidizing or nitriding the surfaces of the semiconductor layers 603 and 604 by a high-density plasma treatment. The high-density plasma treatment is performed using, for example, a mixed gas of a rare gas such as He, Ar, Kr, or Xe and oxygen, nitrogen oxide, ammonia, nitrogen, hydrogen, or the like. In this case, when excitation of the plasma is performed by introduction of a microwave, high density plasma with a low electron temperature can be generated. The surfaces of the semiconductor layers are oxidized or nitrided by oxygen radicals (OH radicals may be included) or nitrogen radicals (NH radicals may be included) which are generated by such high-density plasma, whereby an insulating film is formed to a thickness of 1 nm to 50 nm, preferably 5 nm to 30 nm so as to be in contact with the semiconductor layers. Laser irradiation is performed while heating is being performed, whereby the surface of the single crystal semiconductor layer is sufficiently planarized. Therefore, even when an insulating film having a thickness of 20 nm is used as the gate insulating film 606, sufficient withstand voltage can be obtained.

Alternatively, the gate insulating film 606 may be formed by thermally oxidizing the semiconductor layers 603 and 604.

Further alternatively, after the gate insulating film 606 containing hydrogen is formed, hydrogen contained in the gate insulating film 606 may be diffused into the semiconductor layers 603 and 604 by performing a heat treatment at a temperature of greater than or equal to 350° C. and less than or equal to 450° C. In this case, the gate insulating film 606 can be formed by depositing silicon nitride or silicon nitride oxide at a process temperature of less than or equal to 350° C. by a PECVD method. Hydrogen is supplied to the semiconductor layers 603 and 604, whereby a crystal defect to serve as a charge trapping center can be reduced effectively in the semiconductor layers 603 and 604 and at an interface between the gate insulating film 606 and the semiconductor layers 603 and 604.

Figure 16C:
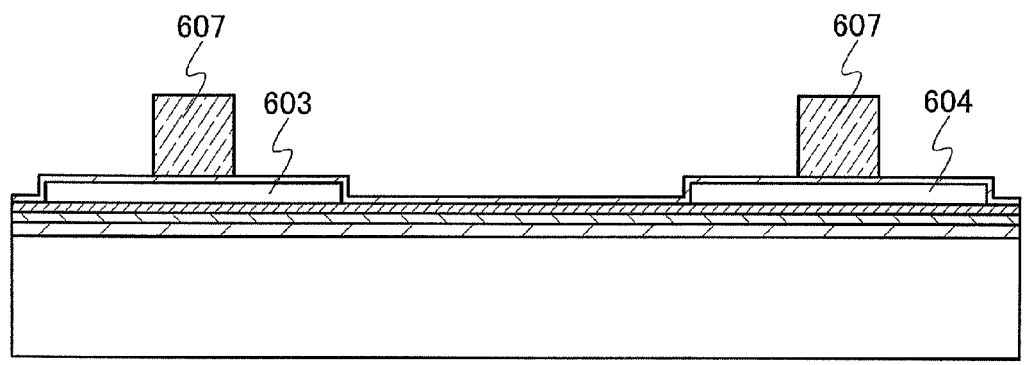

Then, after a conductive film is formed over the gate insulating film 606 as illustrated in FIG. 16C, the conductive film is processed (patterned) into a predetermined shape, thereby forming an electrode 607 over each of the semiconductor layers 603 and 604. The conductive film can be formed by a CVD method, a sputtering method, or the like. For the conductive film, tantalum (Ta), tungsten (W), titanium (Ti), molybdenum (Mo), aluminum (Al), copper (Cu), chromium (Cr), niobium (Nb), or the like may be used. Alternatively, an alloy containing any of the above metals as its main component or a compound containing any of the above metals may be used. Further alternatively, the conductive film may be formed using a semiconductor such as polycrystalline silicon which is formed by doping the semiconductor layers with an impurity element imparting a conductivity type, such as phosphorus.

As a combination of two conductive films, tantalum nitride or tantalum (Ta) can be used for a first layer, and tungsten (W) can be used for a second layer. Besides, the following combinations are given: tungsten nitride and tungsten, molybdenum nitride and molybdenum, aluminum and tantalum, aluminum and titanium, and the like. Since tungsten and tantalum nitride have high heat resistance, a heat treatment aimed at thermal activation can be performed in subsequent steps after forming the two conductive films. Alternatively, as a combination of the two conductive films, for example, silicon doped with an impurity element imparting n-type conductivity and nickel silicide, Si doped with an impurity element imparting n-type conductivity and $WSi_x$, or the like can be used.

In addition, although each of the electrodes 607 is formed of a single layer conductive film in this embodiment mode, this embodiment mode is not limited to this structure. The electrodes 607 may be formed by stacking plural conductive films. In the case of a three-layer structure in which three or more conductive films are stacked, a stacked structure of a molybdenum film, an aluminum film, and a molybdenum film may be employed.

As masks used for forming the electrodes 607, instead of resist, silicon oxide, silicon nitride oxide, or the like may be used. Although, in this case, a step of etching silicon oxide, silicon nitride oxide, or the like is added, the reduction in film thickness of the masks at the time of etching is less than that in the case of using a resist mask. Accordingly, the electrodes 607 each having a desired width can be formed. Alternatively, the electrodes 607 may be formed selectively by a droplet discharge method without using the masks.

Note that a droplet discharge method means a method in which droplets containing a predetermined composition are discharged or ejected from fine pores to form a predetermined pattern, and includes an ink-jet method and the like.

After the conductive film is formed, the electrodes 607 are formed using an inductively coupled plasma (ICP) etching method. The conductive film can be etched into a desired tapered shape by, as appropriate, controlling the etching condition (e.g., the amount of electric power applied to a coiled electrode layer, the amount of electric power applied to an electrode layer on the substrate side, or the electrode temperature on the substrate side). Further, angles and the like of the taper shapes can also be controlled by the shape of the masks. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 16D:
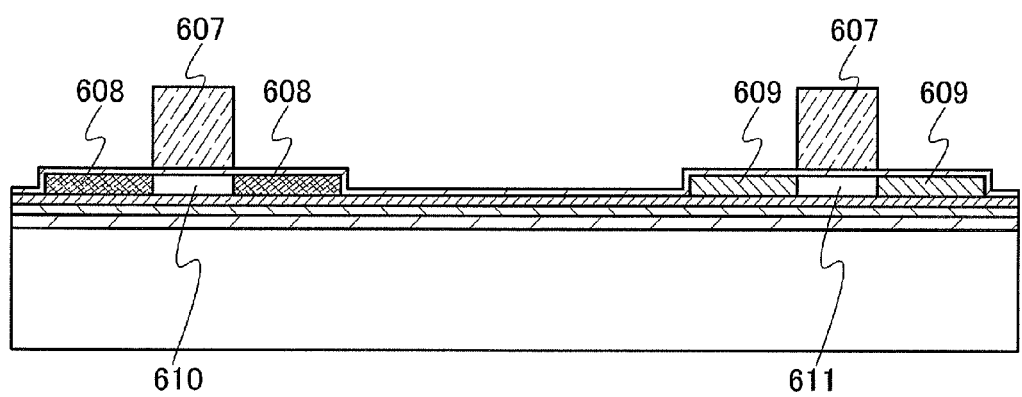

Next, as illustrated in FIG. 16D, an impurity element imparting one conductivity type is added to the semiconductor layers 603 and 604 with the use of the electrodes 607 as masks. In this embodiment mode, an impurity element imparting p-type conductivity (e.g., boron) is added to the semiconductor layer 603, and an impurity element imparting n-type conductivity (e.g., phosphorus or arsenic) is added to the semiconductor layer 604. In this step, impurity regions to be a source region or a drain region are formed in the semiconductor layer 603, and impurity regions serving as high resistant regions are formed in the semiconductor layer 604.

Note that when the impurity element imparting p-type conductivity is added to the semiconductor layer 603, the semiconductor layer 604 is covered with a mask or the like so that the impurity element imparting p-type conductivity is not added to the semiconductor layer 604. On the other hand, when the impurity element imparting n-type conductivity is added to the semiconductor layer 604, the semiconductor layer 603 is covered with a mask or the like so that the impurity element imparting n-type conductivity is not added to the semiconductor layer 603. Alternatively, after an impurity element imparting one of p-type and n-type conductivity is added to the semiconductor layers 603 and 604, an impurity element imparting the other conductivity may be added to one of the semiconductor layers 603 and 604 selectively at higher concentration than the previously added impurity element. By this adding step of an impurity element, p-type high-concentration impurity regions 608 are formed in the semiconductor layer 603, and n-type low-concentration impurity regions 609 are formed in the semiconductor layer 604. The regions overlapping with the electrodes 607 in the semiconductor layers 603 and 604 are a channel formation region 610 and a channel formation region 611.

Figure 17A:
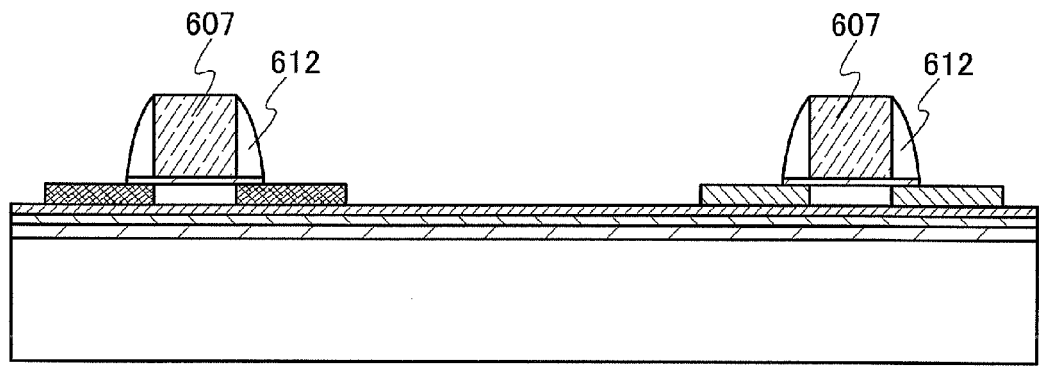
FIGS. 17A to 17C are cross-sectional views describing a method for manufacturing a semiconductor device.

Next, as illustrated in FIG. 17A, sidewalls 612 are formed on side surfaces of the electrodes 607. For example, the sidewalls 612 can be formed in such a manner that an insulating film is newly formed so as to cover the gate insulating film 606 and the electrodes 607, and the newly formed insulating film is partially etched by anisotropic etching in which etching is performed mainly in a perpendicular direction. The newly formed insulating film is partially etched by the above anisotropic etching, whereby the sidewalls 612 are formed on the side surfaces of the electrodes 607. Note that the gate insulating film 606 is also partially etched by this anisotropic etching. The insulating film for forming the sidewalls 612 can be formed as a single layer or a stack of two or more layers of a film including an organic material such as an organic resin or a film of silicon, silicon oxide, or silicon nitride oxide by a PECVD method, a sputtering method, or the like. In this embodiment mode, the insulating film is formed of a silicon oxide film having a thickness of 100 nm by a PECVD method. In addition, as an etching gas of the silicon oxide film, a mixed gas of $CHF_3$ and helium can be used. Note that the steps of forming the sidewalls 612 are not limited to the steps given here.

Figure 17B:
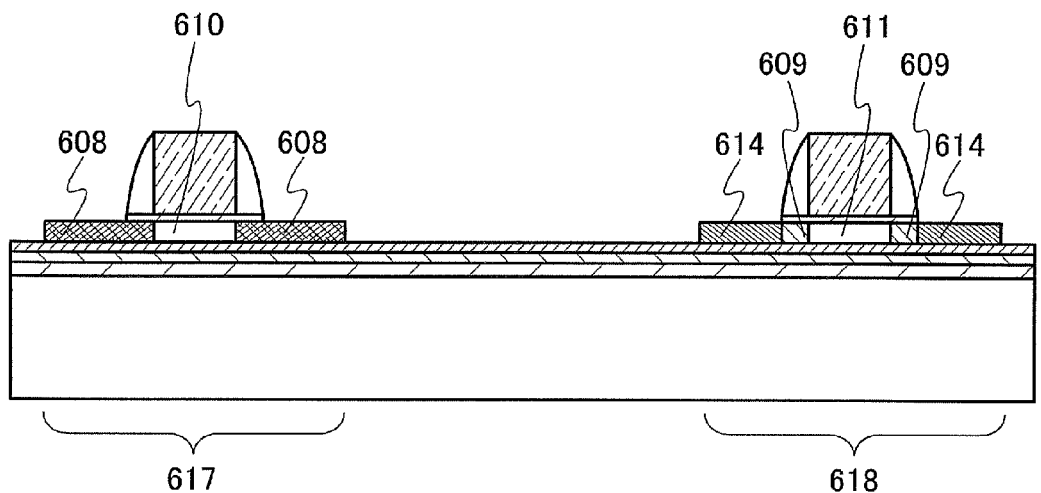

As illustrated in FIG. 17B, an impurity element imparting n-type conductivity is added to the semiconductor layer 604 by using the electrode 607 and the sidewalls 612 as masks. This step is a step for forming impurity regions which function as a source region and a drain region in the semiconductor layer 604. In this step, the impurity element imparting n-type conductivity is added to the semiconductor layer 604 while the semiconductor layer 603 is covered with a mask or the like.

In the above addition of the impurity element, the electrode 607 and the sidewalls 612 serve as masks. Accordingly, a pair of n-type high-concentration impurity regions 614 is formed in the semiconductor layer 604 in a self-alignment manner. Then, the mask covering the semiconductor layer 603 is removed, and a heat treatment is performed to activate the impurity element imparting p-type conductivity added to the semiconductor layer 603 and the impurity element imparting n-type conductivity added to the semiconductor layer 604. Through the sequence of the steps illustrated in FIGS. 16A to 16D and FIGS. 17A and 17B, a p-channel transistor 617 and an n-channel transistor 618 are formed.

In order to reduce the resistance of the source and drain, a silicide layer may be formed by siliciding the high-concentration impurity regions 608 in the semiconductor layer 603 and the high-concentration impurity regions 614 in the semiconductor layer 604. The siliciding is performed by placing a metal in contact with the semiconductor layers 603 and 604 and causing reaction between the metal and silicon in the semiconductor layers through a heat treatment so as to generate a silicide compound. As the metal, cobalt or nickel is preferable, and the following can be used: titanium (Ti), tungsten (W), molybdenum (Mo), zirconium (Zr), hafnium (Hf), tantalum (Ta), vanadium (V), neodymium (Nd), chromium (Cr), platinum (Pt), palladium (Pd), or the like. In the case where the semiconductor layers 603 and 604 are thin, the silicide reaction may proceed to the bottom of the semiconductor layers 603 and 604 in this region. As the heat treatment for siliciding, a resistive heating furnace, an RTA apparatus, a microwave heating apparatus, or a laser irradiation apparatus can be used.

Figure 17C:
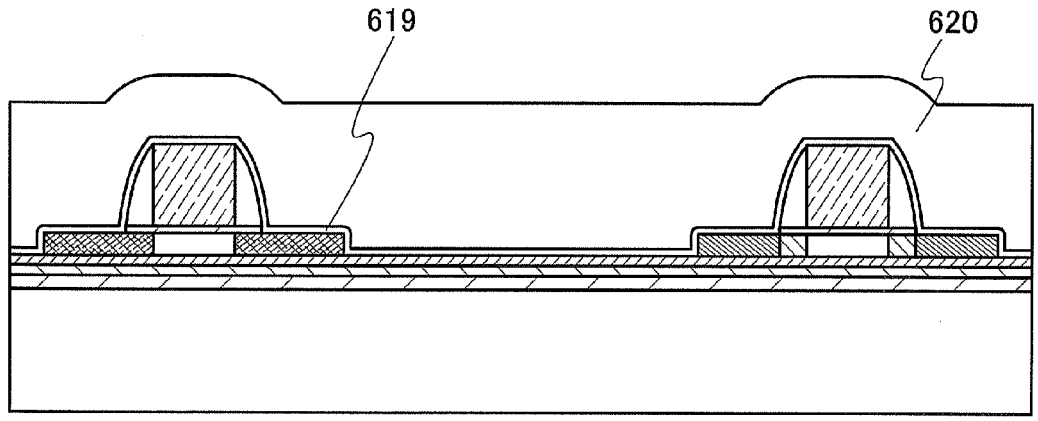

Next, as illustrated in FIG. 17C, an insulating film 619 is formed to cover the transistors 617 and 618. As the insulating film 619, an insulating film containing hydrogen is formed. In this embodiment mode, a silicon nitride oxide film having a thickness of about 600 nm is formed by a PECVD method using monosilane, ammonia, and $N_2O$ as a source gas. The insulating film 619 is made to contain hydrogen to diffuse hydrogen from the insulating film 619 so that dangling bonds in the semiconductor layers 603 and 604 can be terminated. The formation of the insulating film 619 can prevent impurities such as an alkali metal and an alkaline earth metal from entering the transistors 617 and 618. Specifically, silicon nitride, silicon nitride oxide, aluminum nitride, aluminum oxide, silicon oxide, or the like is used for the insulating film 619.

Next, an insulating film 620 is formed over the insulating film 619 so as to cover the transistors 617 and 618. An organic material having heat resistance, such as polyimide, acrylic, benzocyclobutene, polyamide, or epoxy can be used for the insulating film 620. In addition to such organic materials, it is also possible to use a low-dielectric constant material (a low-k material), a siloxane resin, silicon oxide, silicon nitride, silicon nitride oxide, phosphosilicate glass (PSG), borophosphosilicate glass (BPSG), alumina, or the like. A siloxane-based resin may include as a substituent at least one of fluorine, an alkyl group, and an aryl group, as well as hydrogen. Alternatively, the insulating film 620 may be formed by stacking plural insulating films formed of any of these materials.

Note that the siloxane-based resin corresponds to a resin including a Si—O—Si bond formed using a siloxane-based material as a starting material. The siloxane-based resin may include as a substituent at least one of fluorine, an alkyl group, and aromatic hydrocarbon, as well as hydrogen.

For the formation of the insulating film 620, the following method can be used depending on the material of the insulating film 620: a CVD method, a sputtering method, an SOG method, a spin coating method, a dip coating method, a spray coating method, a droplet discharge method (e.g., an ink-jet method, screen printing, offset printing, or the like), a doctor knife, a roll coater, a curtain coater, a knife coater, or the like.

Next, a heat treatment at a temperature of about 400° C. to 450° C. (e.g. 410° C.) is performed in a nitrogen atmosphere for about 1 hour, so that hydrogen is made to diffuse from the insulating film 619 and dangling bonds in the semiconductor layers 603 and 604 are terminated with hydrogen. Since the single crystal semiconductor layer 116 has a much lower defect density than a polycrystalline silicon film which is formed by crystallizing an amorphous silicon film, this termination treatment with hydrogen can be performed in short time.

Figure 18:
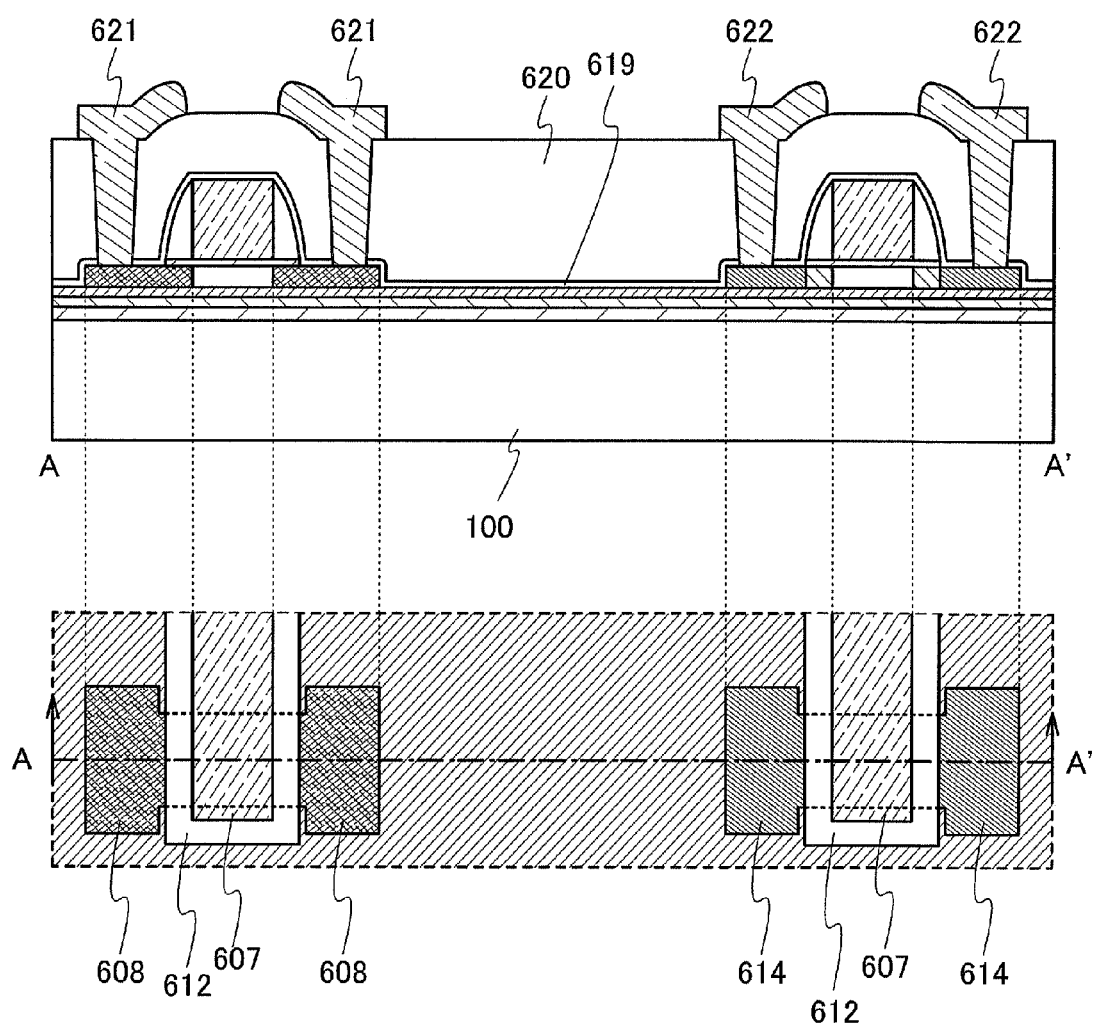
FIG. 18 is a cross-sectional view describing a method for manufacturing a semiconductor device.

Next, as illustrated in FIG. 18, contact holes are formed in the insulating films 619 and 620 so that the semiconductor layers 603 and 604 are partially exposed. The formation of the contact holes can be performed by a dry etching method using a mixed gas of $CHF_3$ and He; however, the present invention is not limited to this. Then, conductive films 621 and conductive films 622 are formed to be in contact with the semiconductor layer 603 and the semiconductor layer 604, respectively, through the contact holes. The conductive films 621 are connected to the high-concentration impurity regions 608 of the p-channel transistor 617. The conductive films 622 are connected to the high-concentration impurity regions 614 of the p-channel transistor 618.

The conductive films 621 and the conductive films 622 can be formed by a CVD method, a sputtering method, or the like. Specifically, the following can be used for the conductive films 621 and the conductive films 622: aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like. Alternatively, an alloy containing the above metal as its main component or a compound containing the above metal may be used. The conductive films 621 and the conductive films 622 can be formed of a single layer or a plurality of layers using a film formed of the above metal.

As an example of an alloy containing aluminum as its main component, an alloy containing aluminum as its main component and also containing nickel is given. Further, an alloy which contains aluminum as its main component and contains nickel and one of or both carbon and silicon can also be given. Since aluminum and aluminum silicon have low resistance and are inexpensive, aluminum and aluminum silicon are suitable as materials for forming the conductive films 621 and the conductive films 622. In particular, when the shape of an aluminum silicon (Al—Si) film is processed by etching, generation of hillocks in resist baking for forming an etching mask can be prevented more than in the case where an aluminum film is used. Instead of silicon (Si), Cu may be mixed into an aluminum film at about 0.5%.

For example, a stacked structure including a barrier film, an aluminum silicon (Al—Si) film, and a barrier film or a stacked structure including a barrier film, an aluminum silicon (Al—Si) film, a titanium nitride film, and a barrier film may be used as the conductive films 621 and the conductive films 622. Note that the barrier film refers to a film formed using titanium, a nitride of titanium, molybdenum, or a nitride of molybdenum. When barrier films are formed to sandwich an aluminum silicon (Al—Si) film therebetween, generation of hillocks of aluminum or aluminum silicon can be further prevented. Moreover, when the barrier film is formed using titanium that is a highly reducible element, even if a thin oxide film is formed over the semiconductor layers 603 and 604, the oxide film is reduced by the titanium contained in the barrier film, whereby preferable contact between the conductive films 621 and 622 and the semiconductor layers 603 and 604 can be obtained. Further, a plurality of barrier films may be stacked to be used. In that case, for example, a five-layer structure in which titanium, titanium nitride, aluminum silicon, titanium, and titanium nitride are stacked from the lowest layer can be used as the conductive films 621 and the conductive films 622.

For the conductive films 621 and the conductive films 622, tungsten silicide formed by a chemical vapor deposition method using a $WF_6$ gas and a $SiH_4$ gas may be used. Alternatively, tungsten formed by hydrogen reduction of $WF_6$ may be used for the conductive films 621 and the conductive films 622.

In FIG. 18, a top view of the p-channel transistor 617 and the n-channel transistor 618, and a cross-sectional view taken along line A-A' of the top view are illustrated. Note that the conductive films 621, the conductive films 622, and the insulating films 619 and 620 are omitted in the top view of FIG. 18.

Although the case where each of the p-channel transistor 617 and the n-channel transistor 618 has one electrode 607 which functions as a gate is described in this embodiment mode, the present invention is not limited to this structure. A transistor having a multi-gate structure in which a plurality of electrodes which function as a gate are included and are electrically connected to one another can also be used as the transistors to be manufactured.

Note that since a semiconductor layer included in the semiconductor substrate of this embodiment mode is a sliced layer of a single crystal semiconductor substrate, its orientation does not vary. Therefore, variation in electric characteristics such as threshold voltage and mobility of a plurality of transistors which are manufactured using a semiconductor substrate can be made small. Further, since there are almost no crystal grain boundaries, a leakage current due to a crystal grain boundary can be suppressed, and power saving of a semiconductor device can be realized. Accordingly, a highly reliable semiconductor device can be manufactured.

In the case of manufacturing a transistor from a polycrystalline semiconductor layer obtained by laser crystallization, it has been necessary to decide a layout of the semiconductor layer of the transistor taking into consideration a scanning direction of a laser beam, in order to obtain high mobility. However, there is no such need for the substrate with a semiconductor layer of this embodiment mode; therefore, there is a little restriction in designing a semiconductor device.

Embodiment Mode 5

Although the method for manufacturing a TFT is described as an example of a method for manufacturing a semiconductor device in Embodiment Mode 4, a semiconductor device can be manufactured so as to have high added value by forming a variety of semiconductor elements such as a capacitor and a resistor together with the TFT over a substrate provided with a semiconductor layer. In this embodiment mode, specific modes of semiconductor devices will be described with reference to the drawings.

Figure 19:
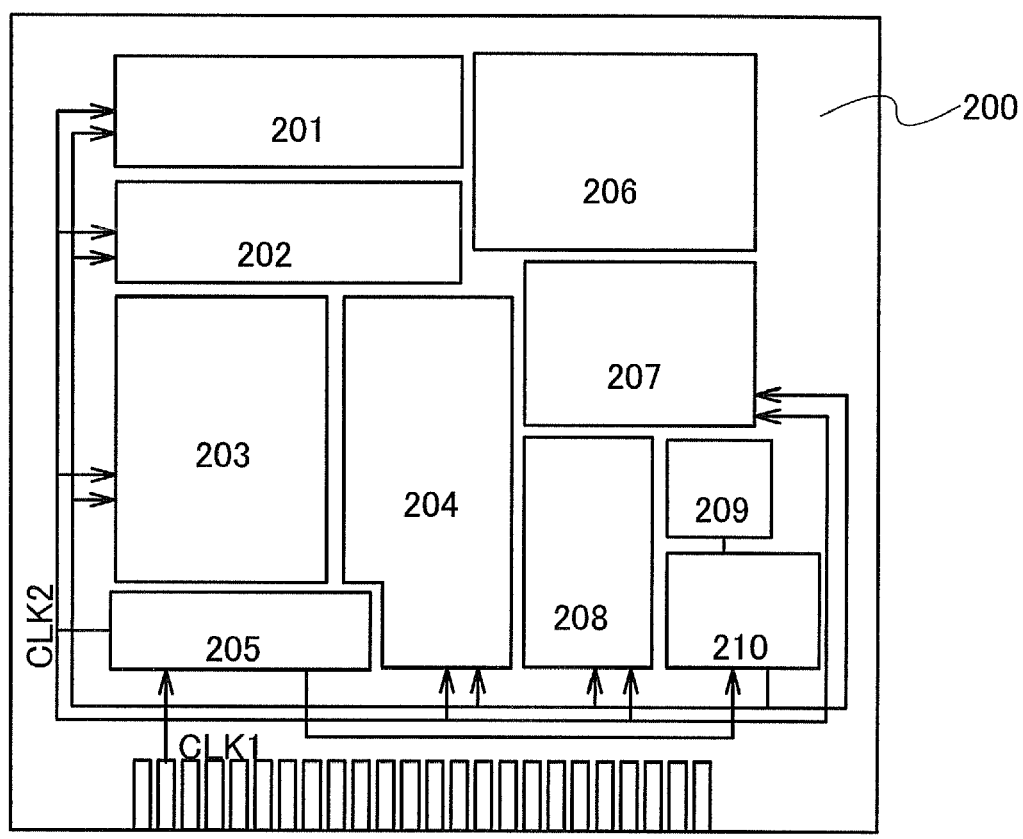
FIG. 19 is a block diagram that illustrates a structural example of a microprocessor.

First, as an example of a semiconductor device, a microprocessor will be described. FIG. 19 is a block diagram that illustrates a structural example of a microprocessor 200.

The microprocessor 200 includes an arithmetic logic unit (ALU) 201, an ALU controller 202, an instruction decoder 203, an interrupt controller 204, a timing controller 205, a register 206, a register controller 207, a bus interface (bus I/F) 208, a read only memory (ROM) 209, and a memory interface (ROM interface) 210.

An instruction inputted to the microprocessor 200 via the bus interface 208 is inputted to the instruction decoder 203 and decoded, and then inputted to the ALU controller 202, the interrupt controller 204, the register controller 207, and the timing controller 205. The ALU controller 202, the interrupt controller 204, the register controller 207, and the timing controller 205 perform various controls based on the decoded instruction.

The ALU controller 202 generates a signal for controlling an operation of the ALU 201. The interrupt controller 204 is a circuit that processes an interruption request from an external input/output device or a peripheral circuit during program execution of the microprocessor 200, and the interrupt controller 204 determines priority of the interruption request or a mask state and processes the interruption request. The register controller 207 generates an address of the register 206 and performs reading and writing from/to the register 206 depending on a state of the microprocessor 200. The timing controller 205 generates signals for controlling timing of an operation of the ALU 201, the ALU controller 202, the instruction decoder 203, the interrupt controller 204, and the register controller 207. For example, the timing controller 205 is provided with an internal clock generator that generates an internal clock signal CLK2 based on a reference clock signal CLK1. As illustrated in FIG. 19, the internal clock signal CLK2 is inputted to another circuit.

Figure 20:
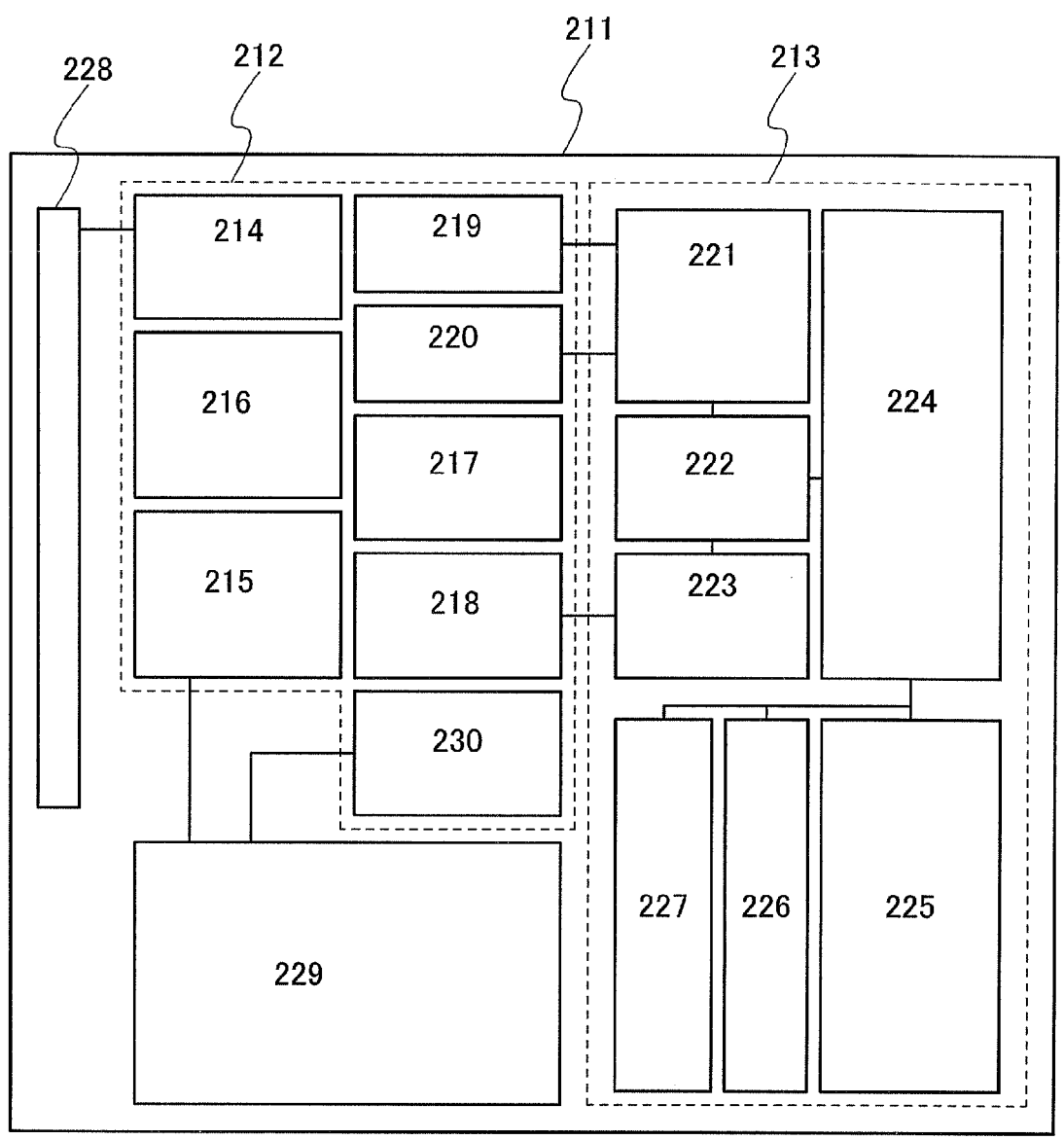
FIG. 20 is a block diagram that illustrates a structural example of a semiconductor device.

Next, an example of a semiconductor device provided with a function for performing transmission/reception of data without contact and an arithmetic function are described. FIG. 20 is a block diagram that illustrates a structural example of such a semiconductor device. A semiconductor device 211 illustrated in FIG. 20 functions as an arithmetic processing unit that operates by transmitting/receiving a signal to/from an external device through wireless communication.

As illustrated in FIG. 20, the semiconductor device 211 includes an analog circuit portion 212 and a digital circuit portion 213. The analog circuit portion 212 includes a resonance circuit 214 having a resonant capacitor, a rectification circuit 215, a constant voltage circuit 216, a reset circuit 217, an oscillation circuit 218, a demodulation circuit 219, a modulation circuit 220, and a power supply management circuit 230. Further, the digital circuit portion 213 includes an RF interface 221, a control register 222, a clock controller 223, a CPU interface 224, a central processing unit (CPU) 225, a random access memory (RAM) 226, and a read only memory (ROM) 227.

A summary of the operation of the semiconductor device 211 is as follows. An induced electromotive force is generated in the resonance circuit 214 using a signal received by an antenna 228. The induced electromotive force passes through the rectification circuit 215 and is stored in a capacitor 229. This capacitor 229 is preferably a capacitor such as a ceramic capacitor or an electric double layer capacitor. The capacitor 229 does not always have to be integrated with a substrate included in the semiconductor device 211, and can also be incorporated in the semiconductor device 211 as a separate component.

The reset circuit 217 generates a signal that resets and initializes the digital circuit portion 213. For example, a signal that rises with delay after increase in power supply voltage is generated as a reset signal. The oscillation circuit 218 changes the frequency and duty ratio of a clock signal depending on a control signal generated in the constant voltage circuit 216. The demodulation circuit 219 is a circuit that demodulates a reception signal, and the modulation circuit 220 is a circuit that modulates data to be transmitted.

For example, the demodulation circuit 219 is formed using a low-pass filter and binarizes an amplitude-modulated (ASK) received signal based on variation of amplitude. Since the modulation circuit 220 transmits transmission data by varying the amplitude of an amplitude-modulated (ASK) transmission signal, the modulation circuit 220 changes the amplitude of a communication signal by changing a resonance point of the resonance circuit 214.

The clock controller 223 generates a control signal for changing the frequency and duty ratio of a clock signal depending on power supply voltage or current consumption in the CPU 225. Monitoring of the power supply voltage is performed in the power supply management circuit 230.

A signal inputted to the semiconductor device 211 from the antenna 228 is demodulated in the demodulation circuit 219, and then separated into a control command, data, and the like in the RF interface 221. The control command is stored in the control register 222. In the control command, instructions for reading data that is stored in the ROM 227, writing data in the RAM 226, performing an arithmetic calculation in the CPU 225, and the like are included.

The CPU 225 accesses the ROM 227, the RAM 226, and the control register 222 via the interface 224. The interface 224 has a function of generating an access signal corresponding to any of the ROM 227, the RAM 226, and the control register 222, based on an address requested by the CPU 225.

As an arithmetic method of the CPU 225, a method may be employed in which an operating system (OS) is stored in the ROM 227 and a program is read and executed at the time of starting operation. Alternatively, a method may be employed in which a dedicated circuit is provided as an arithmetic circuit and an arithmetic process is performed using hardware. In a method of using both hardware and software, part of an arithmetic process is performed in a dedicated arithmetic circuit, and then the rest of the arithmetic process is performed using a program in the CPU 225.

Next, a display device is described as a structural example of a semiconductor device, with reference to FIGS. 21A and 21B, and FIGS. 22A and 22B.

Figure 21A:
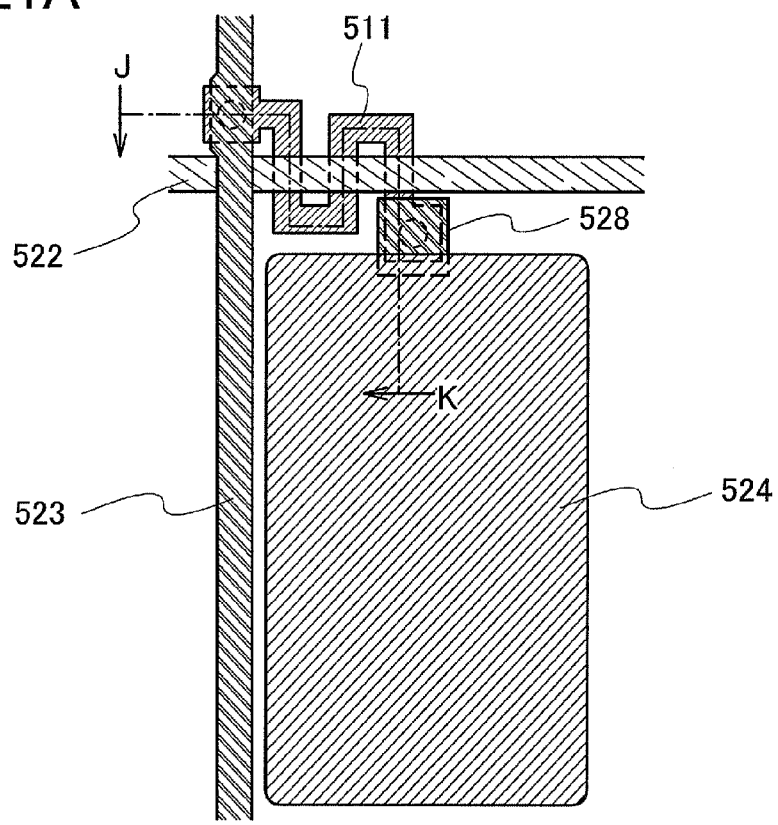
FIG. 21A is a plan view of a pixel of a liquid crystal display device.
Figure 21B:
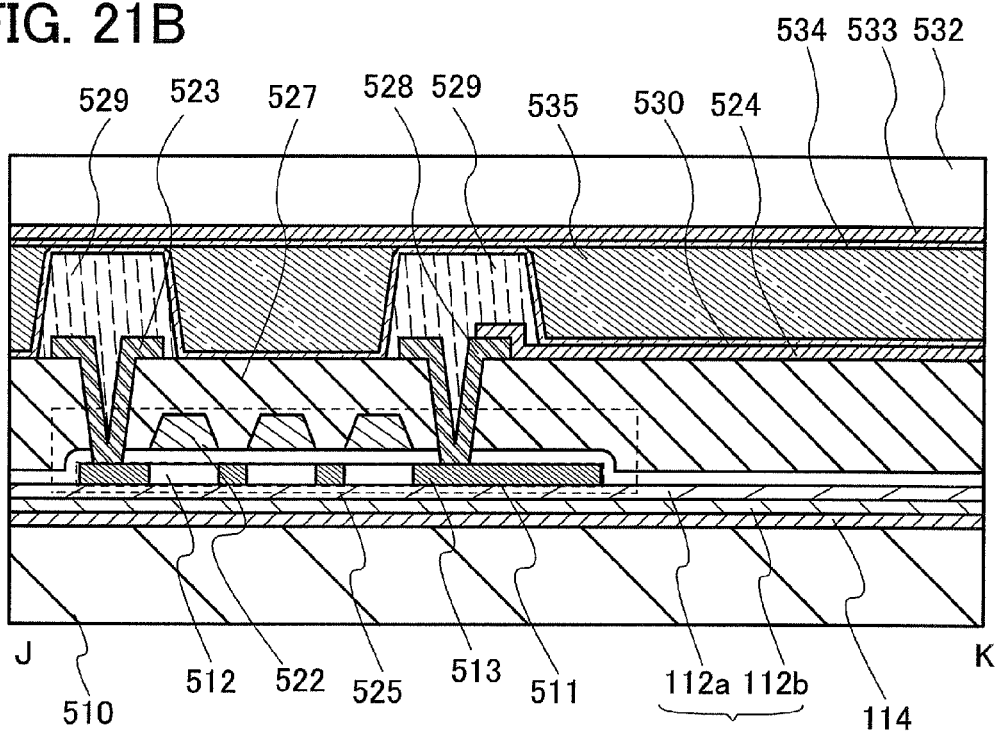
FIG. 21B is a cross-sectional view taken along section line J-K of FIG. 21A.

FIGS. 21A and 21B are views that illustrate a structural example of a liquid crystal display device. FIG. 21A is a plan view of a pixel of the liquid crystal display device, and FIG. 21B is a cross-sectional view taken along section line J-K of FIG. 21A. In FIG. 21A, a semiconductor layer 511 is a layer formed from the single crystal semiconductor layer 116, and forms a TFT 525 of the pixel. The pixel includes the semiconductor layer 511; a scan line 522 that crosses the semiconductor layer 511; a signal line 523 that crosses the scan line 522; a pixel electrode 524; and an electrode 528 that is electrically connected to the pixel electrode 524 and the semiconductor layer 511.

As illustrated in FIG. 21B, the bonding layer 114, the insulating layer 112 including the insulating films 112b and 112a, and the semiconductor layer 511 are stacked over a substrate 510. The substrate 510 is the separated supporting substrate 100. The semiconductor layer 511 is a layer formed by etching the single crystal semiconductor layer 116. In the semiconductor layer 511, a channel formation region 512 and an n-type impurity region 513 are formed. A gate electrode of the TFT 525 is included in the scan line 522, and one of a source electrode and a drain electrode is included in the signal line 523.

Over an interlayer insulating film 527, the signal line 523, the pixel electrode 524, and the electrode 528 are provided.

Over the interlayer insulating film 527, a columnar spacer 529 is formed, and an orientation film 330 is formed so as to cover the signal line 523, the pixel electrode 524, the electrode 528, and the columnar spacer 529. On a counter substrate 532, a counter electrode 533 and an orientation film 534 which covers the counter electrode 533 are formed. The columnar spacer 529 is formed to maintain a space between the substrate 510 and the counter substrate 532. In the space formed by the columnar spacer 529, a liquid crystal layer 535 is formed. At connection portions of the signal line 523 and the electrode 528 with the impurity region 513, because there are steps formed in the interlayer insulating film 527 due to formation of contact holes, orientation of liquid crystals in the liquid crystal layer 535 in these connection portions becomes disordered easily. Accordingly, the columnar spacer 529 is formed at these step portions to prevent orientation disorder of a liquid crystal.

Figure 22A:
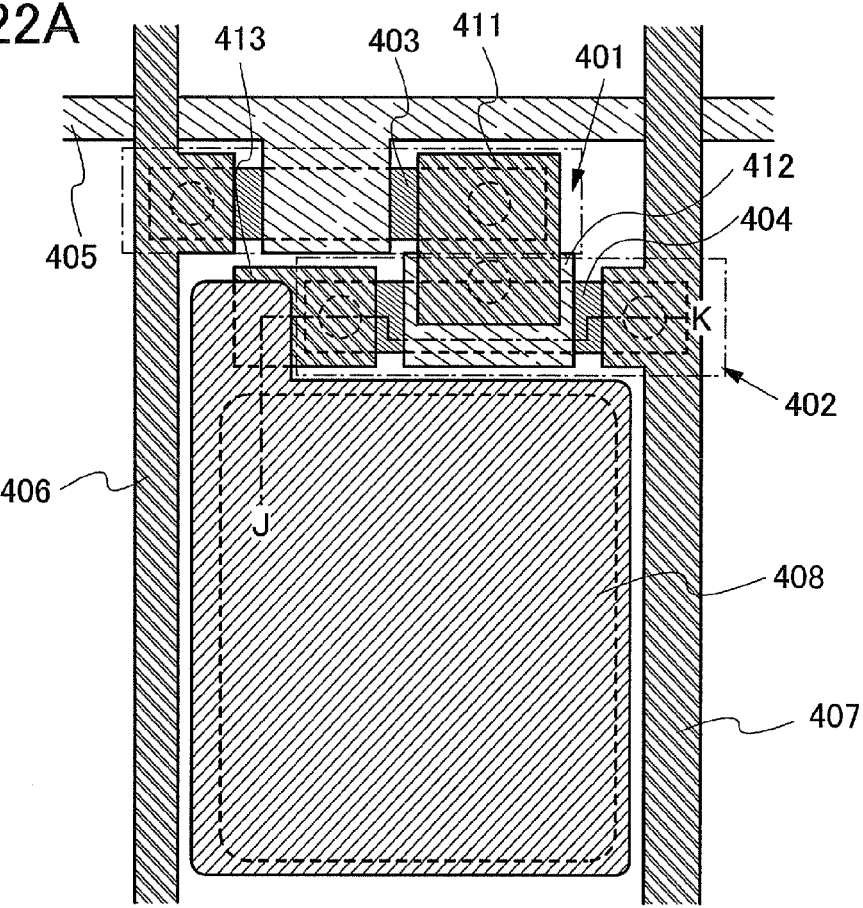
FIG. 22A is a plan view of a pixel of an electroluminescent display device.
Figure 22B:
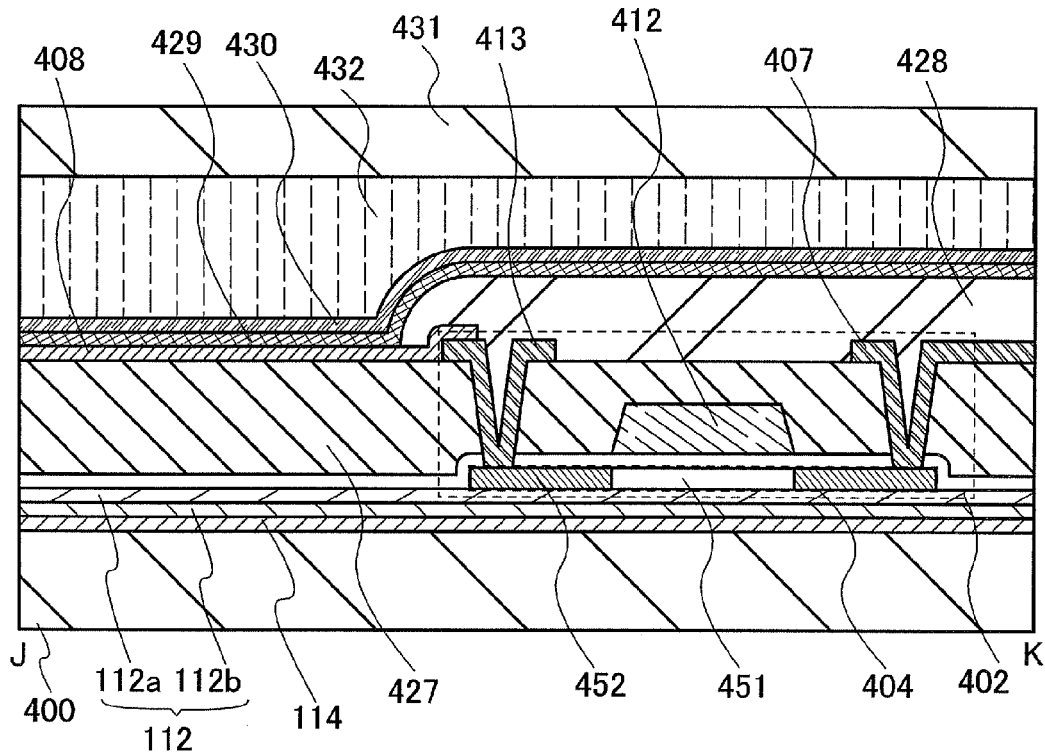
FIG. 22B is a cross-sectional view taken along section line J-K of FIG. 22A.

Next, an electroluminescent display device (hereinafter referred to as an "EL display device") is described. FIGS. 22A and 22B are views for describing an EL display device manufactured according to the method in Embodiment Mode 2. FIG. 22A is a plan view of a pixel of the EL display device, and FIG. 22B is a cross-sectional view of the pixel taken along section line J-K of FIG. 22A. As illustrated in FIG. 22A, the pixel includes a selection transistor 401 formed of a TFT, a display control transistor 402, a scan line 405, a signal line 406, a current supply line 407, and a pixel electrode 408. Each pixel is provided with a light-emitting element with a structure in which a layer formed to contain an electroluminescent material (EL layer) is interposed between a pair of electrodes. One of the electrodes of the light-emitting element is the pixel electrode 408.

The selection transistor 401 includes a semiconductor layer 403 that is formed of the single crystal semiconductor layer 116. In the selection transistor 401, a gate electrode is included in the scan line 405, one of a source electrode and a drain electrode is included in the signal line 406, and the other of the source electrode and the drain electrode is formed as an electrode 411. In the display control transistor 402, a gate electrode 412 is electrically connected to the electrode 411, and one of a source electrode and a drain electrode is formed as an electrode 413 that is electrically connected to the pixel electrode 408, and the other of the source electrode and the drain electrode is included in the current supply line 407.

The display control transistor 402 is a p-channel TFT and includes a semiconductor layer 404 that is formed of the single crystal semiconductor layer 116. As illustrated in FIG. 22B, in the semiconductor layer 404, a channel formation region 451 and a p-type impurity region 452 are formed. An interlayer insulating film 427 is formed so as to cover the gate electrode 412 of the display control transistor 402. Over the interlayer insulating film 427, the signal line 406, the current supply line 407, the electrodes 411 and 413, and the like are formed. In addition, over the interlayer insulating film 427, the pixel electrode 408 that is electrically connected to the electrode 413 is formed. A peripheral portion of the pixel electrode 408 is surrounded by an insulating partition layer 428. An EL layer 429 is formed over the pixel electrode 408, and a counter electrode 430 is formed over the EL layer 429. A counter substrate 431 is provided as a reinforcing plate, and the counter substrate 431 is fixed to a substrate 400 with a resin layer 432. The substrate 400 is the separated supporting substrate 100.

Accordingly, a wide variety of electronic devices can be manufactured using the semiconductor substrate 10. The electronic devices include cameras such as a video camera and a digital camera; a navigation system; an audio reproducing device (a car audio system, an audio component, and the like); a computer; a game machine; a mobile information terminal (a mobile computer, a cellular phone, a mobile game machine, an electronic book reader, and the like); a display device that displays image data such as an image reproduction device provided with a recording medium (specifically, a digital versatile disc (DVD)); and the like.

Figure 23A:
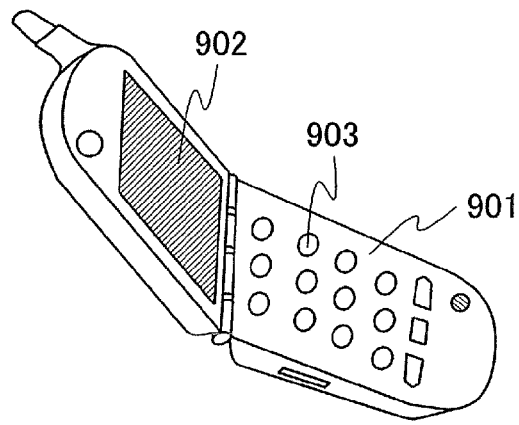
FIG. 23A is an external view of a cellular phone.
Figure 23B:
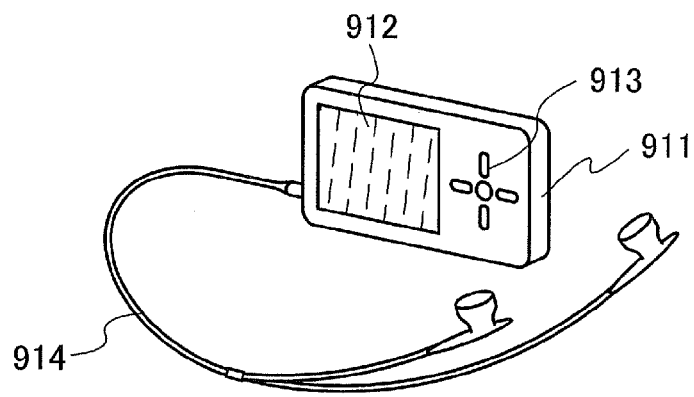
FIG. 23B is an external view of a digital player.
Figure 23C:
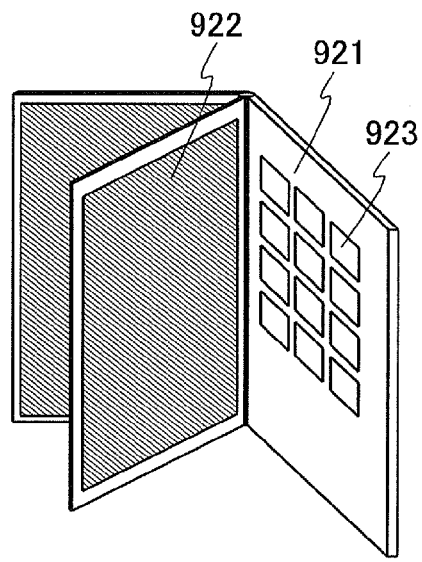
FIG. 23C is an external view of an electronic book.

With reference to FIGS. 23A to 23C, specific modes of the electronic device are described. FIG. 23A is an external view that illustrates an example of a cellular phone 901. This cellular phone 901 has a structure in which a display portion 902, operation switches 903, and the like are included. By applying the liquid crystal display device described in FIGS. 21A and 21B or the EL display device described in FIGS. 22A and 22B to the display portion 902, the display portion 902 can have excellent image quality with little display unevenness.

FIG. 23B is an external view that illustrates a structural example of a digital player 911. The digital player 911 includes a display portion 912, an operation portion 913, an earpiece 914, and the like. Alternatively, headphones or a wireless earpiece can be used instead of the earpiece 914. By applying the liquid crystal display device described in FIGS. 21A and 21B or the EL display device described in FIGS. 22A and 22B to the display portion 912, even in the case where the screen size is about 0.3 inches to 2 inches, an image with high precision and a large amount of text information can be displayed.

FIG. 23C is an external view of an electronic book reader 921. This electronic book reader 921 includes a display portion 922 and operation switches 923. A modem may be incorporated into the electronic book reader 921, or the semiconductor device 211 in FIG. 20 may be incorporated so that the electronic book reader 921 has a structure by which information can be transmitted/received wirelessly. By applying the liquid crystal display device described in FIGS. 21A and 21B or the EL display device described in FIGS. 22A and 22B to the display portion 922, a display with high image quality can be performed.

Figure 24A:
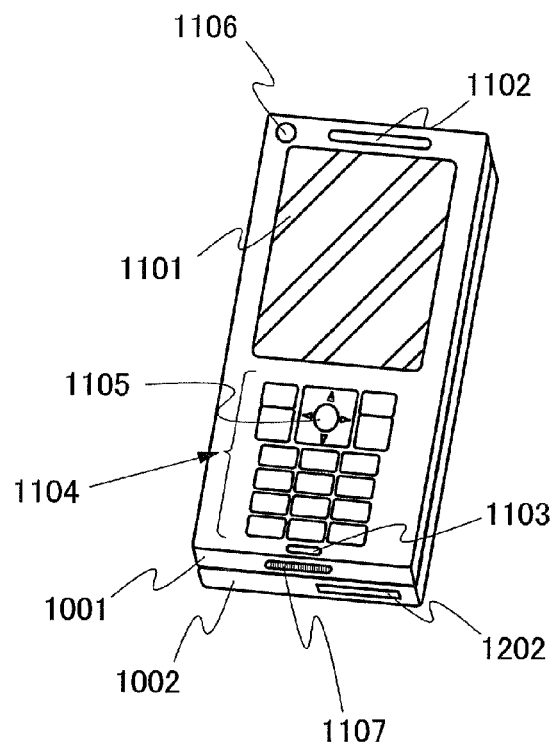
FIGS. 24A to 24C are external views that each illustrate a cellular phone.
Figure 24B:
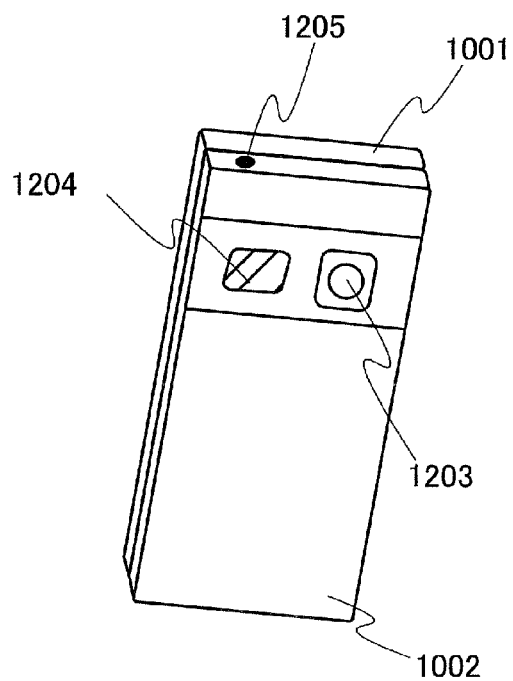
Figure 24C:
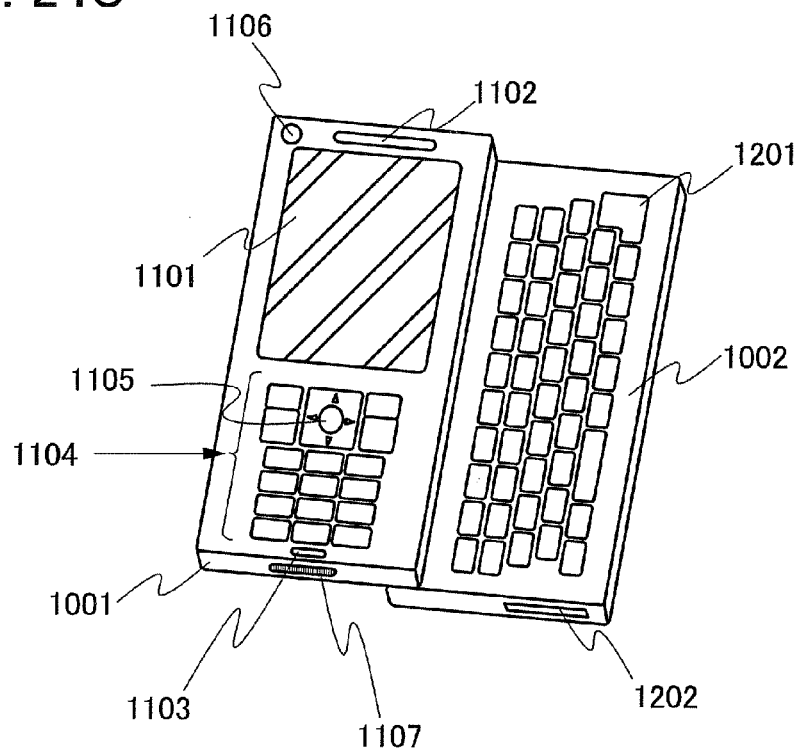

FIGS. 24A to 24C illustrate an example of a phone which is different from the cellular phone illustrated in FIG. 23A. FIGS. 24A to 24C illustrate an example of a structure of a smartphone to which the present invention is applied. FIG. 24A is a front view, FIG. 24B is a rear view, and FIG. 24C is a development view. The smartphone has two housings 1001 and 1002. The smartphone has both a function of a cellular phone and a function of a portable information terminal, and incorporates a computer provided to be able to conduct a variety of data processing in addition to verbal communication.

The cellular phone has the two housings 1001 and 1002. The housing 1001 includes a display portion 1101, a speaker 1102, a microphone 1103, operation keys 1104, a pointing device 1105, a front camera lens 1106, an external connection terminal 1107, and the like, while the housing 1002 includes a keyboard 1201, an external memory slot 1202, a rear camera lens 1203, a light 1204, an earphone terminal 1205, and the like. In addition, an antenna is incorporated in the housing 1001.

Further, in addition to the above structure, the smartphone may incorporate a non-contact IC chip, a small size memory device, or the like.

The housings 1001 and 1002 (FIG. 24A) which are put together to be lapped with each other are developed by sliding as illustrated in FIG. 24C. In the display portion 1101, the display device described in the above embodiment mode can be incorporated, and display direction can be changed as appropriate depending on a use mode. Because the front camera lens 1106 is provided in the same plane as the display portion 1101, the cellular phone can be used as a videophone. A still image and a moving image can be taken by the rear camera lens 1203 and the light 1204 by using the display portion 1101 as a view finder. The speaker 1102 and the microphone 1103 can be used for uses of videophone, recording, playback, and the like without being limited to verbal communication. With use of the operation keys 1104, operation of incoming and outgoing calls, simple information input of electronic mails or the like, scrolling of a screen, cursor motion and the like are possible. If much information is needed to be treated, such as documentation, use as a portable information terminal, and the like, the use of the keyboard 1201 is convenient. Further, when the housings 1001 and 1002 (FIG. 24A) which are put together to be lapped with each other are developed by sliding as illustrated in FIG. 24C and used as a portable information terminal, smooth operation can be conducted by using the keyboard 1201 or the pointing device 1105. The external connection terminal 1107 can be connected to an AC adapter and various types of cables such as a USB cable, and charging and data communication with a personal computer are possible. Moreover, a large amount of data can be stored by inserting a storage medium into the external memory slot 1202 and can be moved. In the rear surface of the housing 1002 (FIG. 24B), the rear camera lens 1203 and the light 1204 are provided, and a still image and a moving image can be taken by using the display portion 1101 as a finder.

Further, the cellular phone may include an infrared communication function, an USB port, a function of a television receiver, or the like, in addition to the above function.

Embodiment Mode 6

Figure 25A:
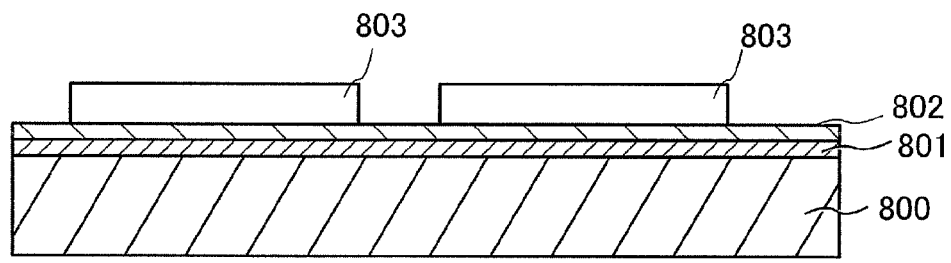
FIGS. 25A and 25B are cross-sectional views that each illustrate an example of a single crystal semiconductor layer which is bonded over a glass substrate.

In this embodiment mode, an example is shown in FIG. 25A, in which after a plurality of silicon substrates are fixed using a non-alkali glass substrate (product name: AN100), a plurality of single crystal silicon layers are formed.

First, a barrier layer 801 which is one layer of a buffer layer is formed over a non-alkali glass substrate 800 by a PECVD method. Note that the non-alkali glass substrate (product name: AN100) is a non-alkali glass substrate having physical properties of a specific gravity of 2.51 g/cm$^3$, a Poisson's ratio of 0.22, a Young's modulus of 77 GPa, a two-axes elastic coefficient of 98.7 GPa, and a coefficient of thermal expansion of $38 \times 10^{-7}$/° C.

The barrier layer 801 is a film that prevents impurities (typically, sodium) which decrease reliability of a semiconductor device, such as an alkali metal or an alkaline-earth metal, from entering the single crystal semiconductor layer from a supporting substrate side at the time of manufacturing a semiconductor substrate and at the time of manufacturing the semiconductor device using this semiconductor substrate. The barrier layer is formed so that the semiconductor device can be prevented from being contaminated by impurities, whereby the reliability can be improved. As the barrier layer 801, a silicon nitride film, a silicon nitride oxide film, an aluminum nitride film, or an aluminum nitride oxide film each having a thickness of greater than or equal to 5 nm and less than or equal to 200 nm is used.

Next, a bonding layer 802 formed of a 50 nm thick silicon oxide film is formed over the barrier layer 801 by a PECVD method. The bonding layer 802 is a layer that forms one layer of the buffer layer. As a process gas of the silicon oxide film, TEOS and $O_2$ are used.

A circular single crystal silicon wafer is prepared; the single crystal silicon wafer is doped with hydrogen ions by using an ion doping apparatus; a 100% hydrogen gas is used as a source gas to form a damaged region; and ionized hydrogen is accelerated by an electric field so as to be added to the single crystal silicon wafer substrate without mass separation, whereby the damaged region is formed. In addition, the depth where the damaged region is formed is adjusted so that the thickness of the single crystal silicon layer separated from the single crystal silicon wafer is 120 nm.

Next, after the surface of the single crystal silicon wafer is subjected to ultrasonic cleaning in pure water, the surface of the single crystal silicon wafer is cleaned by ozone-containing pure water. When cleaning is performed by ozone-containing pure water, a thin oxide film is formed on the surface of the single crystal silicon wafer.

Then, after the bonding layer 802 over the non-alkali glass substrate 800 and the single crystal silicon wafer are disposed in contact with each other and bonded together, the single crystal silicon wafer is separated in the damaged region, and the non-alkali glass substrate 800 to which a single crystal silicon layer 803 is bonded is formed.

In the same procedure, a second circular single crystal silicon wafer is prepared, after the bonding layer 802 over the non-alkali glass substrate 800 and the second single crystal silicon wafer are disposed in contact with each other and bonded together, the single crystal silicon wafer is separated in the damaged region, and the non-alkali glass substrate 800 to which the single crystal silicon layer 803 is bonded is formed.

Next, with the use of the apparatus illustrated in FIG. 2, a heated nitrogen gas is sprayed, part of the single crystal silicon layer 803 fixed to the supporting substrate with the buffer layer interposed therebetween is irradiated with a laser beam, and the single crystal silicon layer 803 is melted to perform re-single-crystallization. Here, the heated nitrogen gas is sprayed and the single crystal silicon layer is heated up to about 600° C. that is a temperature of less than or equal to a strain point of the non-alkali glass substrate (product name: AN100). The heated nitrogen gas is sprayed and heating is performed at a temperature of greater than or equal to 400° C., preferably greater than or equal to 450° C., whereby the supporting substrate can be shrunk. Accordingly, in the case where a transistor is formed later using a glass substrate to which the single crystal semiconductor layer is fixed, shrinkage is made in the manufacturing process of the single crystal semiconductor substrate in advance, so that shrinkage in the manufacturing process of a transistor can be suppressed. Therefore, mask misalignment in a light-exposure step can be suppressed.

FIG. 25A corresponds to a cross-sectional view which shows a state that this stage is completed. In the following steps, the semiconductor device may be formed in accordance with the manufacturing process of a semiconductor device of the above embodiment mode.

As compared to Embodiment Mode 5 in which three layers of the bonding layer 114 and the insulating films 112a and 112b are formed between the single crystal semiconductor layer and the supporting substrate, in this embodiment mode, the layers formed between the single crystal semiconductor layer and the supporting substrate are two layers of the barrier layer 801 and the bonding layer 802; therefore, the number of steps can also be reduced. In addition, because re-single-crystallization is performed, the surface of the single crystal silicon layer 803 can be made to have sufficient planarity even if two layers are used.

Although the example in which two circular single crystal silicon wafers are used is described in this embodiment mode, it goes without saying that two or more single crystal silicon wafers which are made not to overlap with each other can be used with respect to one glass substrate.

Further, this embodiment mode can be freely combined with any of Embodiment Modes 1 to 4.

Embodiment Mode 7

Figure 25B:
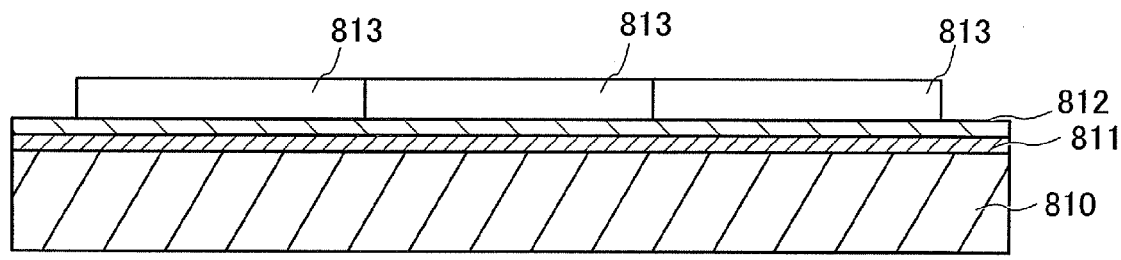

In this embodiment mode, an example is shown with reference to FIG. 25B, in which after a plurality of silicon substrates are fixed using a non-alkali glass substrate (product name: EAGLE2000®), a distance between single crystal semiconductor layers is shortened.

First, a barrier layer 811 is formed over a non-alkali glass substrate 810 by a PECVD method. Note that the non-alkali glass substrate (product name: EAGLE2000®) is a non-alkali glass substrate having physical properties of a specific gravity of 2.37 g/cm$^3$, a Poisson's ratio of 0.23, a Young's modulus of 70.9 GPa, a two-axes elastic coefficient of 92.07 GPa, and a coefficient of thermal expansion of 31.8×10$^{-7}$/° C.

The barrier layer 811 is a film that prevents impurities (typically, sodium) which decrease reliability of a semiconductor device, such as an alkali metal or an alkaline-earth metal, from entering the single crystal semiconductor layer from a supporting substrate side at the time of manufacturing a semiconductor substrate and at the time of manufacturing the semiconductor device using this semiconductor substrate. The barrier layer is formed so that the semiconductor device can be prevented from being contaminated by impurities, whereby the reliability of the semiconductor device can be improved. As the barrier layer 811, a silicon nitride film, a silicon nitride oxide film, an aluminum nitride film, or an aluminum nitride oxide film each having a thickness of greater than or equal to 5 nm and less than or equal to 200 nm is used.

Next, a bonding layer 812 formed of a 50 nm thick silicon oxide film is formed over the barrier layer 811 by a PECVD method. The bonding layer 812 is a layer that forms one layer of the buffer layer. As a process gas of the silicon oxide film, TEOS and O$_2$ are used.

A rectangular single crystal silicon wafer is prepared; the single crystal silicon wafer is doped with hydrogen ions by using an ion doping apparatus; a 100% hydrogen gas is used for a source gas which forms a damaged region; and ionized hydrogen is accelerated by an electric field so as to be added to the single crystal silicon wafer substrate without mass separation, whereby the damaged region is formed. In addition, the depth where the damaged region is formed is adjusted so that the thickness of the single crystal silicon layer separated from the single crystal silicon wafer is 120 nm.

Next, after the surface of the rectangular single crystal silicon wafer is subjected to ultrasonic cleaning in pure water, the surface of the rectangular single crystal silicon wafer is cleaned by ozone-containing pure water. When cleaning is performed by ozone-containing pure water, a thin oxide film is formed on the surface of the single crystal silicon wafer.

Then, after the bonding layer 812 over the non-alkali glass substrate 810 and the single crystal silicon wafer are disposed in contact with each other and bonded together, the single crystal silicon wafer is separated in the damaged region, and the non-alkali glass substrate 810 to which a single crystal silicon layer 813 is bonded is formed.

In the same procedure, a second rectangular single crystal silicon wafer is prepared, and the bonding layer 812 over the non-alkali glass substrate 810 and the second single crystal silicon wafer are disposed in contact with each other and bonded together. At the time of bonding, a gap between adjacent single crystal semiconductor layers is made small. Then, the single crystal silicon wafer is separated in the damaged region, and the non-alkali glass substrate 810 to which the single crystal silicon layer 813 is bonded is formed.

Then, a third rectangular single crystal silicon wafer is prepared, and a similar process is performed.

With the use of the rectangular single crystal silicon wafers, a gap between adjacent rectangular single crystal semiconductor layers is made small, whereby the rectangular single crystal semiconductor layers can be fixed to a rectangular glass substrate. The gap between the single crystal semiconductor layers is made small and the single crystal semiconductor layers are fixed to the glass substrate; with the use of the apparatus illustrated in FIG. 2, a heated nitrogen gas is sprayed, part of the single crystal semiconductor layer 813 fixed to the supporting substrate with the buffer layer interposed therebetween is irradiated with a laser beam, and the single crystal semiconductor layer 813 is melted to perform re-single-crystallization.

Here, at the time of irradiation with a linear laser beam, a heated nitrogen gas is sprayed, and the single crystal silicon layer is heated up to about 500° C. that is a temperature of less than or equal to a strain point of the non-alkali glass substrate (product name: EAGLE2000®). The heated nitrogen gas is sprayed and heating is performed at a temperature of greater than or equal to 400° C., preferably greater than or equal to 450° C., whereby the supporting substrate can be shrunk. Accordingly, in the case where a transistor is formed later using a glass substrate to which the single crystal semiconductor layer is fixed, shrinkage is made in the manufacturing process of a single crystal semiconductor substrate in advance, so that shrinkage in the manufacturing process of a transistor can be suppressed. Therefore, mask misalignment in a light-exposure step can be suppressed.

FIG. 25B corresponds to a cross-sectional view which shows a state that this stage is completed. In the following steps, the semiconductor device may be formed in accordance with the manufacturing process of a semiconductor device of the above embodiment mode.

In the case where a gap between adjacent single crystal semiconductor layers is made small and thus irradiation with a linear laser beam is performed, if the length of the laser beam is much longer than one side of the rectangular silicon wafer as in this embodiment mode, process can be finished by scanning three single crystal silicon layers 813 with a laser beam twice, depending on a length in a longitudinal direction of the laser beam. The direction where the substrate is moved is a direction perpendicular to a longitudinal direction of the linear laser beam.

Although the example in which three single crystal silicon wafers are used is described in this embodiment mode, it goes without saying that four or more single crystal silicon wafers which are made not to overlap with each other can be used with respect to one glass substrate.

Embodiment Mode 8

As an example of a method for manufacturing a semiconductor device using the semiconductor substrate 10, a method for manufacturing transistors will be described in this embodiment mode with reference to FIGS. 26A to 26E. By combining a plurality of thin film transistors, a variety of types of semiconductor devices are manufactured. In this embodiment mode, an n-channel thin film transistor and a p-channel transistor can be manufactured over the same substrate.

Figure 26A:
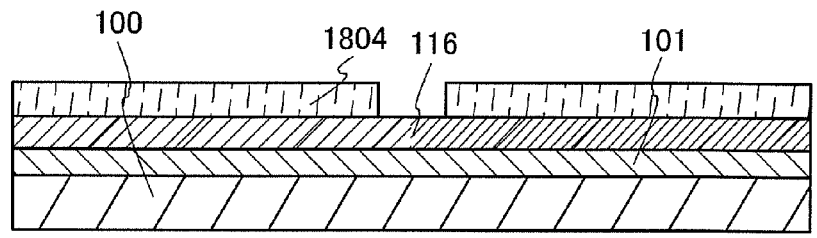
FIGS. 26A to 26E are cross-sectional views that illustrate a manufacturing process of a semiconductor device.
Figure 26B:
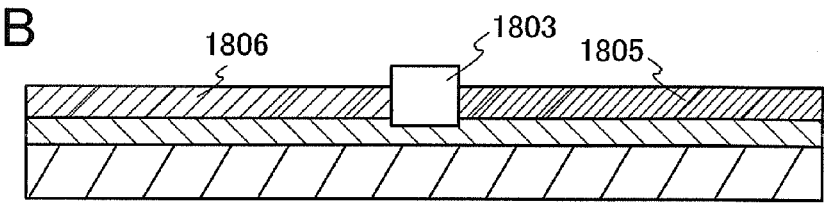
Figure 26C:
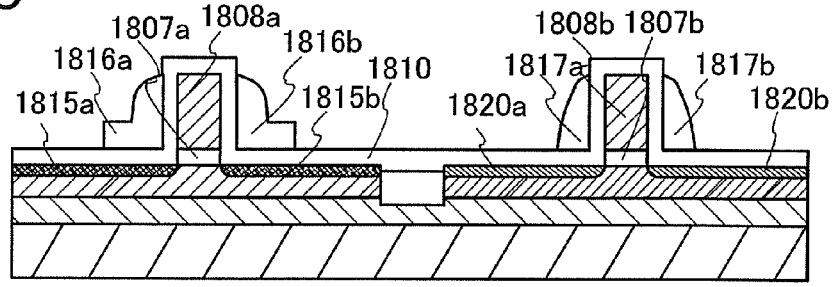
Figure 26D:
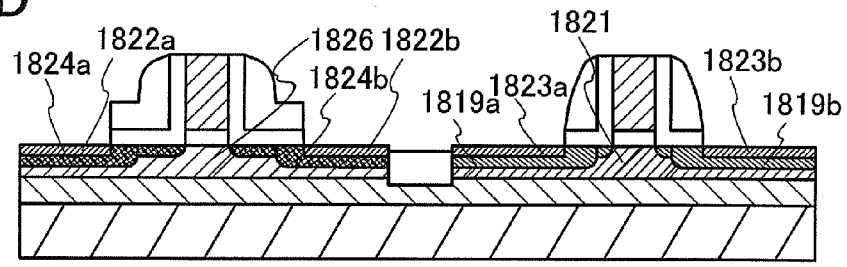

As illustrated in FIG. 26A, a semiconductor substrate in which the buffer layer 101 and the single crystal semiconductor layer 116 are formed over the supporting substrate 100 is prepared. The buffer layer 101 has a three-layer structure and includes the insulating film 112b serving as a barrier layer. In addition, although an example in which the semiconductor substrate 10 having the structure illustrated in FIG. 10 is applied is shown in this embodiment mode, a semiconductor substrate having another structure shown in this specification can also be applied to the present invention.

The single crystal semiconductor layer 116 has an impurity region (a channel-doped region) to which a p-type impurity element such as boron, aluminum, or gallium or an n-type impurity element such as phosphorus or arsenic is added in accordance with a formation region of an n-channel field-effect transistor or a p-channel field-effect transistor.

Etching is performed using a protective layer 1804 as a mask, and the exposed single crystal semiconductor layer 116 and the buffer layer 101 thereunder are partially removed. Then, a silicon oxide film is deposited using organosilane by a PECVD method. The silicon oxide film is formed thick enough to embed the single crystal semiconductor layer 116 thereunder. Next, after the silicon oxide film which is formed over the single crystal semiconductor layer 116 so as to overlap is removed by polishing, the protective layer 1804 is removed such that an insulating layer 1803 for element separation is left. By the insulating layer 1803 for element separation, the single crystal semiconductor layer 116 is divided into an element region 1805 and an element region 1806 (see FIG. 26B).

Then, a first insulating film is formed, a gate electrode layer 1808a and a gate electrode layer 1808b are formed over the first insulating film, the first insulating film is etched using the gate electrode layers 1808a and 1808b as masks to form a gate insulating layer 1807a and a gate insulating layer 1807b.

The gate insulating layers 1807a and 1807b may be formed with a silicon oxide film or a stacked structure of a silicon oxide film and a silicon nitride film. A silicon oxynitride film, a silicon nitride oxide film, or the like can also be used as the gate insulating layers. The gate insulating layers 1807a and 1807b may be formed by depositing an insulating film by a plasma CVD method or a low-pressure CVD method or may be formed by solid phase oxidation or solid phase nitridation by a plasma treatment. This is because a gate insulating layer which is formed using a semiconductor layer that is oxidized or nitrided by a plasma treatment is dense, has high withstand voltage, and is excellent in reliability. For example, dinitrogen monoxide ($N_2O$) is diluted with Ar at a flow rate of 1 to 3, and 3 kW to 5 kW of microwave (2.45 GHz) power is applied at a pressure of 10 Pa to 30 Pa to oxidize or nitride the surface of the single crystal semiconductor layer 116 (the element regions 1805 and 1806). By this treatment, an insulating film having a thickness of 1 nm to 10 nm (preferably 2 nm to 6 nm) is formed. Further, dinitrogen monoxide ($N_2O$) and silane ($SiH_4$) are introduced and 3 kW to 5 kW of microwave (2.45 GHz) power is applied at a pressure of 10 Pa to 30 Pa to form a silicon oxynitride film as a gate insulating layer by a PECVD method. By combining solid-phase reaction and vapor deposition, a gate insulating layer having low interface state density and excellent withstand voltage can be formed.

As the gate insulating layers 1807a and 1807b, a high-dielectric constant material such as zirconium dioxide, hafnium oxide, titanium dioxide, tantalum pentoxide, or the like may be used. By using a high-dielectric constant material for the gate insulating layers 1807a and 1807b, gate leakage current can be reduced.

The gate electrode layers 1808a and 1808b can be formed by a sputtering method, an evaporation method, a CVD method, or the like. The gate electrode layers 1808a and 1808b may be formed using an element such as tantalum (Ta), tungsten (W), titanium (Ti), molybdenum (Mo), aluminum (Al), copper (Cu), chromium (Cr), or neodymium (Nd); or an alloy material or a compound material containing any of the above elements as its main component. Moreover, a semiconductor film typified by a polycrystalline silicon film which is doped with an impurity element such as phosphorus or an AgPdCu alloy may be used as the gate electrode layers 1808a and 1808b.

Next, a second insulating layer 1810 is formed to cover the gate electrode layers 1808a and 1808b, and a sidewall insulating layer 1816a, a sidewall insulating layer 1816b, a sidewall insulating layer 1817a, and a sidewall insulating layer 1817b each having a sidewall structure are formed. The width of the sidewall insulating layers 1816a and 1816b in a region to serve as a p-channel field effect transistor (pFET) is larger than that of the sidewall insulating layers 1817a and 1817b in a region to serve as an n-channel field effect transistor (nFET). Arsenic (As) or the like is added to the region to serve as the n-channel field effect transistor to form a first impurity region 1820a and a first impurity region 1820b each having a shallow junction depth, while boron (B) or the like is added to the region to serve as the p-channel field effect transistor to form a second impurity region 1815a and a second impurity region 1815b each having a shallow junction depth (see FIG. 26C).

Then, the second insulating layer 1810 is partially etched to expose the top surface of the gate electrode layers 1808a and 1808b, the first impurity regions 1820a and 1820b, and the second impurity regions 1815a and 1815b. Then, As or the like is added to the region to serve as the n-channel field effect transistor to form a third impurity region 1819a and a third impurity region 1819b each having a deep junction depth, while B or the like is added to the region to serve as the p-channel field effect transistor to form a fourth impurity region 1824a and a fourth impurity region 1824b each having a deep junction depth. Then, a heat treatment for activation is performed. A cobalt film is formed as a metal film to form a silicide. Then, a heat treatment such as RTA is performed (at 500° C. for 1 minute), and silicon in contact with the cobalt film is silicided to form a silicide 1822a, a silicide 1822b, a silicide 1823a, and a silicide 1823b. After that, the cobalt film is selectively removed. Then, a heat treatment is performed at a temperature higher than the heat treatment for siliciding to reduce resistance of the silicides (see FIG. 26D). A channel formation region 1826 is formed in the element region 1806, and a channel formation region 1821 is formed in the element region 1805.

Next, an interlayer insulating layer 1827 is formed, and contact holes (openings) reaching the third impurity regions 1819a and 1819b each having a deep junction depth and the fourth impurity regions 1824a and 1824b each having a deep junction depth are formed in the interlayer insulating layer 1827, using a resist mask. Etching may be performed once or a plurality of times depending on selectivity of a material to be used.

A method and a condition of the etching may be set as appropriate depending on the materials of the interlayer insulating layer 1827 to be formed with contact holes. Wet etching, dry etching, or both of them can be used as appropriate. In this embodiment mode, dry etching is used. Note that an etching gas can be selected as appropriate from among a chlorine-based gas typified by $Cl_2$, $BCl_3$, $SiCl_4$, or $CCl_4$; a fluorine-based gas typified by $CF_4$, $SF_6$, or $NF_3$; or $O_2$. Further, a rare gas may be added to an etching gas to be used. As a rare gas to be added, one or a plurality of elements selected from He, Ne, Ar, Kr, or Xe can be used. A hydrofluoric acid-based solution such as a mixed solution of ammonium hydrogen fluoride and ammonium fluoride may be used as an etchant of wet etching.

Next, a conductive film is formed so as to cover the contact holes, and the conductive film is etched to form wiring layers each functioning as a source electrode layer or a drain electrode layer that is electrically connected to part of the source region or the drain region. The wiring layers can be formed by forming a conductive film by a PVD method, a CVD method, an evaporation method, or the like and then etching the conductive film into a desired shape. In addition, a conductive layer can be selectively formed in a predetermined position by a droplet discharge method, a printing method, an electrolytic plating method, or the like. A reflow method or a damascene method may also be used. As a material for the wiring layers, metal such as Ag, Au, Cu, Ni, Pt, Pd, Ir, Rh, W, Al, Ta, Mo, Cd, Zn, Fe, Ti, Zr, or Ba; Si or Ge; or an alloy or nitride thereof is used. Further, a stacked structure thereof may also be used.

In this embodiment mode, a wiring layer 1840*a*, a wiring layer 1840*b*, a wiring layer 1840*c*, and a wiring layer 1840*d* are formed as embedded wiring layers to fill contact holes formed in the interlayer insulating layer 1827. The wiring layers 1840*a*, 1840*b*, 1840*c*, and 1840*d*, which are the embedded wiring layers, are formed by forming a conductive film having an enough thickness to fill the contact holes and leaving the conductive film only in contact hole portions and removing an unnecessary part of the conductive film.

An insulating layer 1828, and a wiring layer 1841*a*, a wiring layer 1841*b*, and a wiring layer 1841*c* as lead wiring layers are formed over the wiring layers 1840*a*, 1840*b*, 1840*c*, and 1840*d* which are embedded and the interlayer insulating layer 1827.

Figure 26E:
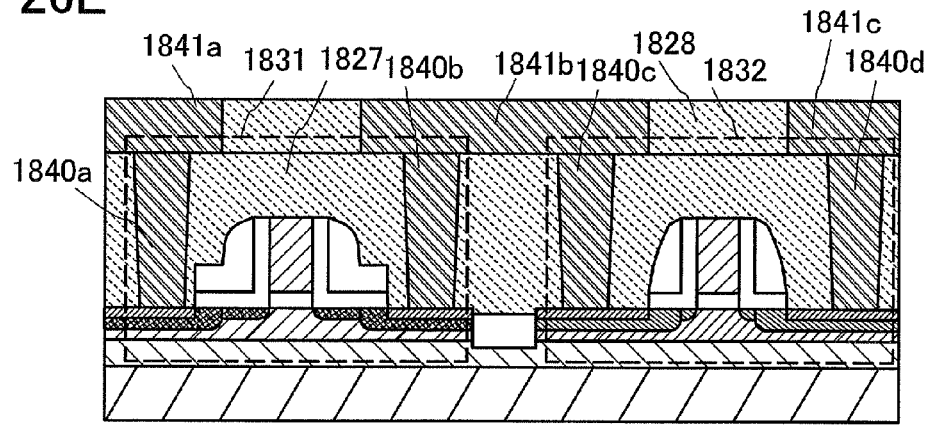

Through the above steps, an n-channel field-effect transistor 1832 can be formed using the element region 1805 of the single crystal semiconductor layer 116 bonded to the supporting substrate 100 and a p-channel field-effect transistor 1831 can be formed using the element region 1806 of the single crystal semiconductor layer 116 bonded to the supporting substrate 100 (see FIG. 26E). Note that in this embodiment mode, the n-channel field-effect transistor 1832 and the p-channel field-effect transistor 1831 are electrically connected by the wiring layer 1841*b*.

In this manner, a CMOS structure is formed by a complementary combining the n-channel field-effect transistor 1832 and the p-channel field-effect transistor 1831.

A semiconductor device such as a microprocessor can be manufactured by further stacking a wiring, an element, and the like over the CMOS structure. A microprocessor includes an arithmetic logic unit (also referred to as ALU), an ALU controller, an instruction decoder, an interrupt controller, a timing controller, a register, a register controller, a bus interface (Bus I/F), a read only memory (ROM), and a memory interface (ROM I/F).

A microprocessor has an integrated circuit having a CMOS structure, and thus not only increase in processing speed but also reduction in power consumption can be achieved.

The structure of the thin film transistor is not limited to that described in this embodiment mode, and may have a single gate structure in which one channel formation region is formed, a double gate structure in which two channel formation regions are formed, or a triple gate structure in which three channel formation regions are formed.

This embodiment mode can be freely combined with any one of Embodiment Modes 1 to 7.

Embodiment Mode 9

In this embodiment mode, an example of a semiconductor device using the semiconductor substrate according to the present invention and an example of a manufacturing method thereof will be described. As an example of a semiconductor device using the semiconductor substrate according to the present invention, a transistor will be described in this embodiment mode. By combining a plurality of transistors, various semiconductor devices are formed. A method for manufacturing a transistor will be described with reference to cross-sectional views of FIGS. 27A to 27E, FIGS. 28A to 28C, and FIGS. 29A and 29B. Note that in this embodiment mode, an n-channel transistor and a p-channel transistor can be manufactured over the same substrate.

Figure 27A:
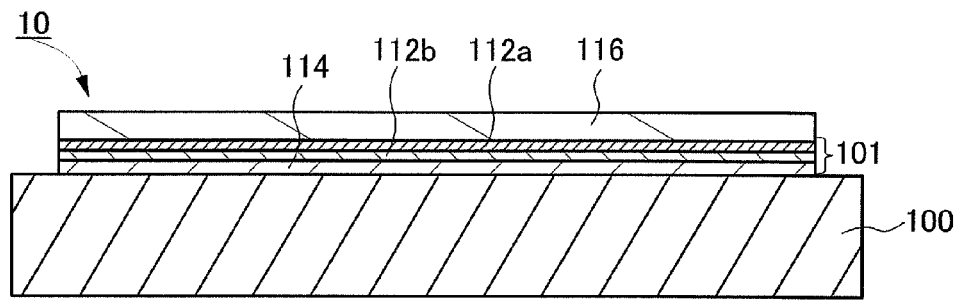
FIGS. 27A to 27E are cross-sectional views that illustrate a manufacturing process of a semiconductor device.

First, as illustrated in FIG. 27A, a semiconductor substrate is prepared. In this embodiment mode, the semiconductor substrate 10 in FIG. 10 is used. That is, a semiconductor substrate in which the single crystal semiconductor layer 116 is fixed to the supporting substrate 100 having an insulating surface with the baffer layer 101 interposed therebetween is used. Note that as a semiconductor substrate which forms a transitor, not only the structure in FIG. 27A but also a semiconductor substrate according to the present invention can be used.

Note that a p-type impurity element such as boron, aluminum, or gallium or an n-type impurity element such as phosphorus or arsenic is preferably added to the single crystal semiconductor layer 116 in accordance with a formation region of an n-channel field-effect transistor or a p-channel field-effect transistor. In other words, a p-type impurity element is added to a formation region of an n-channel field-effect transistor and an n-type impurity element is added to a formation region of a p-channel field-effect transistor, whereby so-called well regions are formed. The dose of impurity ions may be about $1\times10^{12}$ ions/cm$^2$ to $1\times10^{14}$ ions/cm$^2$. Furthermore, when threshold voltage of the field effect transistor is controlled, a p-type impurity element or an n-type impurity element may be added to these well regions.

Figure 27B:
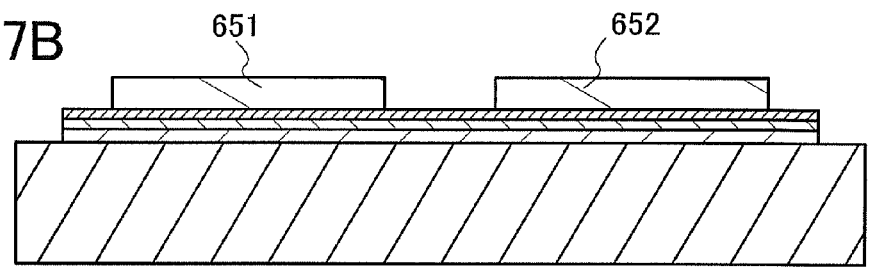

Then, as illustrated in FIG. 27B, the single crystal semiconductor layer 116 is etched to form a single crystal semiconductor layer 651 and a single crystal semiconductor layer 652 which are separated from each other in island shapes to correspond to the arrangement of semiconductor elements. In this embodiment mode, an n-channel transistor is formed from the single crystal semiconductor layer 651, and a p-channel transistor is formed from the single crystal semiconductor layer 652.

Figure 27C:
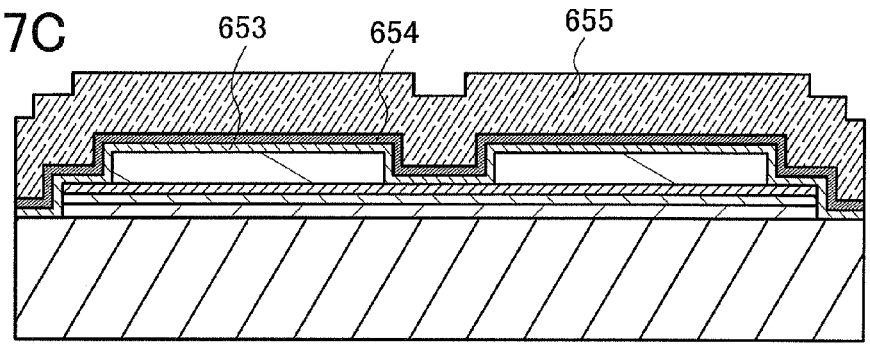

Next, as illustrated in FIG. 27C, a gate insulating layer 653, and a conductive layer 654 and a conductive layer 655 which form a gate electrode are sequentially formed over the single crystal semiconductor layers 651 and 652.

The gate insulating layer 653 is formed as a single layer structure or a stacked structure using an insulating layer such as a silicon oxide layer, a silicon oxynitride layer, a silicon nitride layer, or a silicon nitride oxide layer by a CVD method, a sputtering method, an atomic layer epitaxy (ALE) method, or the like.

Alternatively, the gate insulating layer 653 may be formed in such a manner that a plasma treatment is performed on the single crystal semiconductor layers 651 and 652 to oxidize or nitride surfaces thereof. The plasma treatment in this case also includes a plasma treatment with plasma excited using microwaves (a typical frequency is 2.45 GHz). For example, a treatment with plasma that is excited by microwaves and has an electron density of greater than or equal to $1\times10^{11}$/cm$^3$ and less than or equal to $1\times10^{13}$/cm$^3$ and an electron temperature of greater than or equal to 0.5 eV and less than or equal to 1.5 eV is also included. An oxidation treatment or a nitridation treatment of the surface of the semiconductor layer with such a plasma treatment makes it possible to form a thin and dense film. In addition, since the surface of the semiconductor layer is directly oxidized, a film which has good interface characteristics can be obtained. In addition, the gate insulating layer 653 may be formed by performing a plasma treatment using a microwave to a film formed by a CVD method, a sputtering method, or an ALE method.

Since the gate insulating layer 653 forms the interface with the semiconductor layers, the gate insulating layer 653 is preferably formed so that a silicon oxide layer or a silicon oxynitride layer is located at the interface. This is because, if a film in which the amount of nitrogen is higher than that of oxygen, such as a silicon nitride layer or a silicon nitride oxide layer, is formed, problems of interface characteristics such as generation of trap levels might be caused.

The conductive layer which forms the gate electrode is formed as a single layer film or a stacked film using an element selected from tantalum, tantalum nitride, tungsten, titanium, molybdenum, aluminum, copper, chromium, or niobium; an alloy material or a compound material containing any of the above elements as its main component; or a semiconductor material typified by polycrystalline silicon doped with an impurity element such as phosphorus, by a CVD method or a sputtering method. When the conductive layer is formed as a stacked film, it can be formed using different conductive materials or can be formed using the same conductive material. In this embodiment mode, an example is shown in which the conductive layer of the gate electrode is formed with a two-layer structure including the conductive layers 654 and 655.

If the conductive layer for forming the gate electrode has a two-layer structure of the conductive layers 654 and 655, a stacked film of a tantalum nitride layer and a tungsten layer, a tungsten nitride layer and a tungsten layer, or a molybdenum nitride layer and a molybdenum layer can be formed, for example. Note that a stacked film of a tantalum nitride layer and a tungsten layer is preferable because etching selectivity of both layers can be easily obtained. Note that in the two-layer films which are exemplified, the first mentioned film is preferably formed over the gate insulating layer 653. In this embodiment mode, the first conductive layer 654 is formed with a thickness of greater than or equal to 20 nm and less than or equal to 100 nm. The conductive layer 655 is formed with a thickness of greater than or equal to 100 nm and less than or equal to 400 nm. The gate electrode can also have a stacked structure of three or more layers, and, in that case, a stacked structure of a molybdenum layer, an aluminum layer, and a molybdenum layer may be employed.

Next, a resist mask 656 and a resist mask 657 are selectively formed over the conductive layer 655. Then, a first etching treatment and a second etching treatment are performed using the resist masks 656 and 657.

Figure 27D:
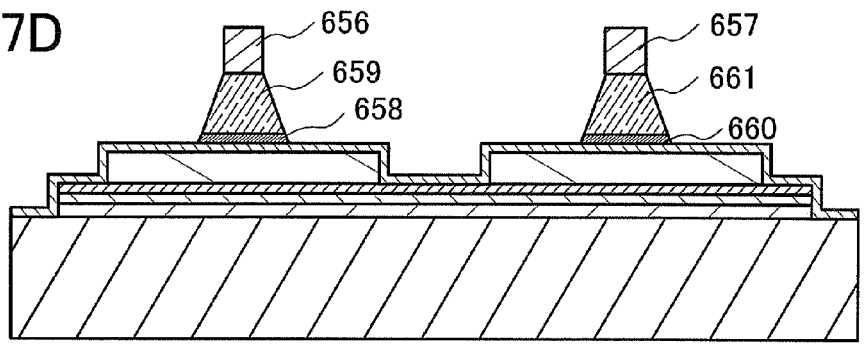

First, by the first etching treatment using the resist masks 656 and 657, the conductive layers 654 and 655 are selectively etched, and thus a conductive layer 658 and a conductive layer 659 are formed over the single crystal semiconductor layer 651 and a conductive layer 660 and a conductive layer 661 are formed over the single crystal semiconductor layer 652 (see FIG. 27D).

Figure 27E:
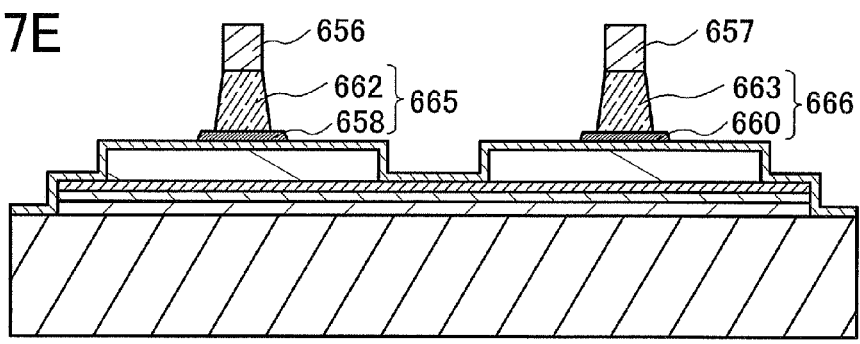
Figure 28A:
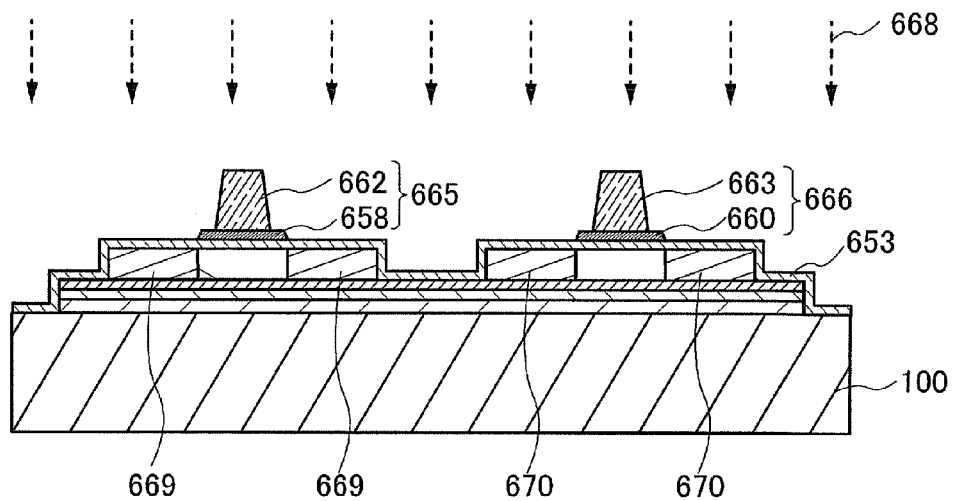
FIGS. 28A to 28C are cross-sectional views that illustrate a manufacturing process of a semiconductor device.
Figure 28B:
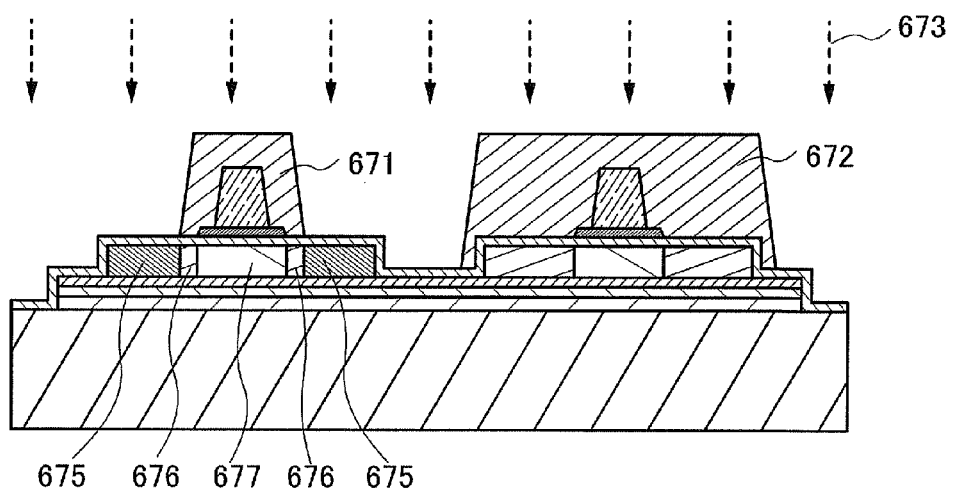
Figure 28C:
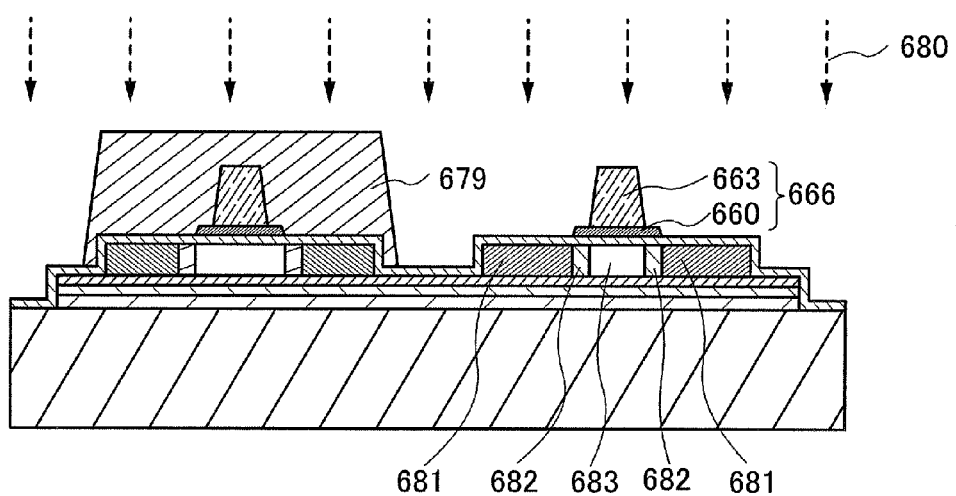

Next, by the second etching using the resist masks 656 and 657, end portions of the conductive layers 659 and 661 are etched, and thus a conductive layer 662 and a conductive layer 663 are formed (see FIG. 27E). The conductive layers 662 and 663 are formed so as to have smaller widths (lengths parallel to a direction in which carriers flow through channel formation regions (a direction in which a source region and a drain region are connected)) than those of the conductive layers 658 and 660. In this manner, a two-layer gate electrode 665 including the conductive layers 658 and 662 and a two-layer gate electrode 666 including the conductive layers 660 and 663 are formed.

Although an etching method employed for the first etching treatment and the second etching treatment may be selected as appropriate, a dry etching apparatus using a high-density plasma source such as electron cyclotron resonance (ECR) or inductive coupled plasma (ICP) may be used in order to increase the etching rate. With appropriate control of the etching condition of the first etching treatment and the second etching treatment, side surfaces of the conductive layers 658, 660, 662, and 663 can each have a desired tapered shape. After the desired gate electrodes 665 and 666 are formed, the resist masks 656 and 657 may be removed.

Next, an impurity element 668 is added to the single crystal semiconductor layers 651 and 652, using the gate electrodes 665 and 666 as masks. In the single crystal semiconductor layer 651, a pair of impurity regions 669 is formed in a self-alignment manner using the conductive layers 658 and 662 as masks. As well, in the single crystal semiconductor layer 652, a pair of impurity regions 670 is formed in a self-alignment manner using the conductive layers 660 and 663 as masks (see FIG. 28A).

As the impurity element 668, a p-type impurity element such as boron, aluminum, or gallium, or an n-type impurity element such as phosphorus or arsenic is added. At this time, in order to form a high resistant region of the n-channel transistor, phosphorus of an n-type impurity element is added as the impurity element 668. In addition, phosphorus is added such that it is included in the impurity region 669 at a concentration of about $1 \times 10^{17}$ atoms/cm$^3$ to $5 \times 10^{18}$ atoms/cm$^3$.

Then, in order to form impurity regions serving as a source region and a drain region of the n-channel transistor, a resist mask 671 is formed to partially cover the single crystal semiconductor layer 651 and a resist mask 672 is selectively formed to cover the single crystal semiconductor layer 652. Then, a pair of impurity regions 675 is formed in the single crystal semiconductor layer 651 by adding an impurity element 673 to the single crystal semiconductor layer 651, using the resist mask 671 as a mask (see FIG. 28B).

As the impurity element 673, phosphorus of an n-type impurity element is added to the single crystal semiconductor layer 651, and the concentration of added phosphorus is made to be $5 \times 10^{19}$ atoms/cm$^3$ to $5 \times 10^{20}$ atoms/cm$^3$. The impurity regions 675 each serve as a source region or a drain region. The impurity regions 675 are formed in regions not overlapping with the conductive layers 658 and 662.

In addition, in the single crystal semiconductor layer 651, impurity regions 676 are regions of the impurity regions 669 to which the impurity element 673 is not added. The concentration of the impurity element included in the impurity region 676 is higher than that in the impurity region 675, and the impurity region 676 serves as a high resistant region or an LDD region. In the single crystal semiconductor layer 651, a channel formation region 677 is formed in a region overlapping with the conductive layers 658 and 662.

An LDD region means a region to which an impurity element is added at a low concentration and which is formed between a channel formation region and a source region or a drain region that is formed by adding the impurity element at a high concentration. When an LDD region is provided, there is an advantageous effect in that an electric field in the vicinity of a drain region is relieved to prevent deterioration due to hot carrier injection. Further, a structure in which an LDD region overlapping with a gate electrode with a gate insulating layer interposed therebetween (also called a "gate-drain over-lapped LDD (GOLD) structure") may also be employed in order to prevent deterioration of an on-current value due to hot carrier.

Next, after the resist masks 671 and 672 are removed, a resist mask 679 is formed to cover the single crystal semiconductor layer 651 in order to form a source region and a drain region of a p-channel transistor. Then, an impurity element 680 is added using the resist mask 679, the conductive layers 660 and 663 as masks, so that a pair of impurity regions 681 and a pair of impurity regions 682 are formed in the single crystal semiconductor layer 652 (see FIG. 28C).

As the impurity element 680, a p-type impurity element such as boron, aluminum, or gallium can be used. Here, boron of a p-type impurity element is added so as to be contained at a concentration of about $1\times10^{20}$ atoms/cm$^3$ to $5\times10^{21}$ atoms/cm$^3$.

In the single crystal semiconductor layer 652, the impurity regions 681 are formed in regions not overlapping with the conductive layers 660 and 663, and each serve as a source region or a drain region. Here, boron of a p-type impurity element is added so as to be contained in the impurity regions 681 at a concentration of about $1\times10^{20}$ atoms/cm$^3$ to $5\times10^{21}$ atoms/cm$^3$.

The impurity regions 682 are formed in regions overlapping with the conductive layer 660 but not overlapping with the conductive layer 663, and the impurity regions 682 are regions formed by adding the impurity element 680 to the impurity regions 670 through the conductive layer 660. The impurity regions 670 each have n-type conductivity, and thus the impurity element 680 is added such that the impurity regions 682 can each have p-type conductivity. By adjusting the concentration of the impurity element 680 contained in the impurity region 682, the impurity region 682 can function as a source region or a drain region, or can also function as an LDD region.

In the single crystal semiconductor layer 652, a channel formation region 683 is formed in a region overlapping with the conductive layers 660 and 663.

An interlayer insulating layer is formed. Although the interlayer insulating layer can be formed as a single layer structure or a stacked structure, here, the interlayer insulating layer has a two-layer structure of an insulating layer 684 and an insulating layer 685 (see FIG. 29A).

As the interlayer insulating layer, a silicon oxide layer, a silicon oxynitride layer, a silicon nitride layer, a silicon nitride oxide layer, or the like can be formed by a CVD method or a sputtering method. Further, the interlayer insulating layer can also be formed by an application method such as a spin coating method, using an organic material such as polyimide, polyamide, polyvinylphenol, benzocyclobutene, acrylic, or epoxy; a siloxane material such as a siloxane resin; an oxazole resin; or the like. Note that a siloxane material is a material including a Si—O—Si bond. Siloxane is composed of a skeleton structure formed by the bond of silicon (Si) and oxygen (O). As a substituent, an organic group (e.g., an alkyl group or aromatic hydrocarbon) or a fluoro group may be used. The organic group may include a fluoro group.

For example, a silicon nitride oxide layer is formed with a thickness of 100 nm as the insulating layer 684, and a silicon oxynitride layer is formed with a thickness of 900 nm as the insulating layer 685. In addition, the insulating layers 684 and 685 are successively formed by a plasma CVD method. The interlayer insulating layer may also have a stacked structure including three or more layers. Alternatively, a stacked structure of a silicon oxide layer, a silicon oxynitride layer, or a silicon nitride layer, and an insulating layer formed using an organic material such as polyimide, polyamide, polyvinyl phenol, benzocyclobutene, acrylic, or epoxy; a siloxane material such as a siloxane resin; or an oxazole resin can be employed.

Figure 29A:
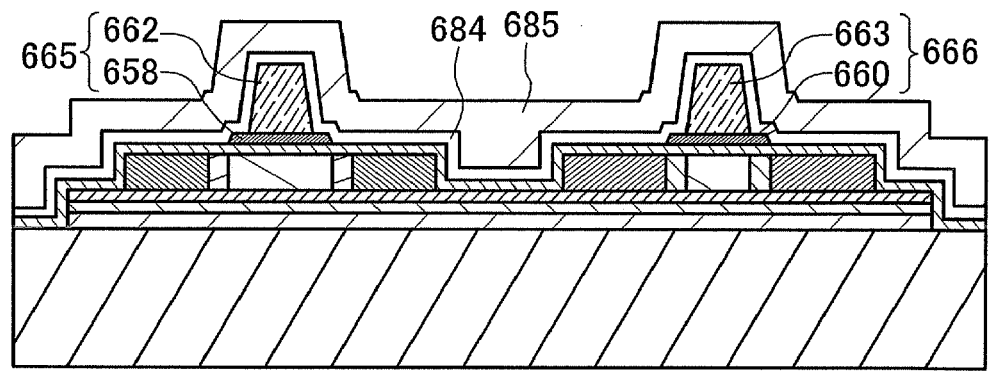
FIGS. 29A and 29B are cross-sectional views that illustrate a manufacturing process of a semiconductor device.
Figure 29B:
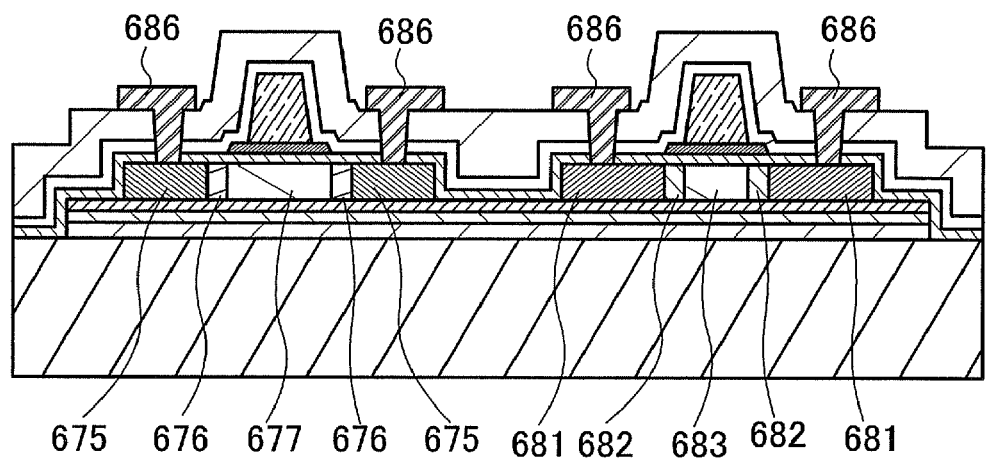

Next, contact holes are formed in the interlayer insulating layer (in this embodiment mode, the insulating layers 684 and 685), and conductive layers 686 which each function as a source electrode or a drain electrode are formed in the contact holes (see FIG. 29B).

The contact holes are selectively formed in the insulating layers 684 and 685 so as to reach the impurity regions 675 formed in the single crystal semiconductor layer 651 and the impurity regions 681 formed in the single crystal semiconductor layer 652.

As the conductive layers 686, a single layer film formed of one element selected from aluminum, tungsten, titanium, tantalum, molybdenum, nickel, or neodymium, or an alloy containing a plurality of any of the above elements; or a stacked film including such layers can be used. For example, a conductive layer which is formed using an alloy containing a plurality of the elements given above can be formed using an aluminum alloy containing titanium, an aluminum alloy containing neodymium, or the like. If the conductive layers 686 are each a stacked film, a structure can be employed in which an aluminum layer or an aluminum alloy layer as described above is sandwiched between titanium layers, for example.

As illustrated in FIG. 29B, the n-channel transistor and the p-channel transistor can be manufactured using the semiconductor substrate 10.

This embodiment mode can be freely combined with any one of Embodiment Modes 1 to 7.

The present application is based on Japanese Patent Application serial No. 2008-007295 filed with Japan Patent Office on Jan. 16, 2008, the entire contents of which are hereby incorporated by reference.

What is claimed is:

1. A method for manufacturing a semiconductor substrate comprising the steps of:
   irradiating a first part of a single crystal semiconductor layer fixed to a supporting substrate with a buffer layer interposed therebetween with a laser beam from a first side of the single crystal semiconductor layer;
   spraying a heated nitrogen gas on the first part of the single crystal semiconductor layer from the first side of the single crystal semiconductor layer; and
   irradiating a second part of the single crystal semiconductor layer with a microwave from a second side of the single crystal semiconductor layer which is the opposite side of the first side of the single crystal semiconductor layer,
   wherein the first part of the single crystal semiconductor layer overlaps with the second part of the single crystal semiconductor layer, and
   wherein the irradiation with the laser beam, the spraying of the heated nitrogen gas, and the irradiation with the microwave are performed simultaneously.

2. The method for manufacturing a semiconductor substrate according to claim 1, wherein a time until the single crystal semiconductor layer in the first part which is irradiated with the laser beam is melted and recrystallized by the irradiation with the laser beam, the spraying of the heated nitrogen gas, and the irradiation with the microwave is greater than or equal to 200 nanoseconds and less than or equal to 1000 nanoseconds.

3. The method for manufacturing a semiconductor substrate according to claim 1, wherein a concentration of oxygen contained in the nitrogen gas is less than or equal to 30 ppm.

4. The method for manufacturing a semiconductor substrate according to claim 1, wherein a concentration of moisture contained in the nitrogen gas is less than or equal to 30 ppm.

5. The method for manufacturing a semiconductor substrate according to claim 1, wherein a temperature of the single crystal semiconductor layer is heated to be greater than or equal to 400° C. and less than a strain point of the supporting substrate by spraying the heated nitrogen gas.

6. The method for manufacturing a semiconductor substrate according to claim 1,
wherein the heated nitrogen gas is ejected from an opening of a gas ejection portion, and
wherein the laser beam passes through the opening of the gas ejection portion.

7. The method for manufacturing a semiconductor substrate according to claim 1,
wherein the heated nitrogen gas having passed through a heated tube is sprayed on the first part of the single crystal semiconductor layer.

8. The method for manufacturing a semiconductor substrate according to claim 1,
wherein the heated nitrogen gas is at a temperature of greater than or equal to 450° C. and less than or equal to 625° C.

9. The method for manufacturing a semiconductor substrate according to claim 1,
wherein the microwave is scanned relatively to the single crystal semiconductor layer when the supporting substrate is transferred.

10. The method for manufacturing a semiconductor substrate according to claim 1,
wherein the supporting substrate is transferred relative to a dielectric that is incorporated into a stage, and
wherein the microwave transmits through the dielectric.

11. A method for manufacturing a semiconductor substrate comprising the steps of:
irradiating a first part of a semiconductor layer over a substrate with a laser beam from a first side of the semiconductor layer;
spraying a heated nitrogen gas on the first part of the semiconductor layer from the first side of the semiconductor layer; and
irradiating a second part of the semiconductor layer with a microwave from a second side of the semiconductor layer which is the opposite side of the first side of the semiconductor layer,
wherein the first part of the semiconductor layer overlaps with the second part of the semiconductor layer, and
wherein the irradiation with the laser beam, the spraying of the heated nitrogen gas, and the irradiation with the microwave are performed simultaneously.

12. The method for manufacturing a semiconductor substrate according to claim 11, wherein a time until the semiconductor layer in the first part which is irradiated with the laser beam is melted and recrystallized by the irradiation with the laser beam, the spraying of the heated nitrogen gas, and the irradiation with the microwave is greater than or equal to 200 nanoseconds and less than or equal to 1000 nanoseconds.

13. The method for manufacturing a semiconductor substrate according to claim 11, wherein a concentration of oxygen contained in the nitrogen gas is less than or equal to 30 ppm.

14. The method for manufacturing a semiconductor substrate according to claim 11, wherein a concentration of moisture contained in the nitrogen gas is less than or equal to 30 ppm.

15. The method for manufacturing a semiconductor substrate according to claim 11, wherein a temperature of the semiconductor layer is heated to be greater than or equal to 400° C. and less than a strain point of the substrate by spraying the heated nitrogen gas.

16. The method for manufacturing a semiconductor substrate according to claim 11,
wherein the heated nitrogen gas is ejected from an opening of a gas ejection portion, and
wherein the laser beam passes through the opening of the gas ejection portion.

17. The method for manufacturing a semiconductor substrate according to claim 11,
wherein the heated nitrogen gas having passed through a heated tube is sprayed on the first part of the semiconductor layer.

18. The method for manufacturing a semiconductor substrate according to claim 11,
wherein the heated nitrogen gas is at a temperature of greater than or equal to 450° C. and less than or equal to 625° C.

19. The method for manufacturing a semiconductor substrate according to claim 11,
wherein the microwave is scanned relatively to the semiconductor layer when the substrate is transferred.

20. The method for manufacturing a semiconductor substrate according to claim 11,
wherein the substrate is transferred relative to a dielectric that is incorporated into a stage, and
wherein the microwave transmits through the dielectric.

* * * * *